(12) United States Patent
Naito

(10) Patent No.: US 10,643,992 B2
(45) Date of Patent: May 5, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/260,117

(22) Filed: Jan. 29, 2019

(65) Prior Publication Data

US 2019/0259748 A1 Aug. 22, 2019

(30) Foreign Application Priority Data

Feb. 19, 2018 (JP) ................... 2018-027161

(51) Int. Cl.
| | | |
|---|---|---|
| *H01L 27/07* | (2006.01) | |
| *H01L 29/06* | (2006.01) | |
| *H01L 29/861* | (2006.01) | |
| *H01L 29/739* | (2006.01) | |
| *H01L 29/08* | (2006.01) | |
| *H01L 29/10* | (2006.01) | |
| *H01L 29/417* | (2006.01) | |
| *H01L 29/36* | (2006.01) | |

(Continued)

(52) U.S. Cl.
CPC ...... *H01L 27/0716* (2013.01); *H01L 29/0619* (2013.01); *H01L 29/0696* (2013.01); *H01L 29/083* (2013.01); *H01L 29/0804* (2013.01); *H01L 29/0821* (2013.01); *H01L 29/1004* (2013.01); *H01L 29/1095* (2013.01); *H01L 29/32* (2013.01); *H01L 29/36* (2013.01); *H01L 29/402* (2013.01); *H01L 29/41708* (2013.01); *H01L 29/7397* (2013.01); *H01L 29/8613* (2013.01); *H01L 29/407* (2013.01)

(58) Field of Classification Search
CPC ............ H01L 27/0716; H01L 29/0619; H01L 29/0696; H01L 29/0804; H01L 29/0821; H01L 29/083; H01L 29/1004; H01L 29/1095; H01L 29/32; H01L 29/36; H01L 29/402; H01L 29/41708; H01L 29/7397; H01L 29/8613; H01L 29/407
USPC .......................................................... 257/368
See application file for complete search history.

(56) References Cited

U.S. PATENT DOCUMENTS 9,818,818 B2 * 11/2017 Rupp .................. H01L 29/4238
2016/0111529 A1 4/2016 Yasuhiro Hirabayashi
(Continued)

FOREIGN PATENT DOCUMENTS

| JP | 2016082097 A | 5/2016 |
|---|---|---|
| JP | 2016096222 A | 5/2016 |
| JP | 2017147435 A | 8/2017 |

*Primary Examiner* — Tu-Tu V Ho

(57) ABSTRACT

A semiconductor device is provided, the semiconductor device including: a semiconductor substrate having a first-conductivity-type drift region; one or more transistor portions provided in the semiconductor substrate; and one or more diode portions provided in the semiconductor substrate, wherein both the transistor portions and the diode portions have trench portions that lie from a top surface of the semiconductor substrate to the drift region and include conductive portions, and in a top view of the semiconductor substrate, a main direction of the trench portions in the transistor portions is different from a main direction of the trench portions in the diode portions.

9 Claims, 35 Drawing Sheets

(51) Int. Cl.
*H01L 29/40* (2006.01)
*H01L 29/32* (2006.01)

(56) References Cited

U.S. PATENT DOCUMENTS

2016/0141400 A1  5/2016  Takahashi
2017/0236908 A1  8/2017  Naito
2018/0108737 A1  4/2018  Naito

* cited by examiner

_US 10,643,992 B2_

SEMICONDUCTOR DEVICE

The contents of the following Japanese patent application(s) are incorporated herein by reference:
NO. 2018-027161 filed in JP on Feb. 19, 2018.

BACKGROUND

1. Technical Field

The present invention relates to a semiconductor device.

2. Related Art

Conventionally, semiconductor devices such as insulated gate bipolar transistors (IGBTs) have been known (please see Patent Literatures 1 and 2, for example).

Patent Literature 1: Japanese Patent Application Publication No. 2016-082097

Patent Literature 2: Japanese Patent Application Publication No. 2016-096222

It is preferable to suppress leakage current in a semiconductor device.

SUMMARY

A first aspect of the present invention provides a semiconductor device including: a semiconductor substrate having a first-conductivity-type drift region; one or more transistor portions provided in the semiconductor substrate; and one or more diode portions provided in the semiconductor substrate. Both the transistor portions and the diode portions have trench portions that lie from a top surface of the semiconductor substrate to the drift region and include conductive portions. In a top view of the semiconductor substrate, a main direction of the trench portions in the transistor portions is different from a main direction of the trench portions in the diode portions.

In the top view of the semiconductor substrate, the main direction of the trench portions in the transistor portions may be orthogonal to the main direction of the trench portion in the diode portions.

The semiconductor device may further include a second-conductivity-type first well region that: is provided in the semiconductor substrate to overlap, in the top view of the semiconductor substrate, end portions of a plurality of the trench portions in the transistor portions; and has a longitudinal direction in a first direction which is different from the main direction of the trench portions in the transistor portions. The semiconductor device may further include a second-conductivity-type second well region that: is provided in the semiconductor substrate to overlap, in the top view of the semiconductor substrate, end portions of a plurality of the trench portions in the diode portions; and has a longitudinal direction in a second direction different from the main direction of the trench portions in the diode portions. The first well region may be continuous with the second well region.

In the top view of the semiconductor substrate, the first well region may extend to a position at which the first well region faces the diode portions. The diode portions may be surrounded by the first well region and the second well region.

The semiconductor device may further include a lifetime control region that is provided on a top surface side of the semiconductor substrate and contains a lifetime killer. The transistor portions may have gate trench portions that lie from the top surface of the semiconductor substrate to the drift region, and include conductive portions. The lifetime control region may be provided in the diode portions, and may not be provided below the gate trench portions in the transistor portions.

The semiconductor device may further include: a contact hole that is provided: above the semiconductor substrate; and to overlap the transistor portions; and a contact hole that is provided: above the semiconductor substrate; and to overlap the diode portions. In the top view of the semiconductor substrate, a main direction of the contact hole provided to overlap the transistor portions may be orthogonal to a main direction of the contact hole provided to overlap the diode portions.

The semiconductor device may further include a contact hole provided above the first well region extending, in the top view of the semiconductor substrate, to a position at which the first well region faces the diode portions. In the top view of the semiconductor substrate, the lifetime control region may overlap the contact hole provided above the first well region.

The summary clause does not necessarily describe all necessary features of the embodiments of the present invention. The present invention may also be a sub-combination of the features described above.

BRIEF DESCRIPTION OF THE DRAWINGS

FIG. 2b is a figure showing an exemplary cross-section taken along a-a' in FIG. 2a.

FIG. 2c is a figure showing an exemplary cross-section taken along b-b' in FIG. 2a.

FIG. 3b is an enlarged view of a region B in FIG. 3a.

FIG. 4a is a figure showing another exemplary cross-section taken along a-a' in FIG. 2a.

FIG. 4b is a figure showing another exemplary cross-section taken along a-a' in FIG. 2a.

FIG. 5a is a figure showing another exemplary cross-section taken along b-b' in FIG. 2a.

FIG. 5b is a figure showing another exemplary cross-section taken along b-b' in FIG. 2a.

FIG. 5c is a figure showing another exemplary cross-section taken along b-b' in FIG. 2a.

FIG. 6b is a figure showing an exemplary cross-section taken along c-c' in FIG. 6a.

FIG. 7b is a figure showing an exemplary cross-section taken along d-d' in FIG. 7a.

FIG. 8b is a figure showing an exemplary cross-section taken along e-e' in FIG. 8a.

FIG. 10c is a figure showing an exemplary cross-section taken along g-g' in FIG. 10a.

FIG. 12c is a figure showing an exemplary cross-section taken along h-h' in FIG. 12a.

FIG. 14b is a figure showing an exemplary cross-section taken along k-k' in FIG. 14a.

FIG. 14c is a figure showing an exemplary cross-section taken along m-m' in FIG. 14a.

FIG. 16b is a figure showing an exemplary cross-section taken along n-n' in FIG. 16a.

FIG. 16c is a figure showing an exemplary cross-section taken along q-q' in FIG. 16a.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in the direction parallel to the depth direction of a semiconductor substrate is referred to as the "upper" side, and the other side is referred to as the "lower" side. One of two principal surfaces of a substrate, a layer or another member is referred to as the top surface, and the other surface is referred to as the bottom surface. The "upward" and "downward" directions are not limited by the direction of gravity, or the direction of attachment to a substrate or the like at the time of mounting of a semiconductor device.

In the present specification, technical matters are explained using orthogonal coordinate axes which are an X-axis, a Y-axis and a Z-axis in some cases. In the present specification, an X-Y plane is a plane parallel to the top surface of a semiconductor substrate, and the Z-axis lies along the depth direction of the semiconductor substrate.

While each example shows a case where a first-conductivity-type is N type and a second-conductivity-type is P type, the first-conductivity-type may also be P type and the second-conductivity-type may also be N type. In this case, the respective conductivity-types of substrates, layers, regions and the like in each example will be opposite polarities.

In the present specification, doping concentration refers to the concentration of impurities acting as donors or acceptors. In the present specification, doping concentration refers to the difference in concentration between donors and acceptors in some cases. In addition, if the doping concentration distribution of a doped region has a peak, the value of the peak may be used as the doping concentration of the doped region. If the doping concentration is almost uniform in a doped region or in other cases, an average value of the doping concentration of the doped region may be used as the doping concentration.

Figure 1:
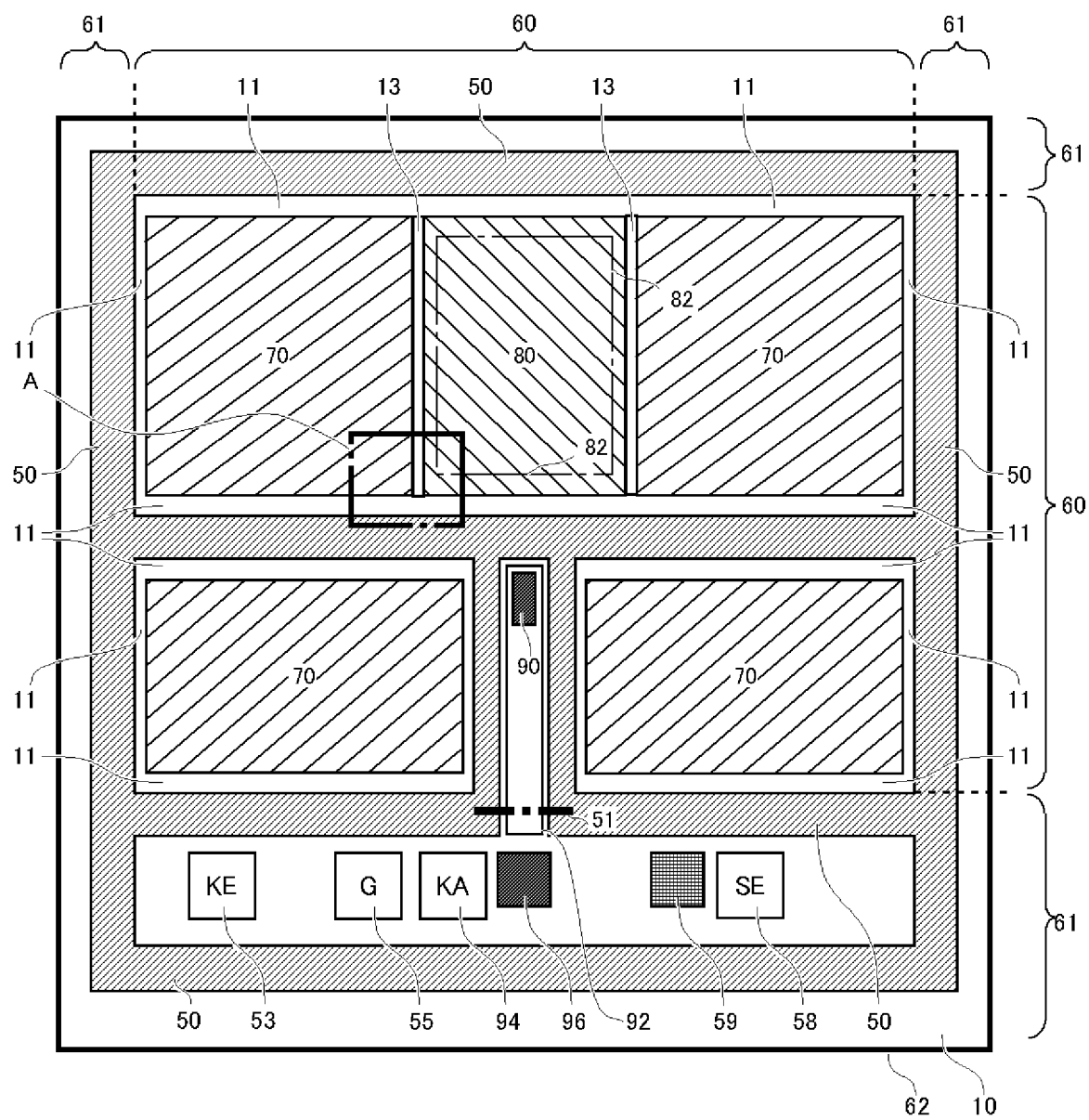
FIG. 1 is a figure showing an exemplary top surface of a semiconductor device 100 according to the present embodiment.

FIG. 1 is a figure showing an exemplary top surface of a semiconductor device 100 according to the present embodiment. The semiconductor device 100 in the present example is a semiconductor chip including transistor portions 70 and a diode portion 80. The transistor portions 70 include transistors such as IGBTs. The diode portion 80 includes a diode such as a FWD (Free Wheel Diode) provided adjacent to the transistor portions 70 on the top surface of the semiconductor substrate 10.

The semiconductor substrate 10 is provided with an active portion 60. The active portion 60 is a region where main current flows between the top surface and bottom surface of the semiconductor substrate 10 if the semiconductor device 100 is controlled to be turned on. That is, it is a region where current flows inside the semiconductor substrate 10 in the depth direction from the top surface of the semiconductor substrate 10 to the bottom surface of the semiconductor substrate 10 or from the bottom surface to the top surface. In the present specification, the transistor portions 70 and diode portion 80 are each referred to as an element portion or element region. A region provided with element portions may be treated as the active portion 60.

Note that a region sandwiched by two element portions in the top view of the semiconductor substrate 10 is also treated as the active portion 60. In the example of FIG. 1, a region that is sandwiched by element portions and provided with a gate metal layer 50 is included in the active portion 60. The active portion 60 can be regarded as a region provided with emitter electrodes and a region sandwiched by the emitter electrodes in the top view of the semiconductor substrate 10. In the example of FIG. 1, emitter electrodes are provided above the transistor portions 70 and diode portion 80.

In the top view of the semiconductor substrate 10, a region between the active portion 60 and an outer peripheral end 62 of the semiconductor substrate 10 is treated as an outer peripheral region 61. The outer peripheral region 61 is provided to surround the active portion 60 in the top view of the semiconductor substrate 10. One or more metal pads for connecting the semiconductor device 100 and external devices through wires or the like may be arranged in the outer peripheral region 61. The semiconductor device 100 may have, at the outer peripheral region 61, an edge termination structure portion surrounding the active portion 60. The edge termination structure portion relaxes electric field concentration on the top surface side of the semiconductor substrate 10. The edge termination structure portion may have, for example, a guard ring, a field plate, a RESURF or a structure obtained by combining them.

The active portion 60 may be provided with a plurality of transistor portions 70 and diode portions 80. Each diode portion 80 is provided with a first-conductivity-type cathode region 82 at the bottom surface of the semiconductor substrate 10. The cathode region 82 in the present example is of N+ type, for example. As indicated by a frame of an alternate long and short dash line in FIG. 1, the cathode region 82 may be provided in a range in which it does not contact the outer peripheral region 61.

Transistor portions 70 and diode portions 80 may by provided in line in the Y-axis direction in the top view of the semiconductor substrate 10. In the present specification, the direction in which the transistor portions 70 and diode portions 80 are arrayed is referred to as an array direction (Y-axis direction). A diode portion 80 may be provided to be sandwiched by transistor portions 70 in the Y-axis direction.

A plurality of transistor portions 70 may be provided in the X-axis direction and Y-axis direction. In the X-axis direction and Y-axis direction, a single diode portion 80 may be provided, but a plurality of diode portions 80 may also be provided. FIG. 1 shows one example in which, in both the X-axis direction and Y-axis direction, two transistor portions 70 are provided, and one diode portion 80 is provided. In the X-axis direction, the gate metal layer 50 may be provided between two transistor portions 70.

The gate metal layer 50 may be formed of aluminum or an aluminum-silicon alloy. The gate metal layer 50 is electrically connected to transistor portions 70, and supplies gate voltage to the transistor portions 70.

The gate metal layer 50 may be provided to surround the active portion 60 in the top view of the semiconductor substrate 10. The gate metal layer 50 is electrically connected to a gate pad 55 provided in the outer peripheral region 61. The gate metal layer 50 may be provided along the outer peripheral end 62 of the semiconductor substrate 10. The gate pad 55 may be arranged between the active portion 60 and a part of the gate metal layer 50 extending in the Y-axis direction at the end on the X-axis direction negative side.

Parts of the gate metal layer 50 provided on either side of a temperature sensing wire 92 in the Y-axis direction may be connected by a gate runner 51. The gate runner 51 is formed of a conductive material such as polysilicon. The resistivity of the gate runner 51 is higher than the resistivity of the gate metal layer 50.

In the top view of the semiconductor substrate 10, first well regions 11 are provided between transistor portions 70 and the gate metal layer 50 in the X-axis direction. A first well region 11 that faces a transistor portion 70 in the X-axis direction may extend in the Y-axis direction to a region in which it faces a diode portion 80. In the top view of the semiconductor substrate 10, first well regions 11 are provided between transistor portions 70 and the gate metal layer 50 in the Y-axis direction. The two transistor portions 70 and one diode portion 80 on the X-axis direction positive side may be surrounded by first well regions 11 in the top view of the semiconductor substrate 10. Note that a first well region 11 may be provided to extend from a region adjacent to a transistor portion 70 to a region below the gate metal layer 50.

In the top view of the semiconductor substrate 10, a first well region 11 may be provided below a part of the gate metal layer 50 which is sandwiched by a transistor portion 70 provided on the X-axis direction positive side and a transistor portion 70 provided on the X-axis direction negative side. A first well region 11 may be provided continuously from the X-axis direction positive side of the gate metal layer 50 to its X-axis direction negative side.

In the top view of the semiconductor substrate 10, a second well region 13 is provided between a transistor portion 70 and the diode portion 80 in the Y-axis direction. The second well region 13 may be continuous with first well regions 11 at either end of it on the X-axis direction positive side and X-axis direction negative side. The diode portion 80 may be surrounded by first well regions 11 and second well regions 13 in the top view of the semiconductor substrate 10. Note that first well regions 11 and second well regions 13 are explained in detail later in explanation of FIG. 2a.

A temperature sensing unit 90 is provided above the active portion 60. The temperature sensing unit 90 may be provided at the middle of the active portion 60 in the top view of the semiconductor substrate 10. The temperature sensing unit 90 senses the temperature of the active portion 60. The temperature sensing unit 90 may be a p-n temperature sensing diode formed of monocrystal or polycrystal silicon.

The temperature sensing wire 92 is provided above the active portion 60 in the top view of the semiconductor substrate 10. The temperature sensing wire 92 is connected with the temperature sensing unit 90. The temperature sensing wire 92 extends to the outer peripheral region 61 in a predetermined direction (the X-axis direction in the present example), and is connected with a temperature measurement pad 94 provided in the outer peripheral region 61. Current to flow from the temperature measurement pad 94 flows through the temperature sensing wire 92 into the temperature sensing unit 90. A sensing unit 96 is provided as a spare of the temperature sensing unit 90.

The outer peripheral region 61 is provided with a current sensing unit 59 and a current sensing pad 58, and a Kelvin pad 53. The current sensing unit 59 senses current flowing through the gate pad 55. The current sensing pad 58 is a pad for measuring current flowing through the current sensing unit 59. The Kelvin pad 53 is connected with an emitter electrode provided above the active portion 60 in the top view of the semiconductor substrate 10.

Figure 2A:
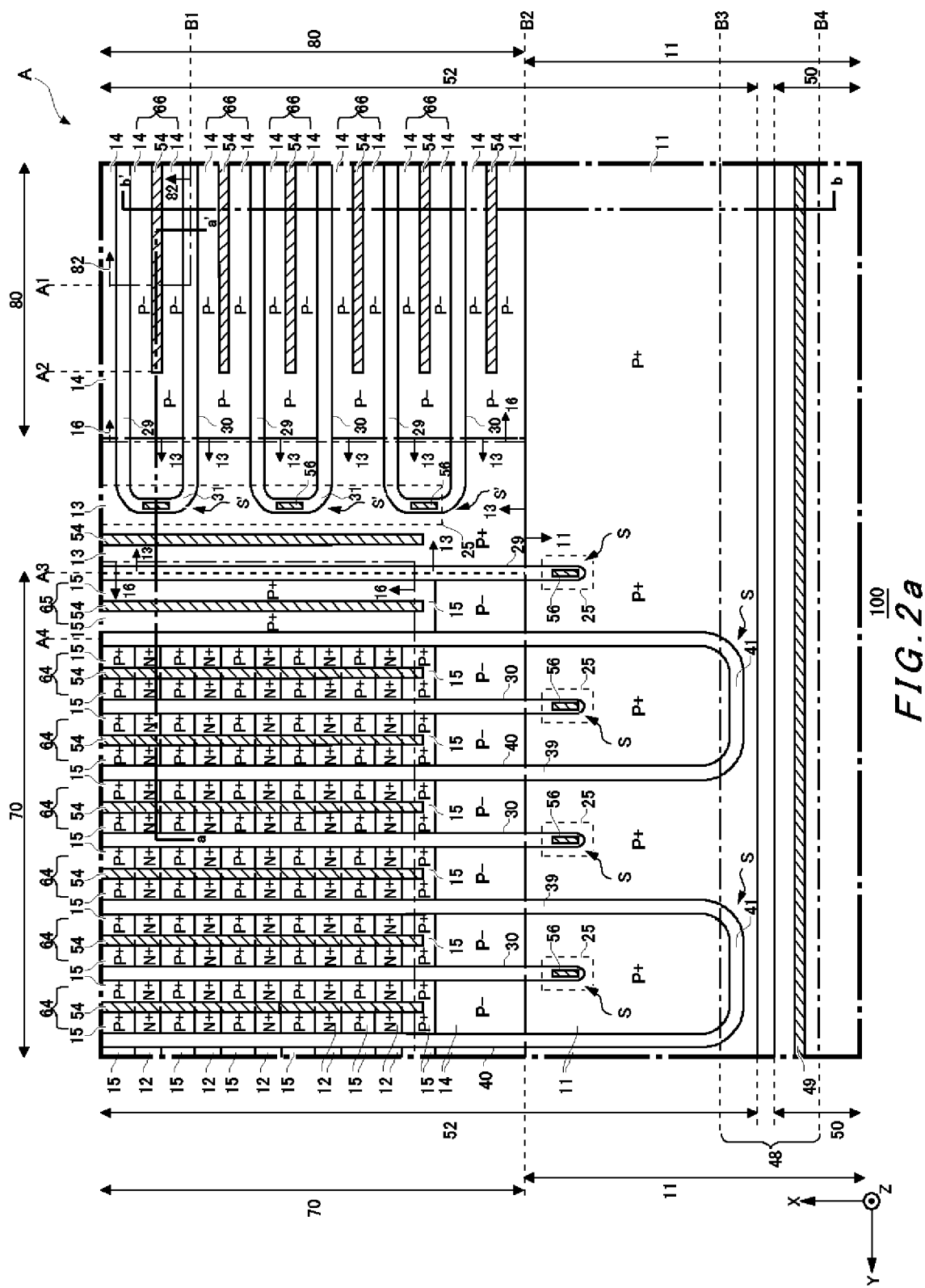
FIG. 2a is an enlarged view of a region A in FIG. 1.

FIG. 2a is an enlarged view of a region A in FIG. 1. FIG. 2a shows an enlarged view of: a region where a transistor portion 70 adjoins a diode portion 80; and a region where the transistor portion 70 adjoins the gate metal layer 50, and a region where the diode portion 80 adjoins the gate metal layer 50.

As shown in FIG. 2a, in the semiconductor device 100 in the present example, both the transistor portion 70 and the diode portion 80 include trench portions exposed to the top surface of the semiconductor substrate 10. In the transistor portion 70, the trench portions include gate trench portions 40 and dummy trench portions 30. In the diode portion 80, the trench portions are dummy trench portions 30.

The transistor portion 70 is provided with one or more gate trench portions 40 and one or more dummy trench portions 30. The gate trench portions 40 extend along the main direction (the X-axis direction in the present example) in the top view of the semiconductor substrate 10. A gate trench portion 40 may have two extending parts 39 extending in the main direction and a connecting part 41 connecting the two extending parts 39. The one or more gate trench portions 40 and the one or more dummy trench portions 30 are arrayed at predetermined intervals along a predetermined array direction (the Y-axis direction in the present example).

At least part of the connecting part 41 is preferably provided in a curvilinear form. By connecting end portions of the two extending parts 39 of the gate trench portion 40, electric field concentration at the end portions of the extending parts 39 can be relaxed. In the present specification, each extending part 39 of a gate trench portion 40 is treated as one gate trench portion 40 in some cases.

In the transistor portion 70, at least one dummy trench portion 30 is provided between individual extending parts 39 of a gate trench portion(s) 40. The dummy trench portion 30 may have a straight line shape extending in the X-axis direction.

In FIG. 2a, an end portion S is the end of a gate trench portion 40 on the X-axis direction negative side in the transistor portion 70. In addition, it is the end of a dummy trench portion 30 on the X-axis direction negative side in the transistor portion 70. Gate trench portions 40 and dummy trench portions 30 in the transistor portion 70 may each have the end portion S also at their ends on the X-axis direction positive side, although such ends are outside the region A.

The diode portion 80 is provided with one or more dummy trench portions 30. In the top view of the semiconductor substrate 10, the main direction of the dummy trench portions 30 in the diode portion 80 is different from the main direction of the gate trench portions 40 in the transistor portion 70. Here, the main direction refers to a direction in which trench portions extend in the top view of the semiconductor substrate 10.

The main direction of the gate trench portions 40 in the transistor portion 70 may be orthogonal to the main direction of the dummy trench portions 30 in the diode portion 80 in the top view of the semiconductor substrate 10. FIG. 2a shows one example in which the main direction of the gate trench portions 40 in the transistor portion 70 is orthogonal to the main direction of the dummy trench portions 30 in the diode portion 80 in the top view of the semiconductor substrate 10. That is, the semiconductor device 100 in the present example shows one example in which the dummy trench portions 30 in the diode portion 80 extend in the Y-axis direction.

In the diode portion 80, the dummy trench portions 30 are arrayed at predetermined intervals along a predetermined array direction (the X-axis direction in the present example). The dummy trench portions 30 are not provided to overlap a first well region 11 in the top view of the semiconductor substrate 10.

In the diode portion 80, a dummy trench portion 30 may have two extending parts 29 extending along the main direction (the Y-axis direction in the present example) and a connecting part 31 connecting the two extending parts 29. At least part of the connecting part 31 is preferably provided in a curvilinear form, similar to connecting parts 41.

An end portion S' is the end of a dummy trench portion 30 in the diode portion 80 on the Y-axis direction positive side in FIG. 2a. Dummy trench portions 30 in the diode portion 80 may each have an end portion S' at their ends on the Y-axis direction negative side, although such ends are outside the region A.

The semiconductor device 100 in the present example includes, in the transistor portion 70, emitter regions 12, base regions 14, and contact regions 15 exposed to the top surface of the semiconductor substrate 10. In addition, in the diode portion 80, it includes base regions 14 exposed to the top surface of the semiconductor substrate 10. On the X-axis direction negative side of the transistor portion 70 and diode portion 80, a first well region 11 exposed to the top surface of the semiconductor substrate 10 is provided. The first well region 11 may extend from a region where it faces the transistor portion 70 on the X-axis direction negative side to a region where it faces the diode portion 80 on the X-axis direction negative side. A second well region 13 is provided between the transistor portion 70 and the diode portion 80 in the Y-axis direction.

Both the first well region 11 and second well region 13 are of a second-conductivity-type. Both the first well region 11 and second well region 13 in the present example are of P+ type, for example. The diffusion depths of the first well region 11 and second well region 13 may be greater than the depths of the gate trench portions 40 and dummy trench portions 30.

The first well region 11 may be provided in the semiconductor substrate 10 to overlap a plurality of end portions S in the top view of the semiconductor substrate 10. In the X-axis direction, the first well region 11 may lie from the active portion 60 on the side where the gate metal layer 50 is provided in a region in which the first well region 11 overlaps the end portions S. The first well region 11 may have a longitudinal direction which coincides with a first direction different from the main direction of the trench portions in the transistor portion 70 which is their extending direction (X-axis direction). The first direction may be orthogonal to the main direction of the trench portions in the transistor portion 70 in the top view of the semiconductor substrate 10. That is, the first direction may be the Y-axis direction.

The second well region 13 may be provided in the semiconductor substrate 10 to overlap a plurality of end portions S' in the top view of the semiconductor substrate 10. In the Y-axis direction, the second well region 13 may lie from a region where it overlaps a dummy trench portion 30 at the end on the Y-axis direction negative side in the transistor portion 70 to the end portions S'. The boundary of the second well region 13 on the Y-axis direction positive side may be at the center of the dummy trench portion 30 in the Y-axis direction. The second well region 13 may have a longitudinal direction which coincides with a second direction different from the main direction of the trench portions in the diode portion 80 which is their extending direction (Y-axis direction). The second direction may be orthogonal to the main direction of the trench portions in the diode portion 80 in the top view of the semiconductor substrate 10. That is, the second direction may be the X-axis direction.

The doping concentration of the first well region 11 may be equal to the doping concentration of the second well region 13. The first well region 11 may extend in the first direction from a position at which it faces the transistor portion 70 to a position at which it faces the diode portion 80. The first well region 11 may be continuous with the second well region 13 in the top view of the semiconductor substrate 10 as shown in FIG. 2a. The first well region 11 and second well region 13 may also be a single well region with a single conductivity-type and uniform doping concentration.

The semiconductor device 100 in the present example includes an emitter electrode 52 and the gate metal layer 50 provided above the top surface of the semiconductor substrate 10. The emitter electrode 52 and gate metal layer 50 are provided separately from each other. The emitter electrode 52 and gate metal layer 50 are provided in both the transistor portion 70 and the diode portion 80. The emitter electrode 52 is provided above the gate trench portions 40, dummy trench portions 30, first well region 11, second well region 13, emitter regions 12, base regions 14 and contact regions 15.

An interlayer dielectric film is provided between the emitter electrode 52 and gate metal layer 50, and the top surface of the semiconductor substrate 10, but it is omitted in FIG. 2a. The interlayer dielectric film in the present example is provided with contact holes 56, a contact hole 49 and contact holes 54 that penetrate the interlayer dielectric film.

The emitter electrode 52 passes through the contact holes 56, and is connected with dummy conductive portions in the dummy trench portion 30. Connecting portions 25 formed of a conductive material such as polysilicon doped with impurities may be provided between the emitter electrode 52 and the dummy conductive portions. An insulating film such as an oxide film is provided between the connecting portions 25 and the top surface of the semiconductor substrate 10.

The gate metal layer 50 passes through the contact hole 49 and contact a gate runner 48. The gate runner 48 is formed of polysilicon doped with impurities or the like. The gate runner 48 is connected with gate conductive portions in the gate trench portions 40 on the top surface of the semiconductor substrate 10. The gate runner 48 is not connected with dummy conductive portions in the dummy trench portions 30. The gate runner 48 in the present example lies from below the contact hole 49 to edge portions of the gate trench portion 40. An insulating film such as an oxide film is provided between the gate runner 48 and the top surface of the semiconductor substrate 10. At edge portions of the gate trench portions 40, the gate conductive portions are exposed to the top surface of the semiconductor substrate 10, and contact the gate runner 48.

The emitter electrode 52 and gate metal layer 50 are formed of a metal-containing material. For example, at least a partial region of each electrode is formed of aluminum or an aluminum-silicon alloy. Each electrode may also have a barrier metal formed of titanium, a titanium compound or the like in a layer underlying a region formed of aluminum or the like, and may have plugs formed of tungsten or the like in contact holes.

In the transistor portion 70, contact holes 54 are provided above the semiconductor substrate 10 to overlap the transistor portion 70. The contact holes 54 are provided above each region among contact regions 15 and emitter regions 12. In the transistor portion 70, no contact holes 54 are arranged above base regions 14 and the first well region 11 arranged on the X-axis direction negative side. In addition, they are not arranged above base regions 14 and a first well region 11 arranged on the X-axis direction positive side, although such base regions 14 and a first well region 11 are outside the region A.

In the diode portion 80, contact holes 54 are provided above the semiconductor substrate 10 to overlap the diode portion 80. The contact holes 54 are provided above base regions 14. In the diode portion 80, no contact holes 54 are arranged above the second well region 13. In addition, in the semiconductor device 100 in the present example, no contact holes 54 may not be arranged above the first well region 11 in the diode portion 80.

In the top view of the semiconductor substrate 10, the contact holes 54 provided to overlap the transistor portion 70 may extend in the same direction as the main direction of the trench portions in the transistor portion 70. The contact holes 54 provided to overlap the diode portion 80 may extend in the same direction as the main direction of the trench portions in the diode portion 80. The main direction of the contact holes 54 provided to overlap the transistor portion 70 may be orthogonal to the main direction of the contact holes 54 provided to overlap the diode portion 80, as shown in FIG. 2a.

In the diode portion 80, contact holes 56 are provided above base regions 14. In the semiconductor device 100 in the present example, all the contact holes 56 may be arranged above the second well region 13 in the diode portion 80.

In a direction parallel to the top surface of the semiconductor substrate 10, mesa portions are provided adjacent to each trench portion. A mesa portion may be a part of the semiconductor substrate 10 sandwiched by two adjoining trench portions, or may be a part lying from the top surface of the semiconductor substrate 10 to a depth of the deepest bottom portion of each trench portion. In the semiconductor device 100 in the present example, a region sandwiched by a gate trench portion 40 and a dummy trench portion 30 in the transistor portion 70 may be treated as a mesa portion.

In the diode portion 80, a region sandwiched by dummy trench portions 30 may be treated as a mesa portion.

In the transistor portion 70, a second mesa portion 65 is provided at the end on the Y-axis direction negative side. A second mesa portion 65 is provided also at the end on the Y-axis direction positive side in the transistor portion 70, although such an end is outside the region A. In the transistor portion 70, regions excluding the second mesa portion 65 and sandwiched by individual trench portions are provided with first mesa portions 64. In the diode portion 80, regions sandwiched by individual trench portions are provided with third mesa portions 66.

The top surfaces of the first mesa portions 64 are provided with first-conductivity-type emitter regions 12 in contact with the gate trench portions 40. The emitter regions 12 in the present example are of N+ type, for example. In addition, the top surfaces of the first mesa portions 64 are provided with second-conductivity-type contact regions 15 having a doping concentration higher than that of base regions 14. The contact regions 15 in the present example are of P+ type, for example. In the first mesa portions 64, the emitter regions 12 and contact regions 15 may be provided alternately and adjacent to each other in the extending direction (X-axis direction) of the gate trench portions 40.

On the top surfaces of the first mesa portions 64, the emitter regions 12 may be provided in contact with or may also be provided apart from dummy trench portions 30. The emitter regions 12 in the example of FIG. 2a are provided in contact with dummy trench portions 30.

On the top surfaces of first mesa portions 64, the emitter regions 12 and contact regions 15 are also provided below contact holes 54. That is, in the present example, on the top surface of a first mesa portion 64, emitter regions 12 and contact regions 15 are in contact with both a gate trench portion 40 and a dummy trench portion 30 sandwiching the first mesa portion 64, and lie continuously in the Y-axis direction from the gate trench portion 40 to the dummy trench portion 30. On the top surface of the semiconductor substrate 10, the width of a first mesa portion 64 in the Y-axis direction is the same as the width of emitter regions 12 and contact regions 15 provided in the first mesa portions 64 in the Y-axis direction.

The top surface of the second mesa portion 65 is provided with contact regions 15. The contact regions 15 may be provided in the entire region sandwiched by base regions 14 provided at both end portions of the second mesa portion 65 in the X-axis direction.

On the top surface of the second mesa portion 65, contact regions 15 are also provided below a contact hole 54. That is, in the present example, on the top surface of the second mesa portion 65, the contact region 15 are in contact with both the gate trench portion 40 and the dummy trench portion 30 sandwiching the second mesa portion 65, and lie continuously in the Y-axis direction from the gate trench portion 40 to the dummy trench portion 30. On the top surface of the semiconductor substrate 10, the width of the second mesa portion 65 in the Y-axis direction is the same as the width of the contact regions 15 provided in the second mesa portion 65 in the Y-axis direction.

The top surfaces of the third mesa portions 66 are provided with base regions 14. The base regions 14 in the present example are of P− type, for example. On the top surfaces of the third mesa portions 66, the base regions 14 are also provided below contact holes 54. That is, in the present example, on the top surface of a third mesa portion 66, base regions 14 are in contact with both the two dummy trench portions 30 sandwiching the third mesa portion 66, and lie continuously in the X-axis direction from one of the dummy trench portions 30 to the other dummy trench portion 30. On the top surface of the semiconductor substrate 10, the width of a third mesa portion 66 in the X-axis direction is the same as the width of base regions 14 provided in the third mesa portions 66 in the X-axis direction. Note that the third mesa portions 66 may be or may also not be provided with emitter regions 12. In the present example, emitter regions 12 are not provided.

The diode portion 80 has the first-conductivity-type cathode region 82 on the bottom surface side of the semiconductor substrate 10. The cathode region 82 in the present example is of N+ type, for example. An alternate long and short dash line in FIG. 2a indicates a region provided with the cathode region 82 in the top view of the semiconductor substrate 10. The region that imaginarily appears on the top surface of the semiconductor substrate 10 when the cathode region 82 is projected onto the top surface of the semiconductor substrate 10 may be apart from the second well region 13 toward the Y-axis direction negative side. In a region which is in a region adjacent to the bottom surface of the semiconductor substrate 10 and is not provided with the cathode region 82 may be provided with a second-conductivity-type collector region.

The transistor portion 70 has a second-conductivity-type collector region on the bottom surface side of the semiconductor substrate 10.
The collector region in the present example is of P+ type, for example. The collector region in the transistor portion 70 may be continuous with the collector region in the diode portion 80.

The transistor portion 70 may have first-conductivity-type accumulation regions 16 below base regions 14 and in contact with gate trench portions 40. The accumulation regions 16 in the present example are of P+ type, for example. The accumulation regions 16 may be arranged above the lower ends of individual trench portions. By providing the accumulation regions 16, the carrier injection enhancement effect (IE effect) can be enhanced to lower ON voltage. In FIG. 2a, the range provided with the accumulation regions 16 is indicated with an alternate long and short dash line.

The accumulation regions 16 in the transistor portion 70 may be provided to reach the Y-axis direction negative side of the dummy trench portion 30 at the end of the transistor portion 70 on the Y-axis direction negative side, that is, may be provided to reach a region where they overlap the second well region 13 in the top view of the semiconductor substrate 10. Note that although in FIG. 2a, the alternate long and short dash line crosses the regions of individual trench portions, the accumulation regions 16 may not be formed in regions overlapping the individual trench portions.

The diode portion 80 may have accumulation regions 16 below base regions 14 and in contact with dummy trench portions 30. The accumulation regions 16 may be arranged above the lower ends of individual trench portions. In FIG. 2a, the range provided with the accumulation regions 16 is indicated with an alternate long and short dash line.

The accumulation regions 16 in the diode portion 80 may be provided to reach a region overlapping the second well region 13 in the top view of the semiconductor substrate 10. That is, in the top view of the semiconductor substrate 10, the accumulation regions 16 may be provided on the Y-axis direction positive side relative to the end of the second well region 13 on the Y-axis direction negative side. Note that although in FIG. 2a, the alternate long and short dash line crosses the regions of individual trench portions, the accumulation regions 16 may not be formed in regions overlapping the individual trench portions.

The position A1 is the position, in the X-axis direction, of the end of the cathode region 82 on the Y-axis direction positive side in the top view of the semiconductor substrate 10. The position A2 is the position, in the X-axis direction, of the end of contact holes 54 in the diode portion 80 on the Y-axis direction positive side in the top view of the semiconductor substrate 10. The position A3 is the position, in the X-axis direction, of the center, in the Y-axis direction, of the dummy trench portion 30 at the end of the transistor portion 70 on the Y-axis direction negative side. The position A4 is the position, in the X-axis direction, of the center, in the Y-axis direction, of the gate trench portion 40 at the end of the transistor portion 70 on the Y-axis direction negative side in the top view of the semiconductor substrate 10.

The position B1 is the position, in the Y-axis direction, of the end of the cathode region 82 on the X-axis direction negative side in the top view of the semiconductor substrate 10. The position B2 is the position, in the Y-axis direction, of the end of the first well region 11 on the X-axis direction positive side in the top view of the semiconductor substrate 10. The position B3 is the position, in the Y-axis direction, of the end of the gate runner 48 on the X-axis direction positive side in the top view of the semiconductor substrate 10. The position B4 is the position, in the Y-axis direction, of the end of the gate runner 48 on the X-axis direction negative side in the top view of the semiconductor substrate 10.

Figure 2B:
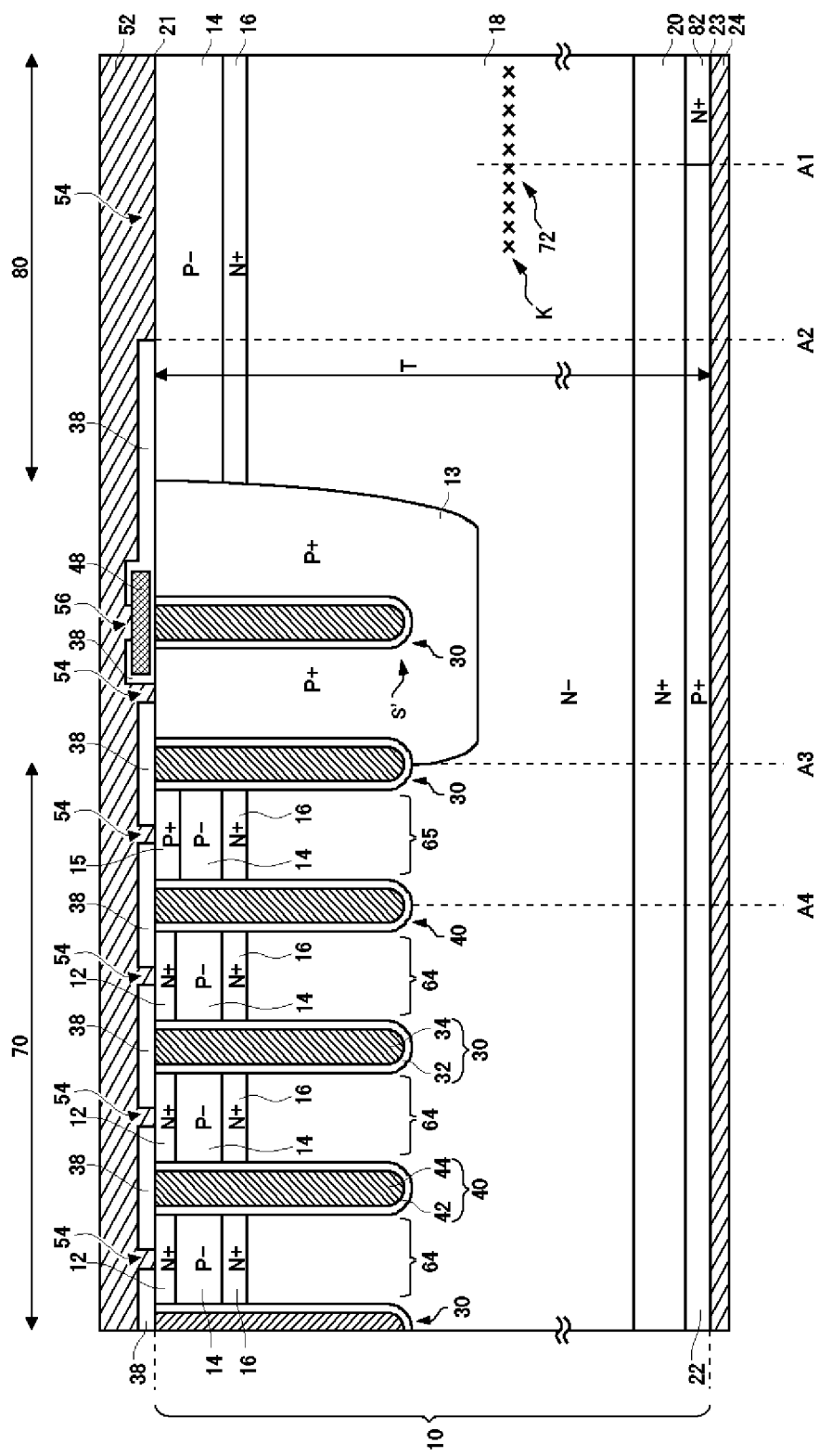

FIG. 2b is a figure showing an exemplary cross-section taken along a-a' in FIG. 2a. The cross-section taken along a-a' is a Y-Z plane passing through a second well region 13, and through emitter regions 12 and contact regions 15 in the transistor portion 70 and a base region 14 in the diode portion 80. In the cross-section taken along a-a', the semiconductor device 100 in the present example has the semiconductor substrate 10, an interlayer dielectric film 38, the gate runner 48, the emitter electrode 52 and a collector electrode 24. The emitter electrode 52 is provided to the top surface 21 of the semiconductor substrate 10 and the top surface of the interlayer dielectric film 38.

The collector electrode 24 is provided to a bottom surface 23 of the semiconductor substrate 10. The emitter electrode 52 and collector electrode 24 are formed of a conductive material such as a metal. In the present specification, the direction linking the emitter electrode 52 and the collector electrode 24 is referred to as the depth direction (Z-axis direction).

The semiconductor substrate 10 may also be a silicon substrate, a silicon carbide substrate, a nitride semiconductor substrate such as a gallium nitride semiconductor substrate, a gallium oxide substrate or the like. The semiconductor substrate 10 in the present example is a silicon substrate.

The semiconductor substrate 10 includes a first-conductivity-type drift region 18. The drift region 18 in the present example is of N type, for example. The drift region 18 may be a region that is in the semiconductor substrate 10 and is left free of other doped regions, without those regions being formed therein.

The top surface 21 of the semiconductor substrate 10 is provided with one or more gate trench portions 40 and one or more dummy trench portions 30. Each trench portion is provided to penetrate base regions 14 from the top surface 21 and reach the drift region 18.

A gate trench portion 40 has a gate trench, a gate-insulating film 42 and a gate conductive portion 44 that are provided to the top surface 21. The gate-insulating film 42 is provided to cover the inner wall of the gate trench. The gate-insulating film 42 may be formed by oxidizing or nitriding a semiconductor on the inner wall of the gate trench. The gate conductive portion 44 is provided inside the gate trench and on the inner side relative to the gate-insulating film 42. That is, the gate-insulating film 42 insulates the gate conductive portion 44 from the semiconductor substrate 10. The gate conductive portion 44 is formed of a conductive material such as polysilicon.

The gate conductive portion 44 includes, in the depth direction, a region that faces at least adjacent base regions 14 with the gate-insulating film 42 being sandwiched therebetween. The gate trench portion 40 is covered with the interlayer dielectric film 38 at the top surface 21 in the cross-section. If a predetermined voltage is applied to the gate conductive portion 44, a channel is formed by an electron inversion layer at a surface layer of an interface of a base region 14 contacting the gate trench portion 40.

A dummy trench portion 30 may have the same structure as that of the gate trench portions 40 in the cross-section. The dummy trench portion 30 has a dummy trench, a dummy insulating film 32 and a dummy conductive portion 34 that are provided on the top surface 21 side. The dummy insulating film 32 is provided to cover the inner wall of the dummy trench. The dummy conductive portion 34 is provided inside the dummy trench and on the inner side relative to the dummy insulating film 32. The dummy insulating film 32 insulates the dummy conductive portion 34 from the semiconductor substrate 10.

The dummy conductive portion 34 may be formed of the same material as that of the gate conductive portion 44. For example, the dummy conductive portion 34 is formed of a conductive material such as polysilicon. The dummy conductive portion 34 may have a length in the depth direction that is the same as that of the gate conductive portion 44. The dummy trench portion 30 is covered with the interlayer dielectric film 38 at the top surface 21 in the cross-section. Note that bottom portions of the dummy trench portions 30 and gate trench portions 40 may be in a surface form that is curved downward (a curvilinear form in the cross-section).

In first mesa portions 64 and second mesa portion 65, one or more accumulation regions 16 may be provided above the drift region 18 and in contact with gate trench portions 40. The semiconductor device 100 shown in FIG. 2b shows one example in which one accumulation region 16 is provided in the Z-axis direction. If a plurality of accumulation regions 16 are provided, the individual accumulation regions 16 may be arranged in line in the Z-axis direction. The doping concentration of the accumulation regions 16 is higher than the doping concentration of the drift region 18. By providing the accumulation regions 16, the carrier injection enhancement effect (IE effect) can be enhanced to lower ON voltage.

The one or more accumulation regions 16 may be in contact with dummy trench portions 30 in the first mesa portions 64 and second mesa portion 65, but may also be apart from them. FIG. 2b shows one example in which the accumulation regions 16 are provided in contact with the dummy trench portions 30.

In the first mesa portions 64 and second mesa portion 65, base regions 14 are provided above the accumulation regions 16 and in contact with gate trench portions 40. In the first mesa portions 64, the base regions 14 may be provided in contact with dummy trench portions 30.

In the cross-section taken along a-a', the first mesa portions 64 are provided with emitter regions 12 in contact with the top surface 21 and in contact with gate trench portions 40. The doping concentration of the emitter regions 12 is higher than the doping concentration of the drift region 18. The first mesa portions 64 are provided with contact regions 15 on the X-axis direction positive side and X-axis direction negative side in the cross-section taken along a-a', in contact with the top surface 21, and in contact with gate trench portions 40.

In the second mesa portion 65, the top surface 21 is provided with a contact region 15 adjacent to a dummy trench portion 30. The contact region 15 may be in contact with the dummy trench portion 30, but may also be apart from it. FIG. 2b shows one example in which the contact region 15 is provided in contact with the dummy trench portion 30.

The second well region 13 is provided between the diode portion 80 and the transistor portion 70 in the Y-axis direction. The second well region 13 may be provided to be sandwiched by the diode portion 80 and the transistor portion 70 in the Y-axis direction. The second well region 13 is provided exposed to the top surface 21. The diffusion depth of the second well region 13 may be greater than the depths of the dummy trench portion 30 and gate trench portions 40 in the transistor portion 70. The end of the second well region 13 on the Y-axis direction positive side may be at the center, in the Y-axis direction, of the dummy trench portion 30 at the end of the transistor portion 70 on the Y-axis direction negative side, that is, the position A3.

The second well region 13 may be provided with a dummy trench portion 30. The top surface of the dummy trench portion 30 is provided with the gate runner 48. The top surface of the gate runner 48 is provided with the interlayer dielectric film 38. A contact hole 56 is provided above the dummy trench portion 30.

In the diode portion 80, one or more accumulation regions 16 may be provided above the drift region 18. The accumulation regions 16 may be provided in contact with the second well region 13. The accumulation regions 16 in the diode portion 80 may be provided at a depth substantially the same as that of the accumulation regions 16 in the transistor portions 70. Note that the accumulation regions 16 may also not be provided in the diode portion 80. Base regions 14 are provided: above the accumulation regions 16; in contact with the second well region 13; and in contact with the top surface 21.

A first-conductivity-type buffer region 20 may be provided below the drift region 18. The buffer region 20 is of N+ type, for example. The doping concentration of the buffer region 20 is higher than the doping concentration of the drift region 18. The buffer region 20 may function as a field stop layer that prevents a depletion layer spreading from the bottom surface side of the base regions 14 from reaching a P+ type collector region 22 and the N+ type cathode region 82.

In the diode portion 80 the cathode region 82 is provided below the buffer region 20 and exposed to the bottom surface 23. The cathode region 82 may be arranged separately from the second well region 13 by a predetermined distance in the Y-axis direction.

In the transistor portion 70, the collector region 22 is provided below the buffer region 20 and exposed to the bottom surface 23. The collector region 22 may be provided at the same depth as the cathode region 82. The collector region 22 may be provided to extend in the Y-axis direction from the transistor portion 70 to the cathode region 82 in the diode portion 80.

The semiconductor device 100 may further have a lifetime control region 72 that is provided on the top surface 21 side and includes a lifetime killer. The position at which the lifetime control region 72 is provided may be higher, in the depth direction of the semiconductor substrate 10, than the middle of the semiconductor substrate 10 having a thickness T. The lifetime control region 72 may be provided at a position deeper than the second well region 13.

The lifetime control region 72 may be provided in the diode portion 80. The end portion K of the lifetime control region 72 in the Y-axis direction may be arranged between the position A1 and the position A2 in the Y-axis direction, as shown in FIG. 2b. The lifetime control region 72 may not be provided below gate trench portions 40 in the transistor portion 70.

The lifetime control region 72 is formed locally in the depth direction of the semiconductor substrate 10. That is, the lifetime control region 72 has a defect density higher than other regions of the semiconductor substrate 10. An exemplary lifetime killer is helium implanted at a predetermined depth position. By implanting helium, crystal defects can be formed inside the semiconductor substrate 10.

The lifetime control region 72 may be formed by implanting helium ions from the top surface 21 side, for example. If the lifetime control region 72 is formed by implanting helium ions from the top surface 21 side, the lifetime killer may be distributed with its peak concentration at the position of the lifetime control region 72 in the Z-axis direction shown in FIG. 2b and lower concentrations than the peak concentration on the top surface 21 side of the peak position. With the lifetime killer being distributed on the top surface 21 side at lower concentrations than the peak concentration, accumulated carriers on the top surface 21 side of the diode portion 80 can be effectively reduced. Because of this, soft recovery of the diode portion 80 can be achieved.

In the semiconductor device 100 in the present example, the main direction of trench portions in the transistor portion 70 is different from the main direction of trench portions in the diode portion 80 in the top view of the semiconductor substrate 10. As shown in FIG. 2a and FIG. 2b, if the main direction of the trench portions in the transistor portion 70 is orthogonal to the main direction of the trench portions in the diode portion 80, while the side walls of dummy trench portions 30 in the diode portion 80 lie on Y-Z planes, the side walls of gate trench portions 40 and dummy trench portions 30 in the transistor portion 70 lie on X-Z planes. That is, the dummy trench portions 30 in the diode portion 80 do not have X-Z planes corresponding to the side walls of the gate trench portions 40 and dummy trench portions 30 in the transistor portion 70. Because of this, carriers that are concentrated at lower portions of a dummy trench portion 30 and a gate trench portion 40 which are arranged in a region which is in the transistor portion 70 and adjacent to the diode portion 80 can easily pass through between dummy trench portions 30 in the diode portion 80 in the X-axis direction toward the Y-axis direction negative side. Because of this, electric field concentration in the gate trench portion 40 and dummy trench portion 30 in the transistor portion 70 can be relaxed.

In addition, since in the semiconductor device 100 in the present example, the main direction of trench portions in the transistor portion 70 is different from the main direction of trench portions in the diode portion 80 in the top view of the semiconductor substrate 10, the trench portions in the transistor portion 70 and the trench portions in the diode portion 80 are not arrayed to be parallel to and adjacent to each other. Furthermore, since a second well region 13 is provided in a region which is in the diode portion 80 and is adjacent to the transistor portion 70, the cathode region 82 can be arranged to be further apart from the transistor portion 70 as compared to the case where trench portions in the transistor portion 70 and trench portions in the diode portion 80 are arrayed to be parallel to and adjacent to each other. Because of this, as compared to the case where trench portions in the transistor portion 70 and trench portions in the diode portion 80 are arrayed to be parallel to and adjacent to each other, injection of holes from emitter regions 12 in the transistor portion 70 into the cathode region 82 in the diode portion 80 can be suppressed. Because of this, reverse recovery characteristics of the diode portion 80 can be improved.

In addition, since in the semiconductor device 100 in the present example, the end portion K of the lifetime control region 72 is provided between the position A1 and the position A2 in the Y-axis direction, the lifetime control region 72 can be arranged to be further apart from the transistor portion 70 as compared to the case where trench portions in the transistor portion 70 and trench portions in the diode portion 80 are arrayed to be parallel to and adjacent to each other. Because of this, leakage current of the transistor portion 70 can be suppressed. In addition, the trade-off between ON voltage and turn-off loss of the transistor portion 70 can be improved.

Figure 2C:
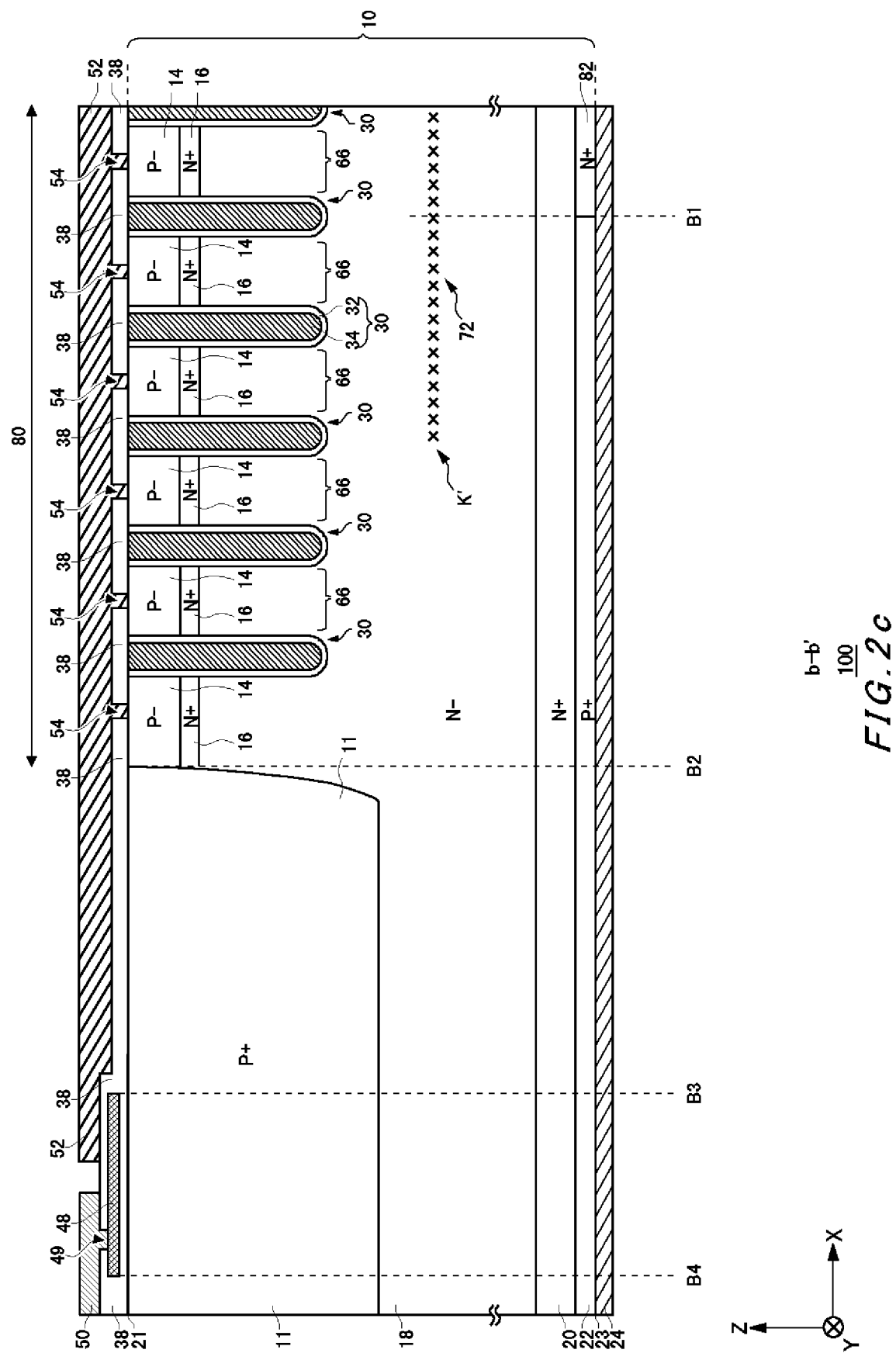

FIG. 2c is a figure showing an exemplary cross-section taken along b-b' in FIG. 2a. The cross-section taken along b-b' is an X-Z plane passing through the first well region 11 and base regions 14 in the diode portion 80. In the cross-section taken along b-b', the semiconductor device 100 in the present example has the semiconductor substrate 10, the interlayer dielectric film 38, the emitter electrode 52, the gate runner 48, the gate metal layer 50 and the collector electrode 24. The emitter electrode 52 is provided to the top surface 21 and the top surface of the interlayer dielectric film 38. The gate metal layer 50 is provided to the top surface 21 and the top surface of the interlayer dielectric film 38.

The semiconductor substrate 10 includes the first-conductivity-type drift region 18. Dummy trench portions 30 may have the same structure as that of dummy trench portions 30 in the transistor portion 70 in the cross-section taken along a-a' in FIG. 2b.

In third mesa portions 66, one or more accumulation regions 16 may be provided above the drift region 18 and in contact with dummy trench portions 30. The semiconductor device 100 shown in FIG. 2c shows one example in which one accumulation region 16 is provided in the Z-axis direction. If a plurality of accumulation regions 16 are provided, the individual accumulation regions 16 may be arranged in line in the Z-axis direction. The doping concentration of accumulation regions 16 may be equal to the doping concentration of accumulation regions 16 in the transistor portion 70. The third mesa portions 66 may also not be provided with accumulation regions 16.

A third mesa portion 66 is provided with a base region 14: above an accumulation region 16; in contact with the top surface 21; and in contact with dummy trench portions 30. Note that an accumulation region 16 and a base region may be provided also between the dummy trench portion 30 at the end on the X-axis direction negative side and the first well region 11 in the X-axis direction in FIG. 2c.

In the cross-section taken along b-b', the first well region 11 is provided below the gate runner 48 and the gate metal layer 50. In the X-axis direction, the first well region 11 may be provided to pass under the gate metal layer 50 continuously from a position at which it contacts a base region 14 and an accumulation region 16 in contact, on the X-axis direction negative side, with the dummy trench portion 30 provided at the end on the X-axis direction negative side to the transistor portion 70 on the X-axis direction negative side in FIG. 1.

The gate runner 48 and gate metal layer 50 are provided above part of the top surface of the first well region 11. The gate runner 48 may be provided inside the interlayer dielectric film 38. The top surface of the interlayer dielectric film is provided with the emitter electrode and gate metal layer 50.

The semiconductor device 100 may have the lifetime control region 72 in the cross-section taken along b-b'. The end portion K' of the lifetime control region 72 in the X-axis direction may be arranged between the position B1 and the position B2 in the X-axis direction as shown in FIG. 2c, that is, between the boundary between the cathode region 82 and the collector region 22 and the end of the first well region 11 on the X-axis direction positive side. An end portion of the lifetime control region 72 on the X-axis direction positive side may be provided between the end of the cathode region 82 on the X-axis direction positive side in FIG. 1 and the end, on the X-axis direction negative side, of the first well region 11 provided on the X-axis direction positive side relative to the cathode region 82. That is, the lifetime control region 72 may be provided to include, in the X-axis direction, the cathode region 82 in the top view of the semiconductor substrate 10.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 3A:
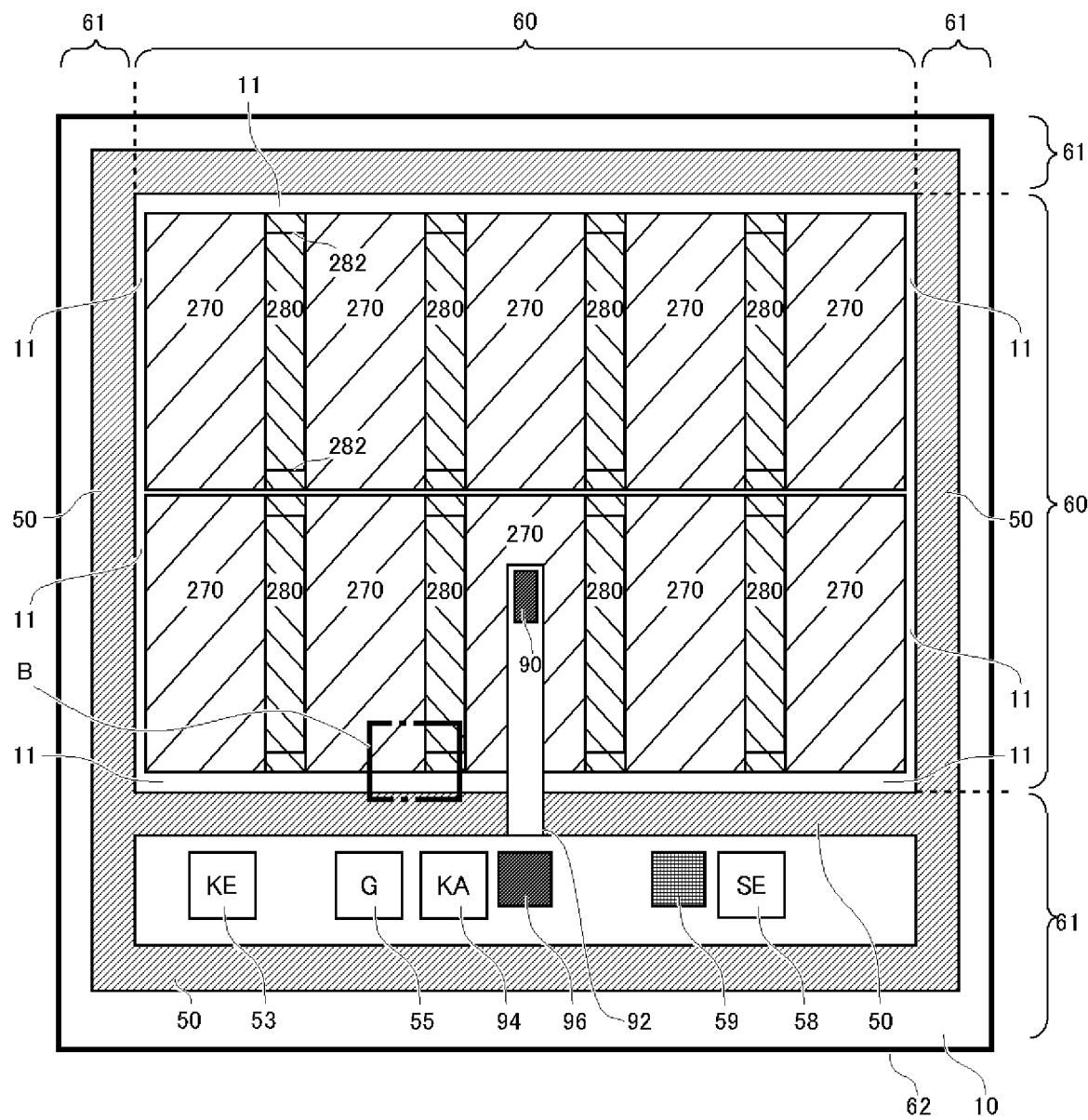
FIG. 3a is a figure showing an exemplary top surface of a semiconductor device 150 in a comparative example.

FIG. 3a is a figure showing an exemplary top surface of a semiconductor device 150 in a comparative example. The semiconductor device 150 of the comparative example is a semiconductor chip including transistor portions 270 and diode portions 280. The transistor portions 270 include transistors such as IGBTs. The diode portions 280 include diodes such as FWDs provided adjacent to the transistor portions 270 on the top surface of the semiconductor substrate 10.

In the semiconductor device 150 in the comparative example, the width of the transistor portions 270 in the Y-axis direction is 600 μm or longer. In addition, the width of the diode portions 280 in the Y-axis direction is 200 μm or longer. The semiconductor device 150 in the comparative example can prevent snapback of the transistor portions 270 by setting the width of the transistor portions 270 in the Y-axis direction to 600 μm or longer and by setting the width of the diode portions 280 in the Y-axis direction to 200 μm or longer.

The active portion 60 may be provided with a plurality of transistor portions 270 and diode portions 280 in the X-axis direction and Y-axis direction. FIG. 3a shows one example in which two transistor portions 270 are provided in the X-axis direction and five transistor portions 270 are provided in the Y-axis direction, and two diode portions 280 are provided in the X-axis direction and four diode portions 280 are provided in the Y-axis direction. Each diode portion 280 is provided with a first-conductivity-type cathode region 282 at the bottom surface of the semiconductor substrate 10.

Figure 3B:
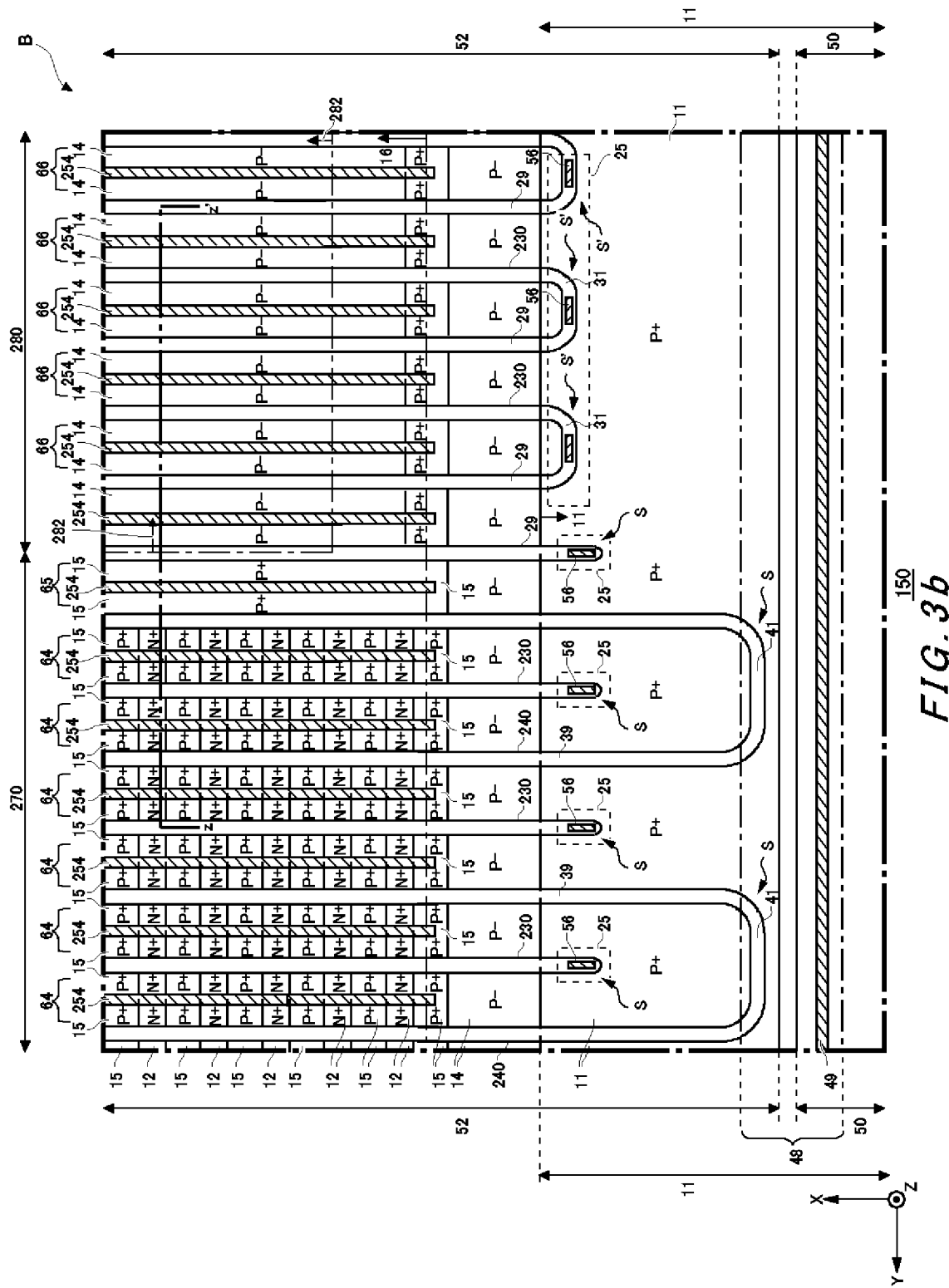

FIG. 3b is an enlarged view of a region B in FIG. 3a. In the top view of the semiconductor substrate 10, as shown in FIG. 3b, in the semiconductor device 150 in the comparative example, the main direction of dummy trench portions 230 in a diode portion 280 are the same as the main direction of gate trench portions 240 in a transistor portion 270. That is, the trench portions in the diode portion 280 and the trench portions in the transistor portion 270 extend in the same main direction (the X-axis direction in the present example).

In the semiconductor device 150 in the comparative example, the main direction of contact holes 254 provided to overlap the transistor portion 270 are the same as the main direction of contact holes 254 provided to overlap the diode portion 280, as shown in FIG. 3b. That is, in the top view of the semiconductor substrate 10, the contact holes 254 provided to overlap the transistor portion 270 and the contact holes 254 provided to overlap the diode portion 280 extend in the same main direction (the X-axis direction in the present example).

Figure 3C:
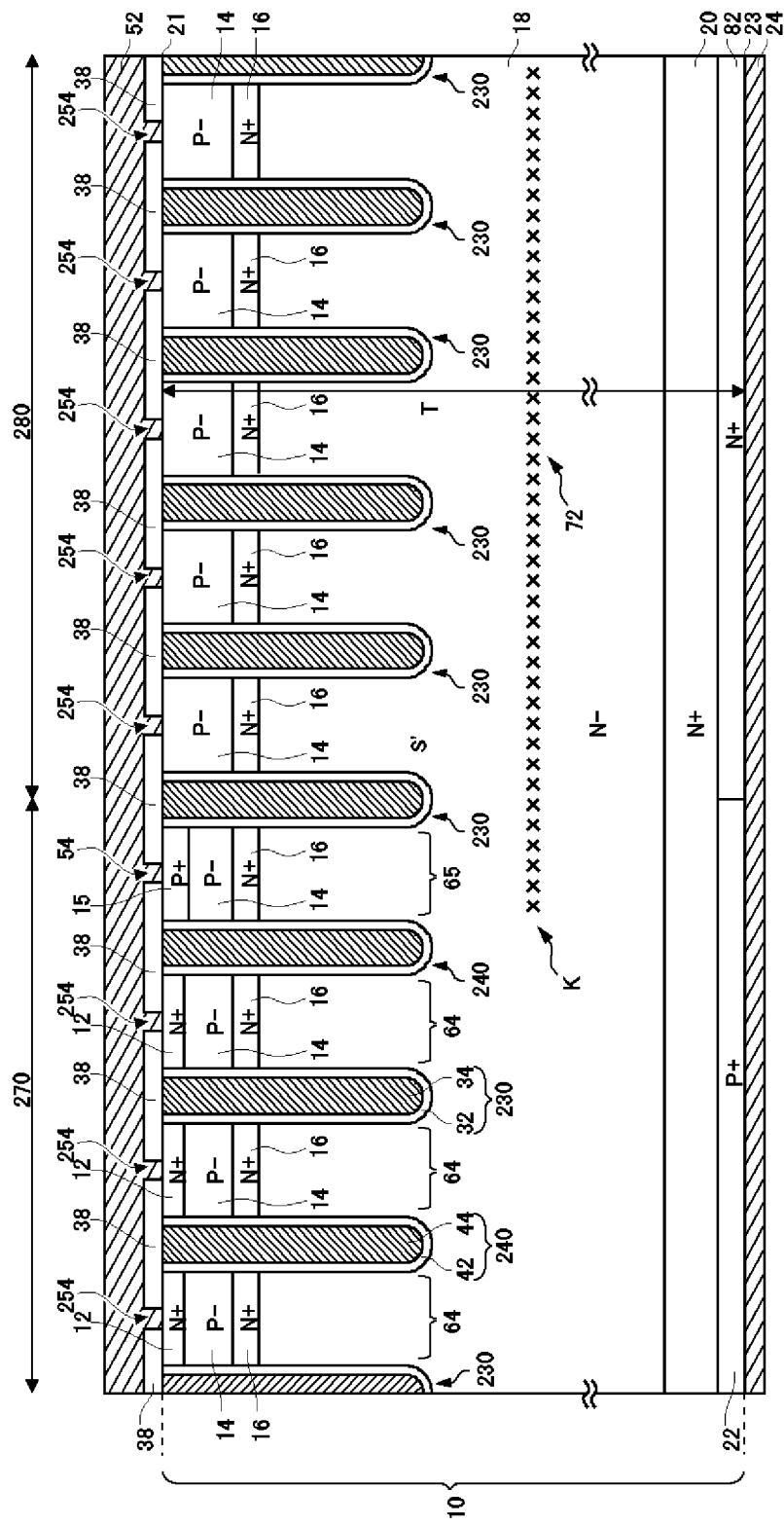
FIG. 3c is a figure showing a cross-section taken along z-z' in FIG. 3b.

FIG. 3c is a figure showing a cross-section taken along z-z' in FIG. 3b. The cross-section taken along z-z' is a Y-Z plane passing through emitter regions 12, a contact region 15 and base regions 14. In the cross-section taken along z-z', the semiconductor device 150 in the comparative example has the semiconductor substrate 10, the interlayer dielectric film 38, the emitter electrode 52 and the collector electrode 24. The emitter electrode 52 is provided to the top surface 21 and the top surface of the interlayer dielectric film 38. In addition, the diode portion 280 is provided with the lifetime control region 72 on its top surface 21 side. The end portion K of the lifetime control region 72 is provided on the Y-axis direction positive side relative to the boundary between the collector region 22 and the cathode region 82. The distance between the end portion K and the boundary in the Y-axis direction is about 150 μm.

In the semiconductor device 150 in the comparative example, both the main direction of the trench portions in the transistor portion 270 and the main direction of the trench portions in the diode portion 280 lie in the X-axis direction as shown in FIG. 3b. Because of this, in the cross-section taken along z-z', both side walls of dummy trench portions 230 in the diode portion 280 and side walls of gate trench portions 240 and a dummy trench portion 230 in the transistor portion 270 lie on X-Z planes. Because of this, carriers that are concentrated at lower portions of the dummy trench portion 230 and a gate trench portion 240 which are arranged in a region which is in the transistor portion 270 and adjacent to the diode portion 280 are impeded by dummy trench portions 230 in the diode portion 280 and therefore cannot easily pass toward the Y-axis direction negative side. Because of this, the semiconductor device 150 in the comparative example cannot relax electric field concentration at the gate trench portion 240 and dummy trench portion 230 in the transistor portion 270.

In addition, in the semiconductor device 150 in the comparative example, the end portion K of the lifetime control region 72 is provided in the transistor portion 270. Because of this, leakage current characteristics of the transistor portion 270 deteriorate.

Figure 4A:
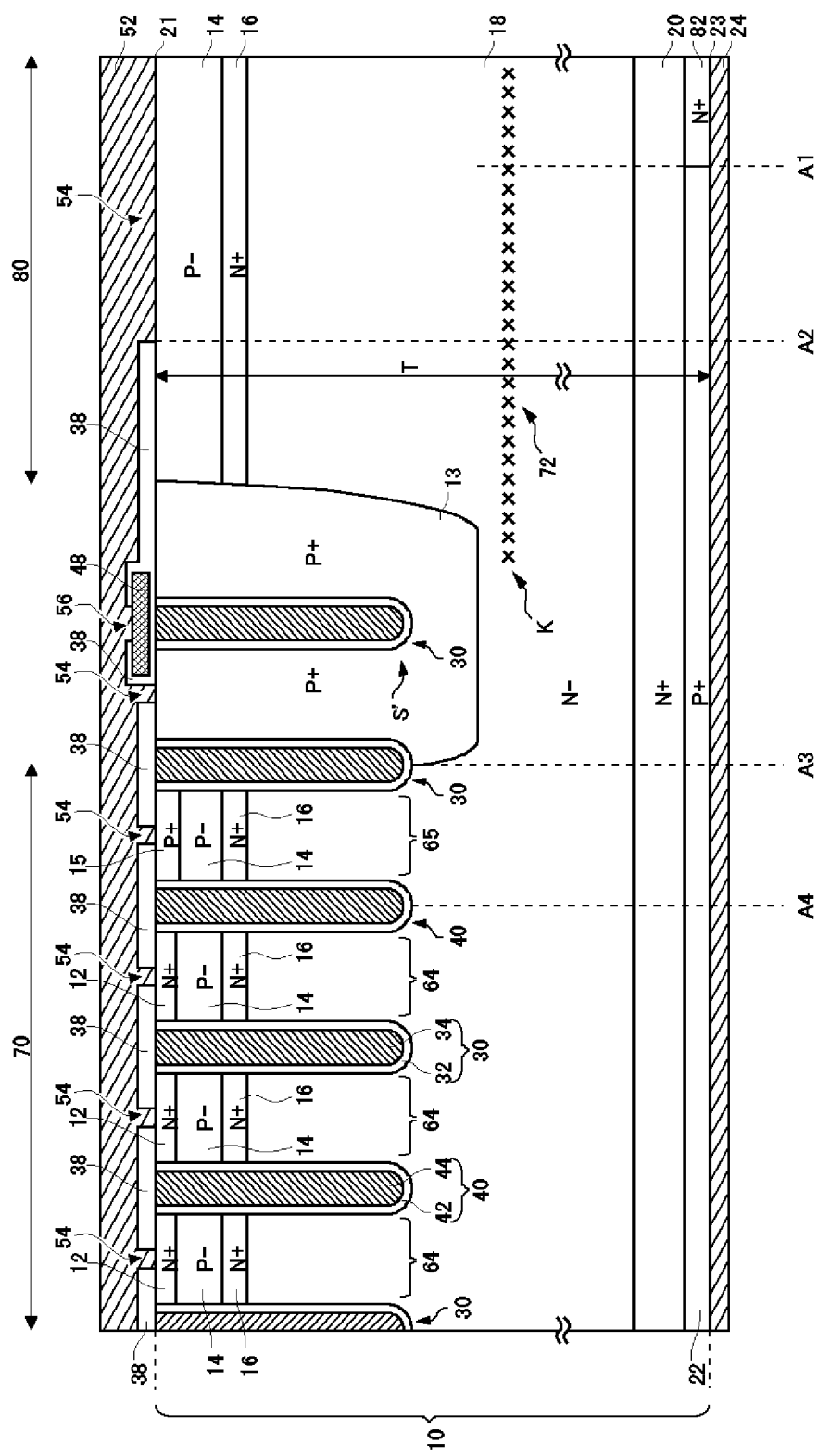

FIG. 4a is a figure showing another exemplary cross-section taken along a-a' in FIG. 2a. As shown in FIG. 4a, the semiconductor device 100 in the present example is different from the semiconductor device 100 shown in FIG. 2b in that the end portion K of the lifetime control region 72 is arranged between the position A2 and the position A3 in the Y-axis direction in the configuration of the semiconductor device 100 shown in FIG. 2b.

Since in the semiconductor device 100 in the present example, the end portion K of the lifetime control region 72 is provided between the position A2 and the position A3 in the Y-axis direction, the lifetime control region 72 can be arranged to be further apart from the transistor portion 70 as compared to the case where trench portions in the transistor portion 70 and trench portions in the diode portion 80 are arrayed to be parallel to and adjacent to each other. Because of this, leakage current of the transistor portion 70 can be suppressed. In addition, the trade-off between ON voltage and turn-off loss of the transistor portion 70 can be improved.

Figure 4B:
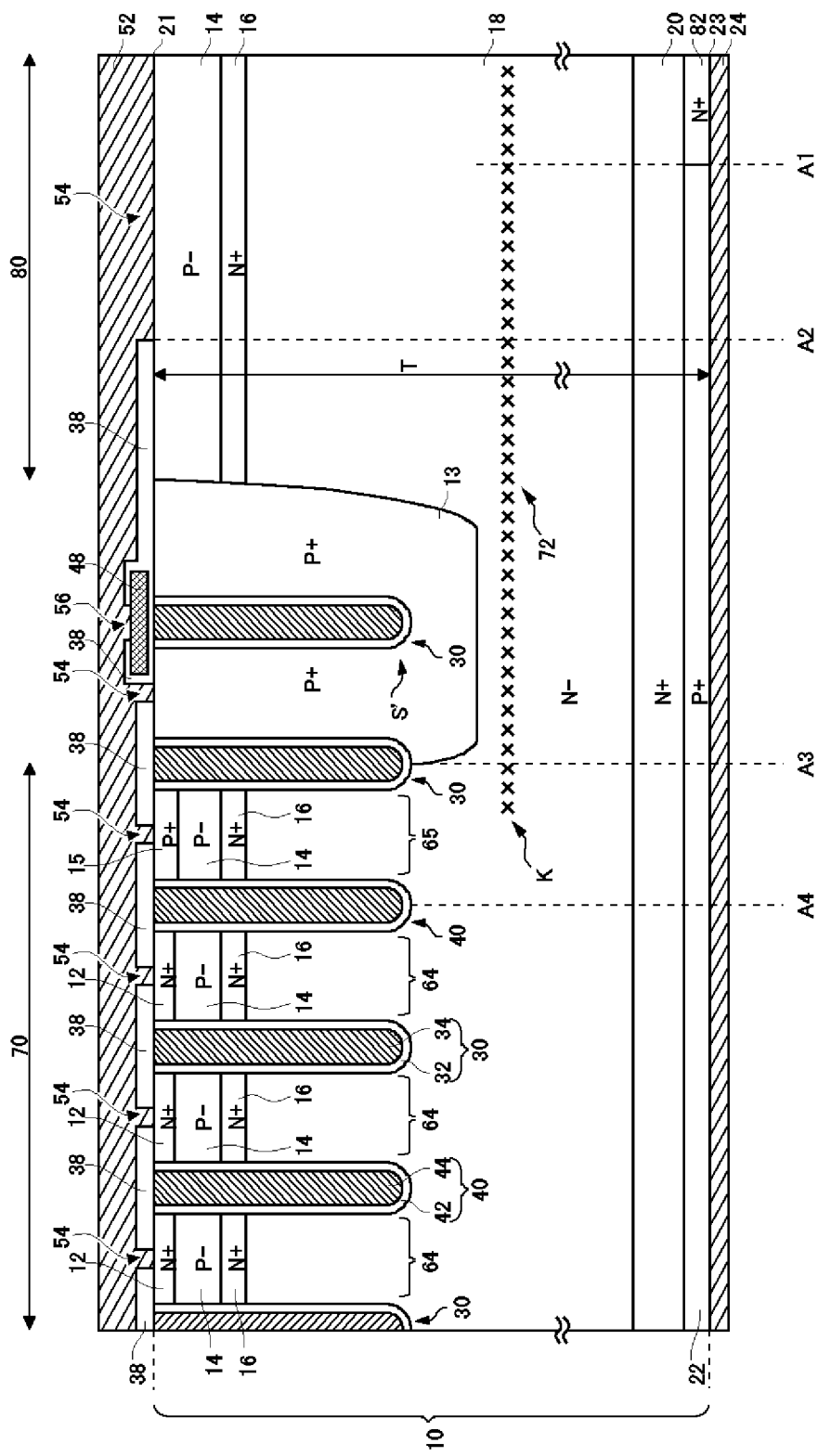

FIG. 4b is a figure showing another exemplary cross-section taken along a-a' in FIG. 2a. As shown in FIG. 4b, the semiconductor device 100 in the present example is different from the semiconductor device 100 shown in FIG. 2b in that the end portion K of the lifetime control region 72 is arranged between the position A3 and the position A4 in the Y-axis direction in the configuration of the semiconductor device 100 shown in FIG. 2b. That is, the end portion K is provided in the transistor portion 70, but not provided below gate trench portions 40.

Since in the semiconductor device 100 in the present example, the end portion K of the lifetime control region 72 is provided between the position A3 and the position A4 in the Y-axis direction, injection of holes from emitter regions 12 in the transistor portion 70 into the cathode region 82 in the diode portion 80 can be suppressed further as compared to the semiconductor device 100 shown in FIG. 2b and FIG. 4a. Because of this, reverse recovery characteristics of the diode portion 80 can be improved further. In addition, since the end portion K is not arranged below gate trench portions 40 in the transistor portion 70, the trade-off between ON voltage and turn-off loss of the transistor portion 70 can be improved.

Figure 5A:
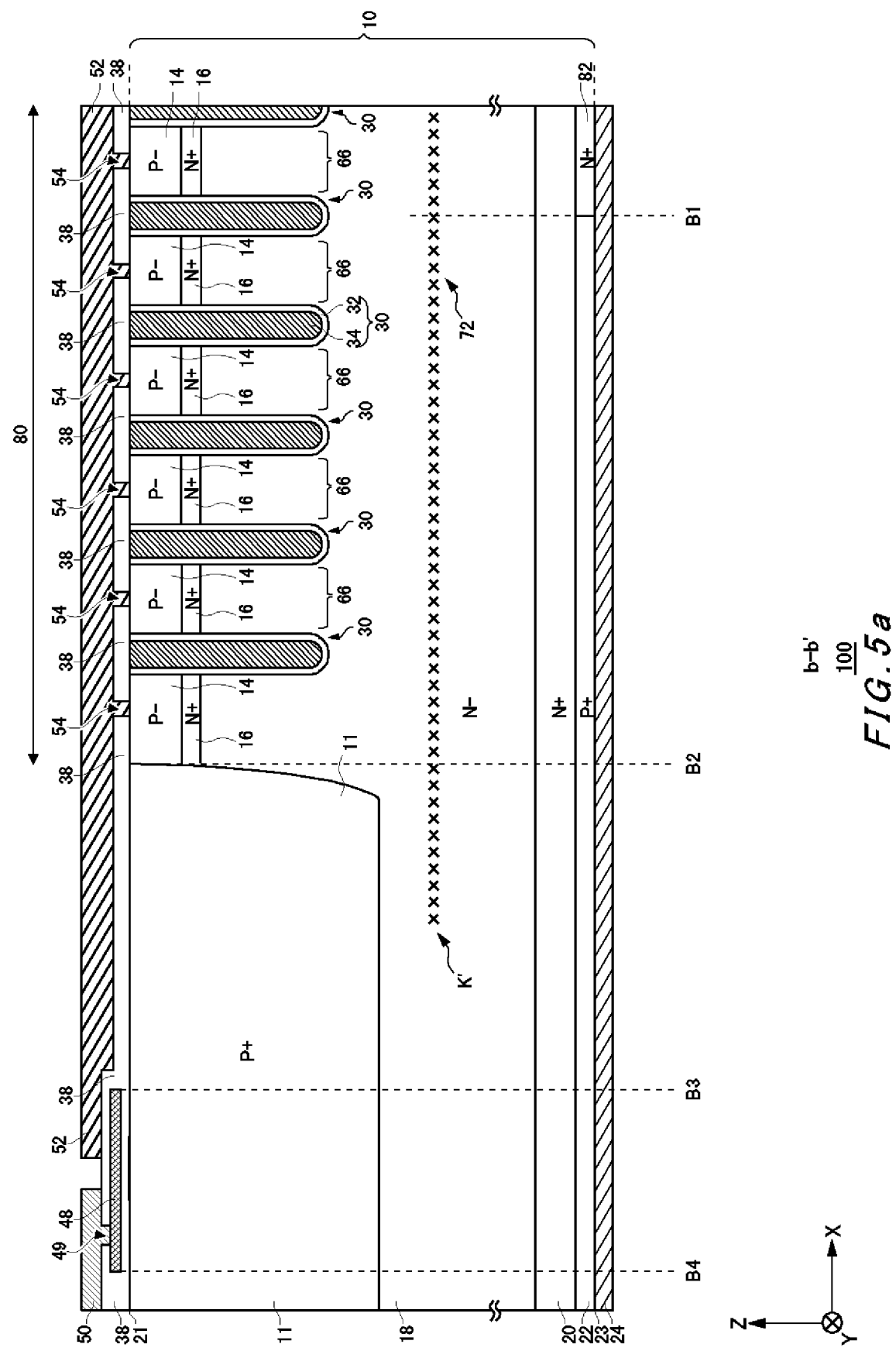

FIG. 5a is a figure showing another exemplary cross-section taken along b-b' in FIG. 2a. As shown in FIG. 5a, the semiconductor device 100 in the present example is different from the semiconductor device 100 shown in FIG. 2b in that the end portion K' of the lifetime control region 72 is arranged between the position B2 and the position B3 in the X-axis direction, in the configuration of the semiconductor device 100 shown in FIG. 2c. That is, in the present example, the end portion K' is provided below the first well region 11. An end portion of the lifetime control region 72 on the X-axis direction positive side may be provided below the first well region 11 provided on the X-axis direction positive side relative to the end of the cathode region 82 on the X-axis direction positive side in FIG. 1. That is, the lifetime control region 72 may be provided to include, in the X-axis direction, the cathode region 82 in the top view of the semiconductor substrate 10.

Figure 5B:
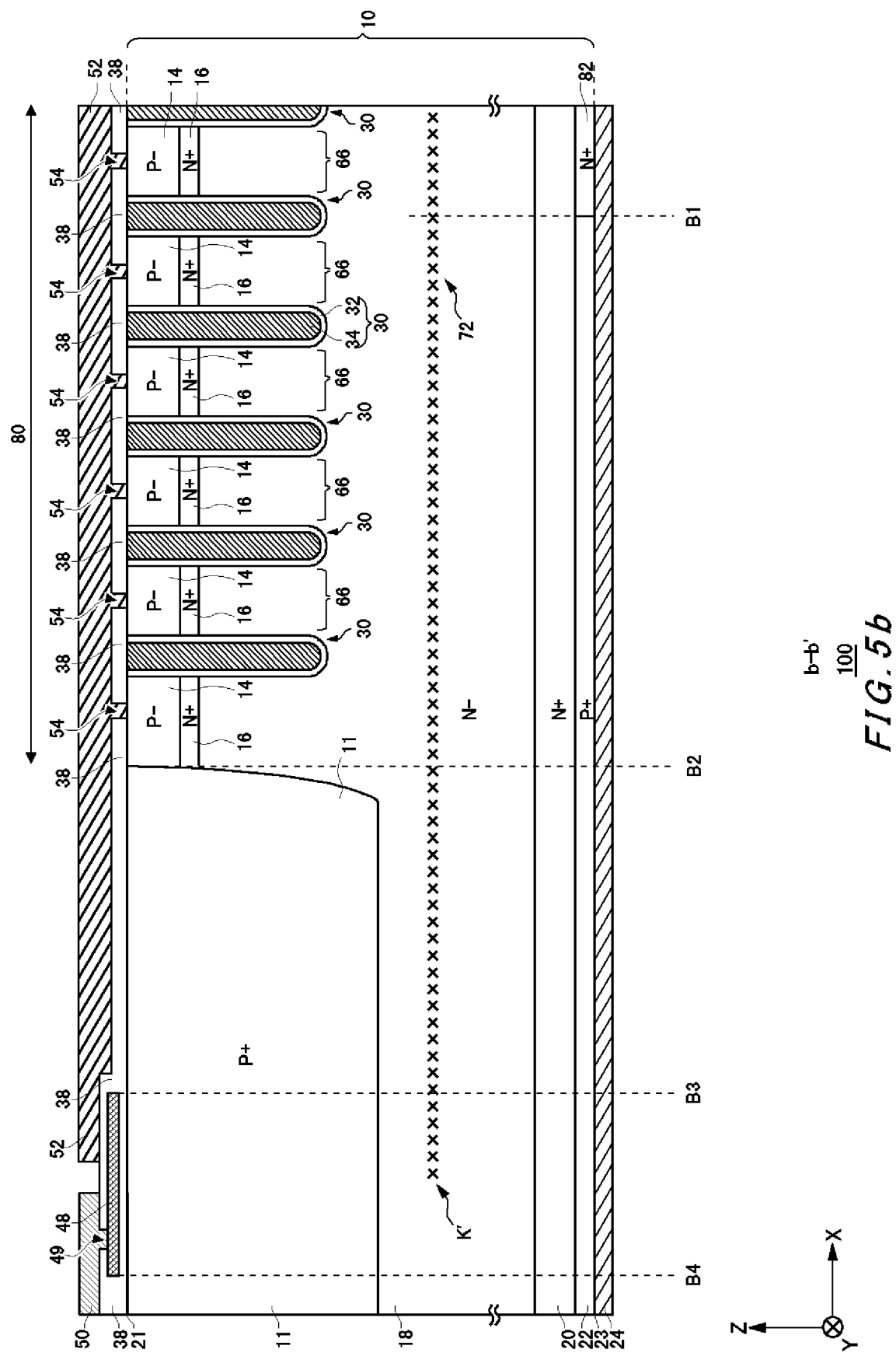

FIG. 5b is a figure showing another exemplary cross-section taken along b-b' in FIG. 2a. As shown in FIG. 5b, the semiconductor device 100 in the present example is different from the semiconductor device 100 shown in FIG. 2b in that the end portion K' of the lifetime control region 72 is arranged between the position B3 and the position B4 in the X-axis direction, in the configuration of the semiconductor device 100 shown in FIG. 2c. That is, in the present example, the end portion K' is provided below the first well region 11 and below the gate runner 48. An end portion of the lifetime control region 72 on the X-axis direction positive side may be provided below the first well region 11 and gate runner 48 that are provided on the X-axis direction positive side relative to the end of the cathode region 82 on the X-axis direction positive side in FIG. 1. That is, the lifetime control region 72 may be provided to include, in the X-axis direction, the cathode region 82 in the top view of the semiconductor substrate 10.

Figure 5C:
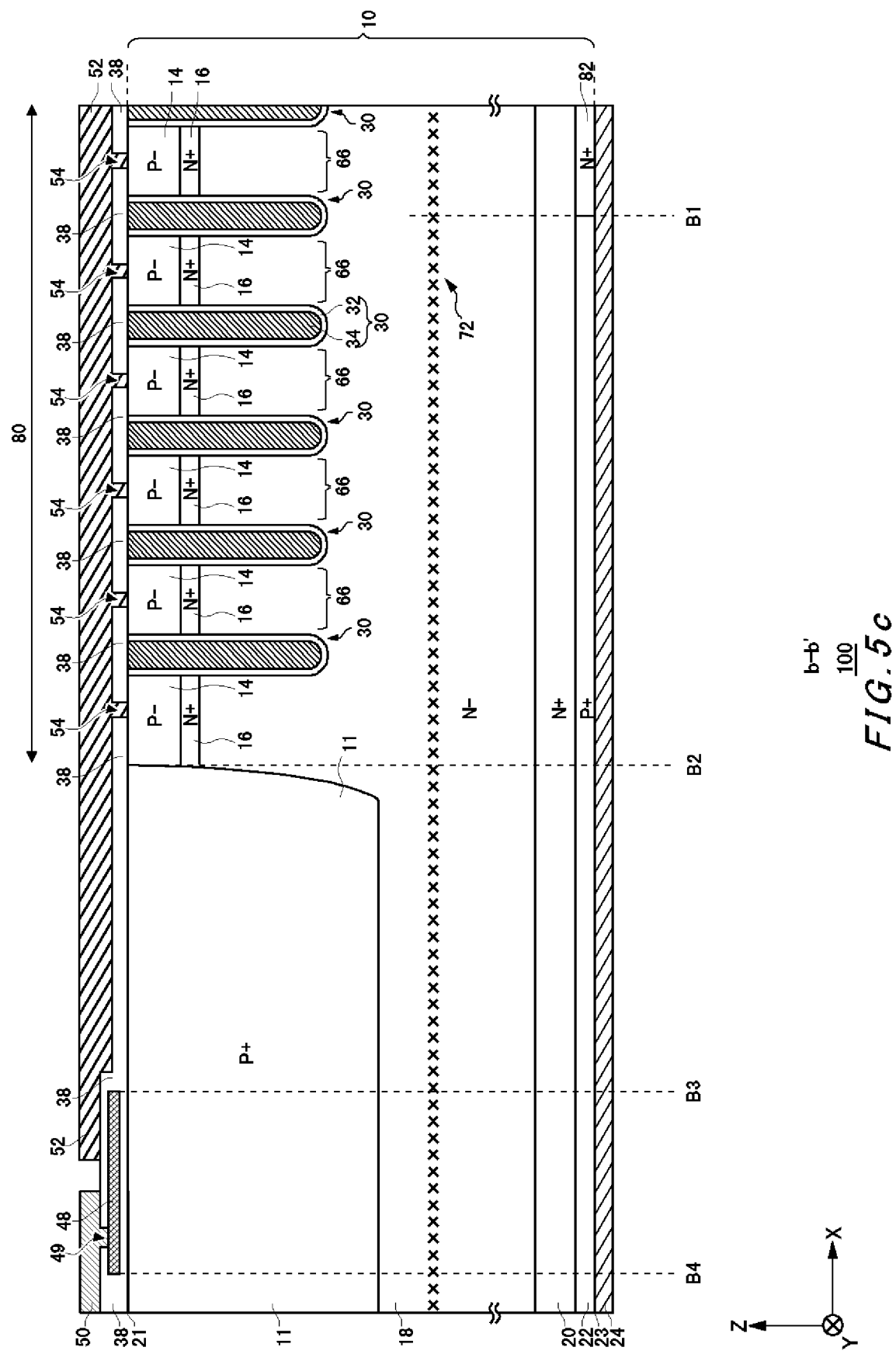

FIG. 5c is a figure showing another exemplary cross-section taken along b-b' in FIG. 2a. As shown in FIG. 5c, the semiconductor device 100 in the present example is different from the semiconductor device 100 shown in FIG. 2b in that the lifetime control region 72 is provided over the entire cross-section taken along b-b' in the X-axis direction, in the configuration of the semiconductor device 100 shown in FIG. 2c. On the X-axis direction negative side relative to the position B4, the lifetime control region 72 may be provided continuously to reach a transistor portion 70 provided on the X-axis direction negative side of the gate metal layer 50 in FIG. 1. An end portion of the lifetime control region 72 on the X-axis direction positive side may be provided to reach an outer peripheral region 61 on the X-axis direction positive side in FIG. 1. That is, the lifetime control region 72 may be provided to include, in the X-axis direction, the cathode region 82 in the top view of the semiconductor substrate 10.

Since in the semiconductor device 100 shown in FIG. 5a, FIG. 5b and FIG. 5c, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 6A:
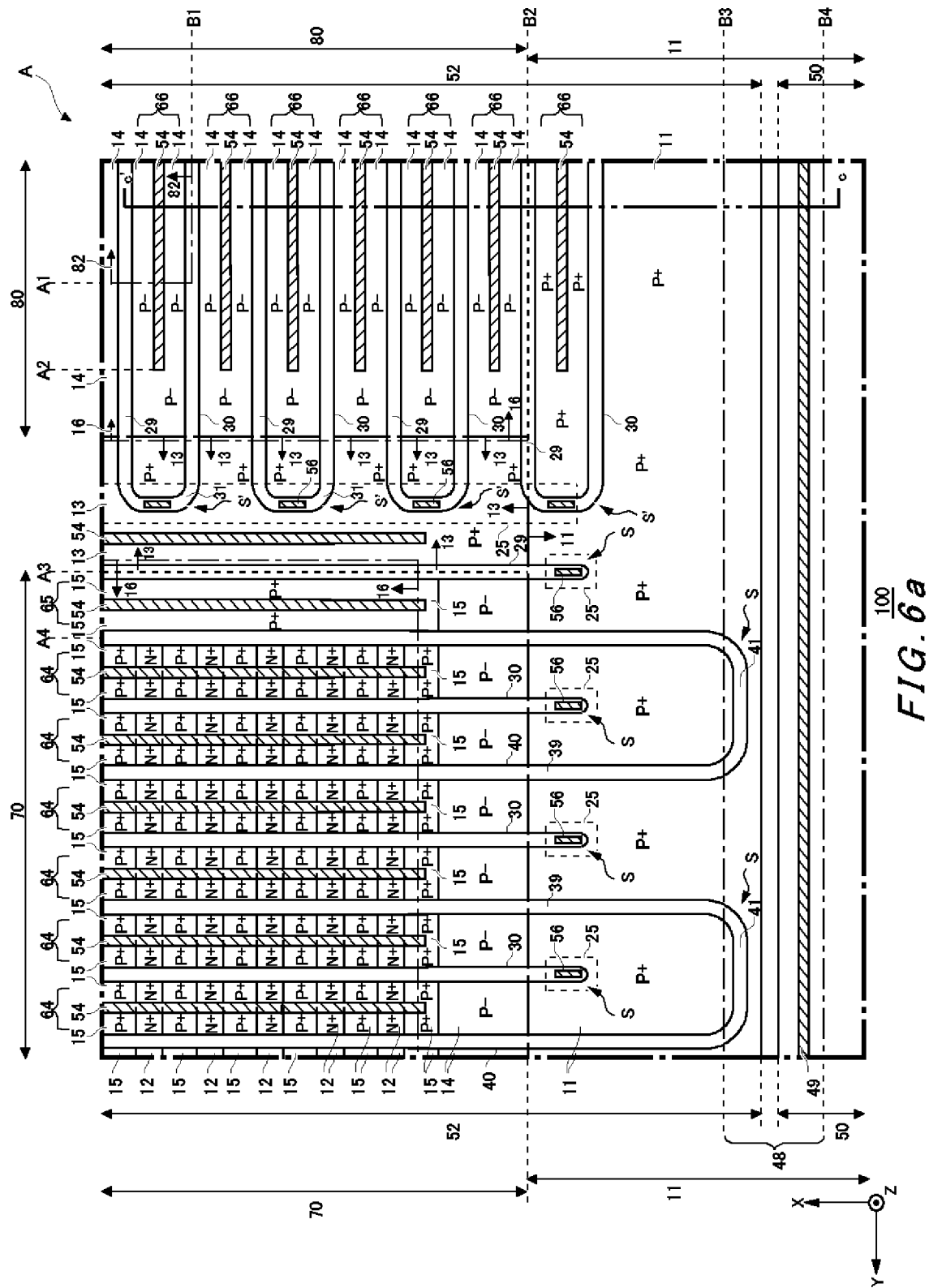
FIG. 6a is another enlarged view of the region A in FIG. 1.

FIG. 6a is another enlarged view of the region A in FIG. 1. The semiconductor device 100 shown in FIG. 6a is different from the semiconductor device 100 shown in FIG. 2a in that contact holes 54 provided above the first well region 11 extending to a position at which it faces the diode portion 80 are further included in the configuration of the semiconductor device 100 shown in FIG. 2a.

The dummy trench portion 30 provided to overlap the boundary of the first well region 11 lying along the Y-axis direction in the top view of the semiconductor substrate 10 at the position at which the first well region 11 face the diode portion 80 in the X-axis direction may be provided such that the center of the trench portion in the X-axis direction coincides with the boundary of the first well region 11 lying along the Y-axis direction. The contact hole 54 provided to overlap the first well region 11 in the top view of the semiconductor substrate 10 may be provided at the center, in the X-axis direction, of two dummy trench portions 30 provided to overlap the first well region 11.

Figure 6B:
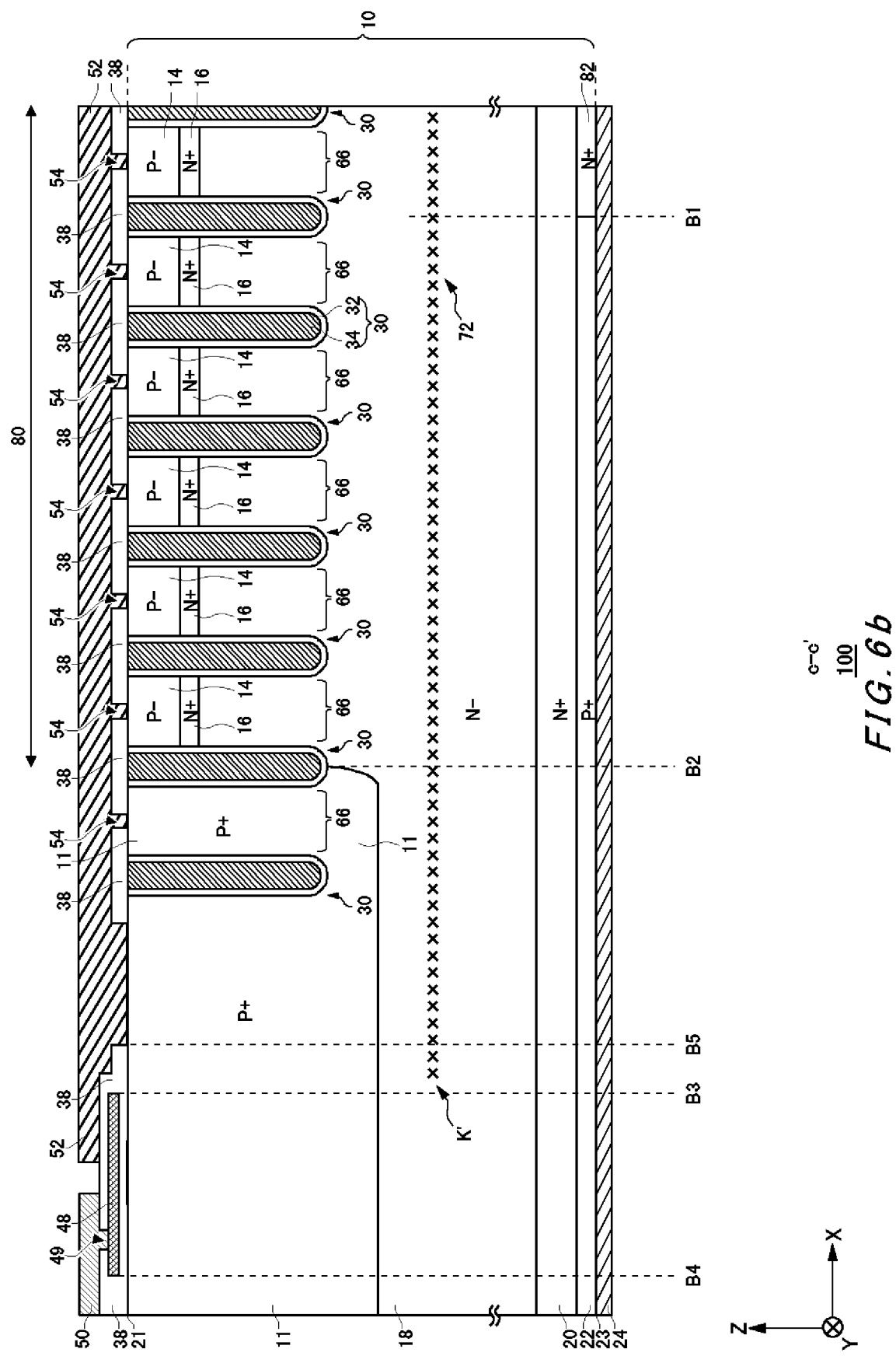

FIG. 6b is a figure showing an exemplary cross-section taken along c-c' in FIG. 6a. As shown in FIG. 6b, in the semiconductor device 100 in the present example, a dummy trench portion 30 is provided on the boundary of the first well region 11 lying along the Z-axis direction. In addition, the dummy trench portion 30 at the end on the X-axis direction negative side is provided such that the side wall of the trench portion is surrounded by the first well region 11.

The position B5 is a position, in the X-axis direction, of the end, on the X-axis direction positive side, of the interlayer dielectric film 38 provided to the top surface of the gate runner 48. As shown in FIG. 6b, the lifetime control region 72 may be provided to overlap contact holes 54 provided above the first well region 11 in the Z-axis direction. The end portion K' of the lifetime control region 72 in the X-axis direction may be provided between the position B2 and the position B5 in the X-axis direction as shown in FIG. 6b, that is, between the end of the first well region 11 on the X-axis direction negative side and the end, on the X-axis direction positive side, of the interlayer dielectric film 38 provided to the top surface of the gate runner 48. An end portion of the lifetime control region 72 on the X-axis direction positive side may be provided to reach the X-axis direction positive side relative to the end of the cathode region 82 on the X-axis direction positive side in FIG. 1. That is, the lifetime control region 72 may be provided to include, in the X-axis direction, the cathode region 82 in the top view of the semiconductor substrate 10.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 7A:
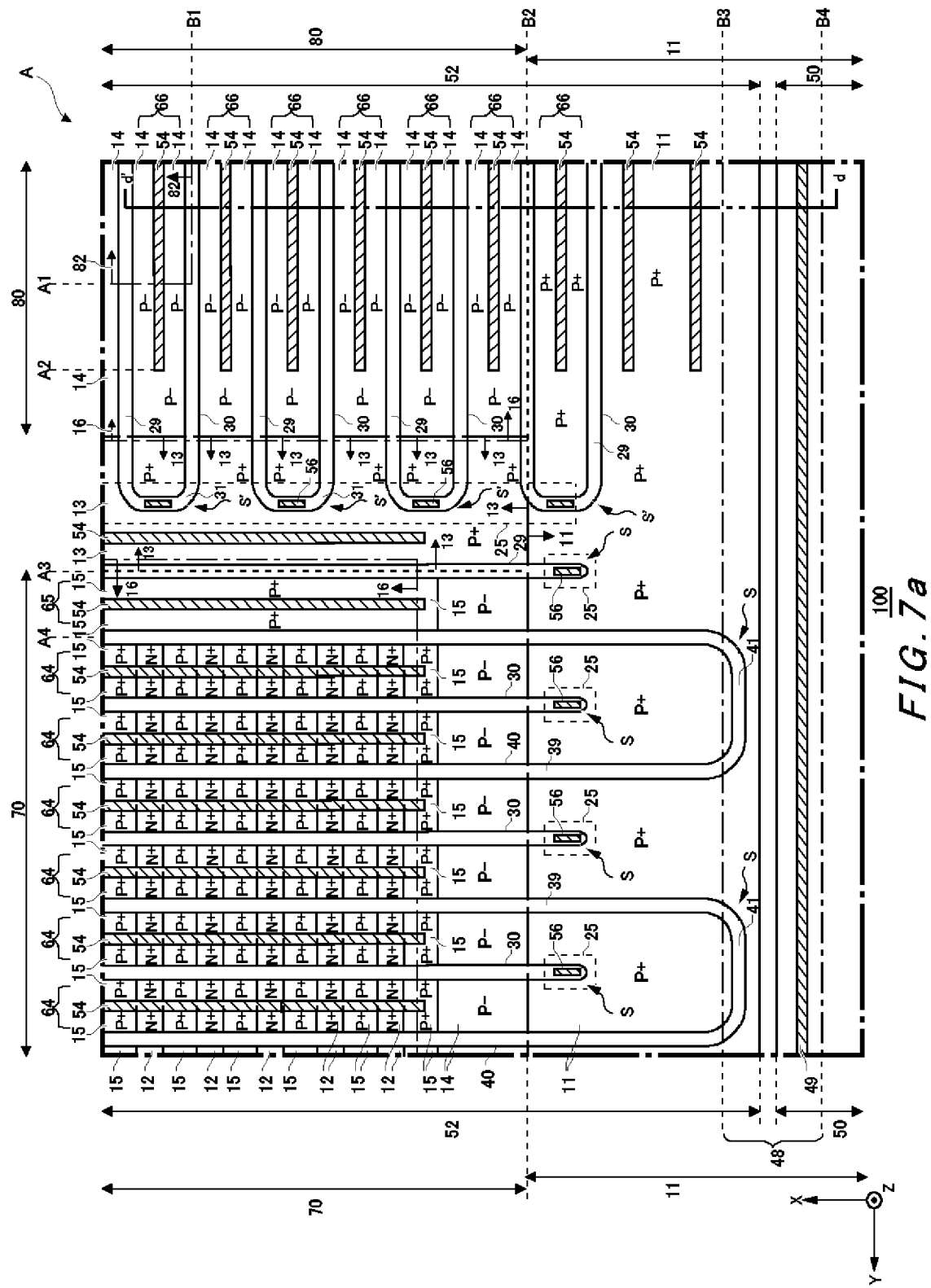
FIG. 7a is another enlarged view of the region A in FIG. 1.

FIG. 7a is another enlarged view of the region A in FIG. 1. The semiconductor device 100 shown in FIG. 7a is different from the semiconductor device 100 shown in FIG. 6a in that a plurality of contact holes 54 provided above the first well region 11 extending to a position at which it faces the diode portion 80 are further included in the configuration of the semiconductor device 100 shown in FIG. 6a. In the semiconductor device 100 in the present example, in the top view of the semiconductor substrate 10, contact holes 54 are provided also between, in the X-axis direction, a dummy trench portion 30 provided above the first well region 11 extending to a position at which it faces the diode portion 80 and the gate runner 48.

Figure 7B:
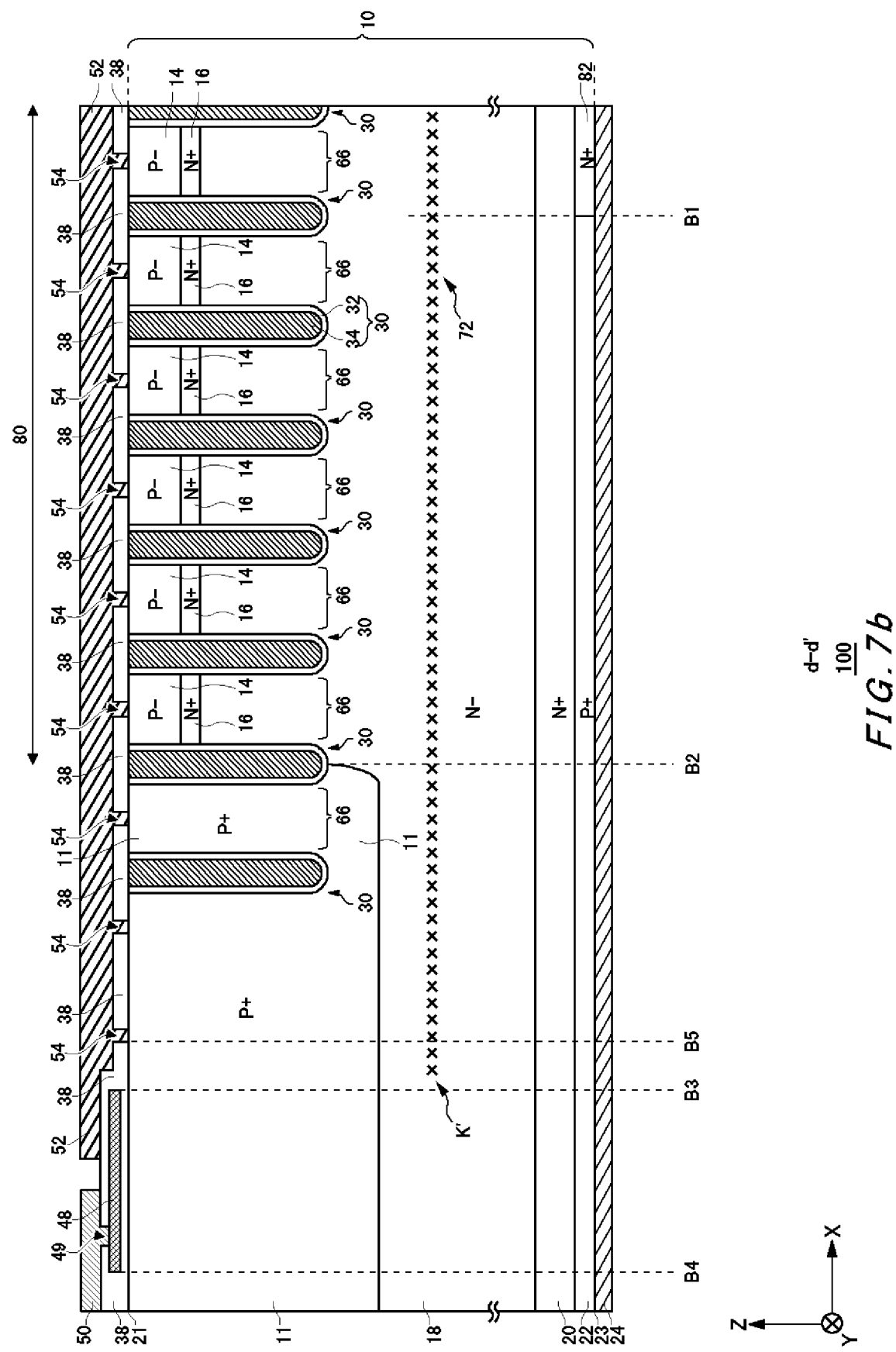

FIG. 7b is a figure showing an exemplary cross-section taken along d-d' in FIG. 7a. As shown in FIG. 7b, the lifetime control region 72 may be provided to overlap all the contact holes 54 provided above the first well region 11 in the Z-axis direction. The end portion K' of the lifetime control region 72 in the X-axis direction may be provided between the position B2 and the position B5 in the X-axis direction, as shown in FIG. 7b. An end portion of the lifetime control region 72 on the X-axis direction positive side may be provided to reach the X-axis direction positive side relative to the end of the cathode region 82 on the X-axis direction positive side in FIG. 1. That is, the lifetime control region 72 may be provided to include, in the X-axis direction, the cathode region 82 in the top view of the semiconductor substrate 10.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 8A:
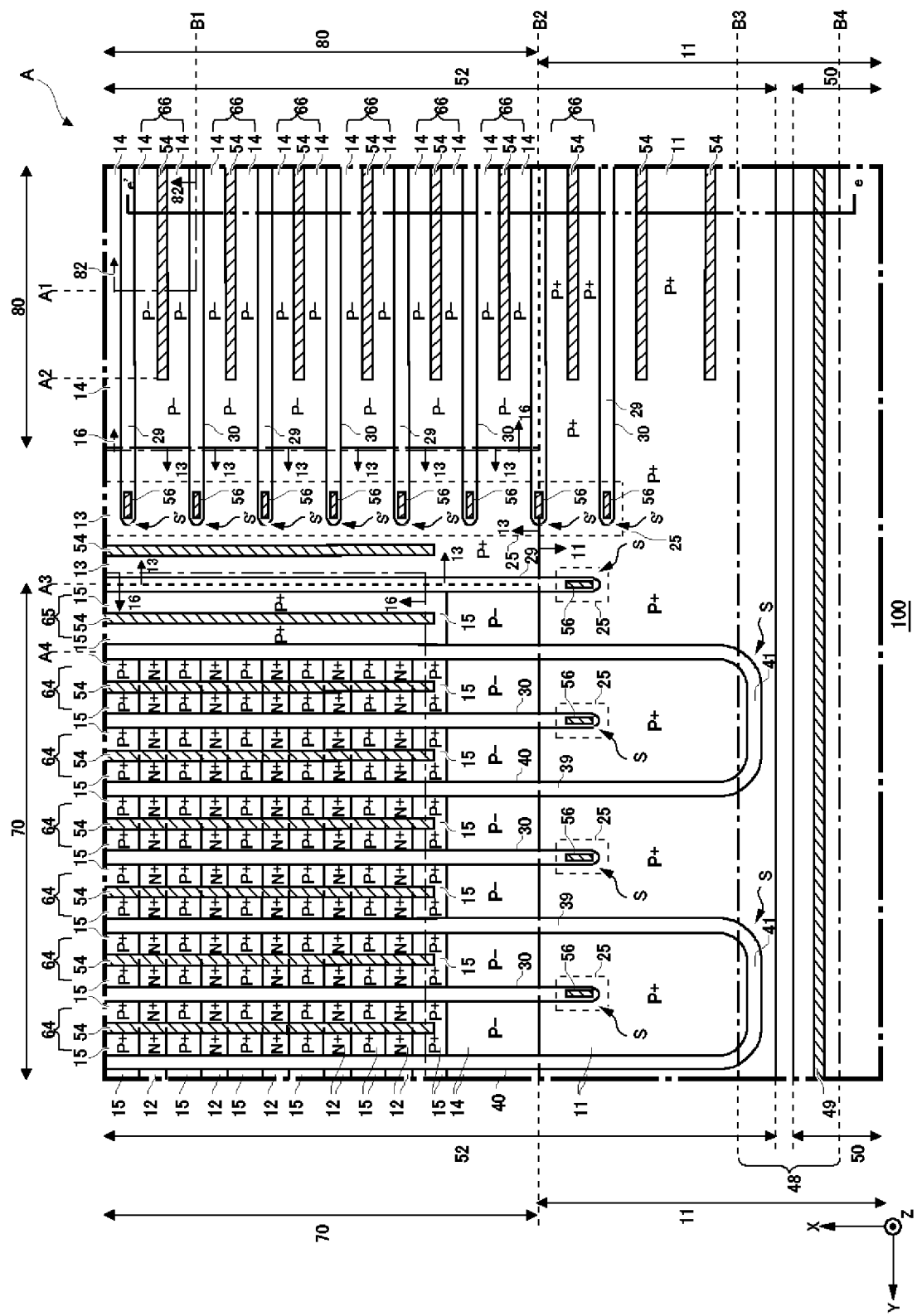
FIG. 8a is another enlarged view of the region A in FIG. 1.

FIG. 8a is another enlarged view of the region A in FIG. 1. The semiconductor device 100 shown in FIG. 8a is different from the semiconductor device 100 shown in FIG. 8a in that dummy trench portions 30 that are provided in the diode portion 80 and the first well region 11 facing the diode portion 80 and have U-shapes extending in the Y-axis direction are provided in straight line shapes, in the configuration of the semiconductor device 100 shown in FIG. 7a.

Dummy trench portions 30 may be or may also not be provided in the first well region 11. FIG. 8a shows one example in which dummy trench portions 30 are provided in the first well region 11.

Contact holes 54 may be or may also not be provided above the first well region 11. FIG. 8a shows one example in which contact holes 54 are provided above the first well region 11.

Figure 8B:
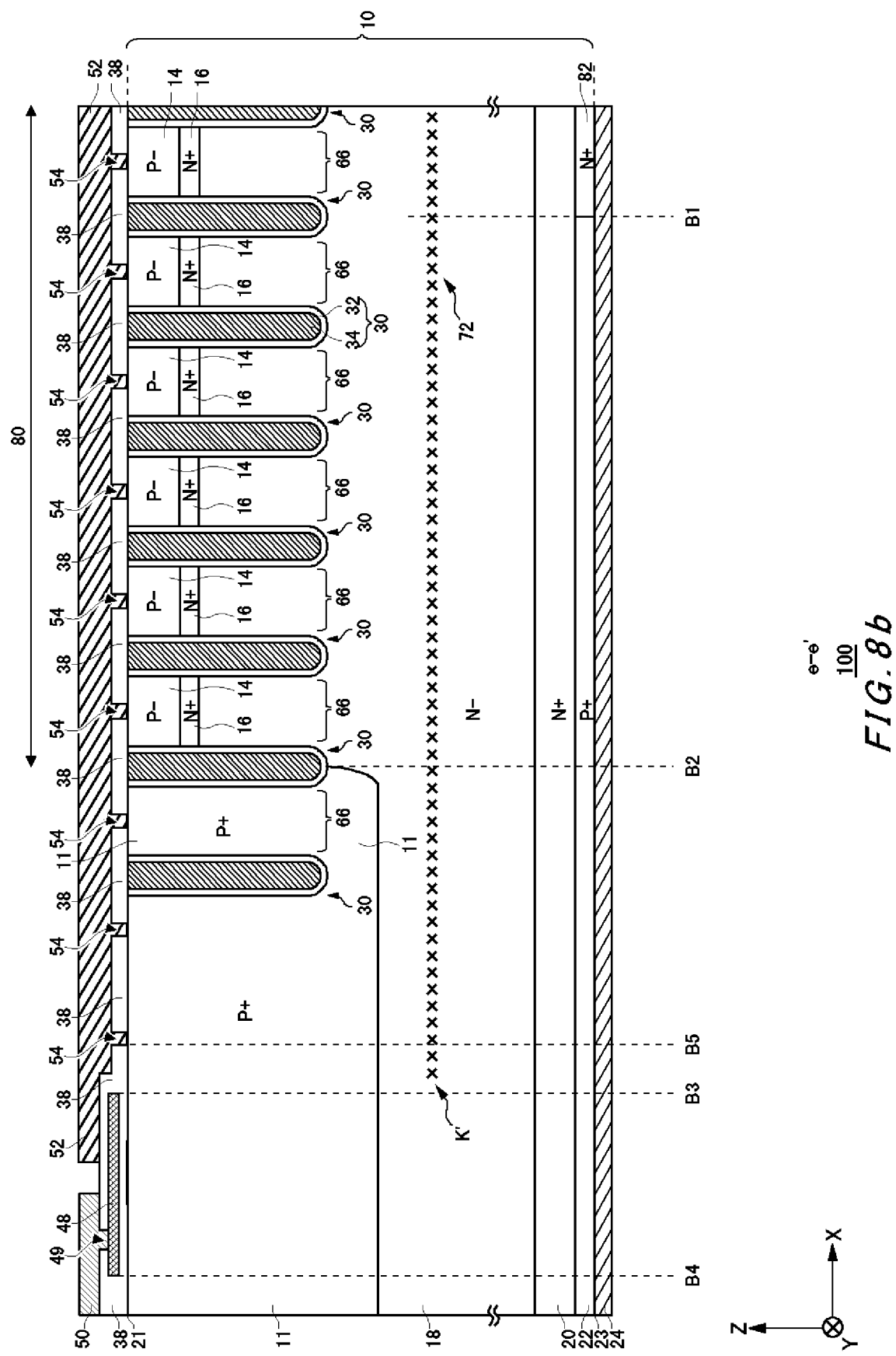

FIG. 8b is a figure showing an exemplary cross-section taken along e-e' in FIG. 8a. The cross-section taken along e-e' of the semiconductor device 100 in the present example is the same as the cross-section taken along d-d' of the semiconductor device 100 shown in FIG. 7b.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 9:
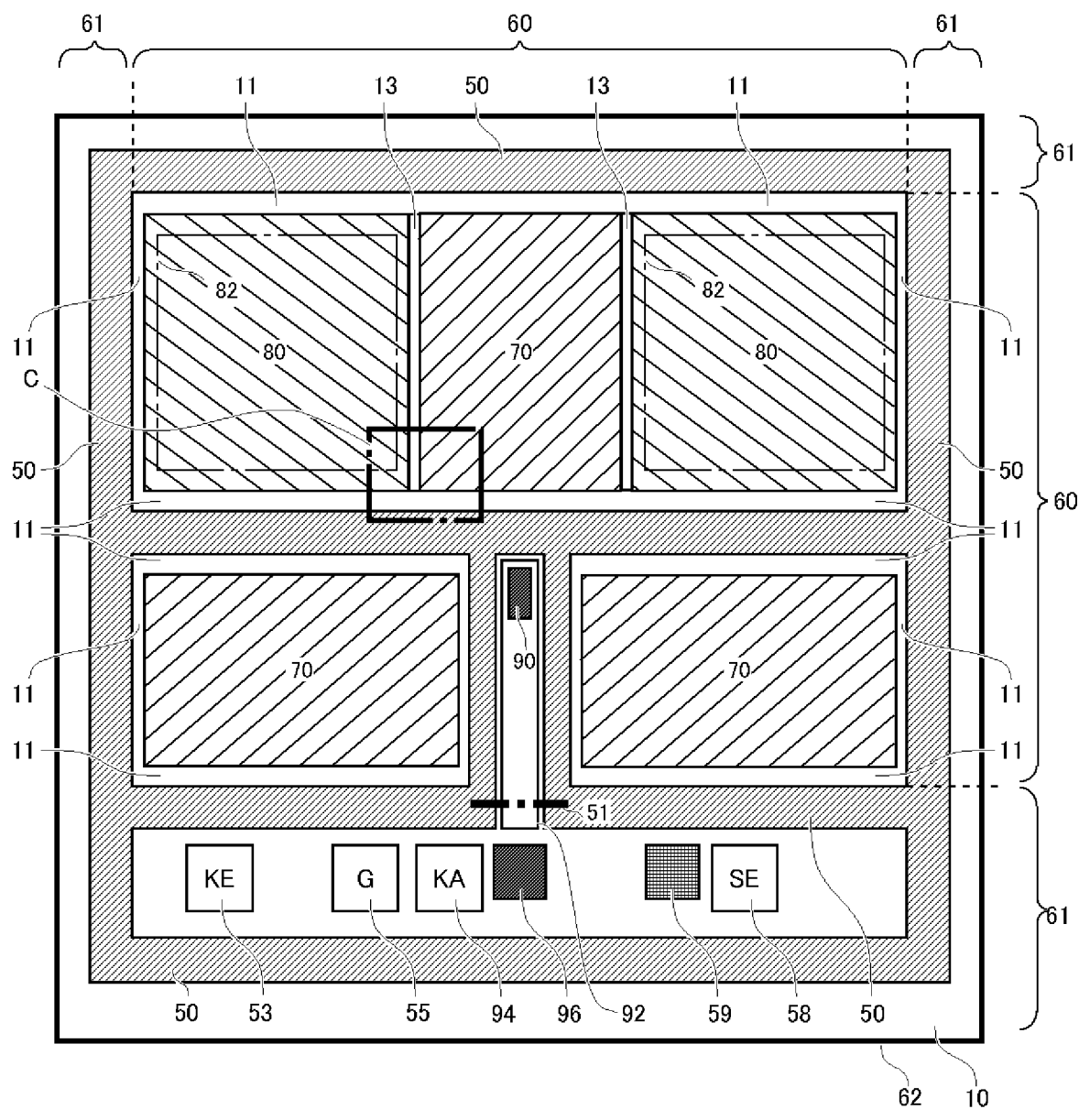
FIG. 9 is a figure showing another exemplary top surface of the semiconductor device 100 according to the present embodiment.

FIG. 9 is a figure showing another exemplary top surface of the semiconductor device 100 according to the present embodiment. The semiconductor device 100 in the present example is different from the semiconductor device 100 shown in FIG. 1 in that one transistor portion 70 and two diode portions 80 are provided on the X-axis direction positive side, and the transistor portion 70 is sandwiched by the diode portions 80 in the Y-axis direction, in the configuration of the semiconductor device 100 shown in FIG. 1. As shown in FIG. 9, in the semiconductor device 100 in the present example, the diode portions 80 may be surrounded by the first well region 11 and second well regions 13 in the top view of the semiconductor substrate 10.

Figure 10A:
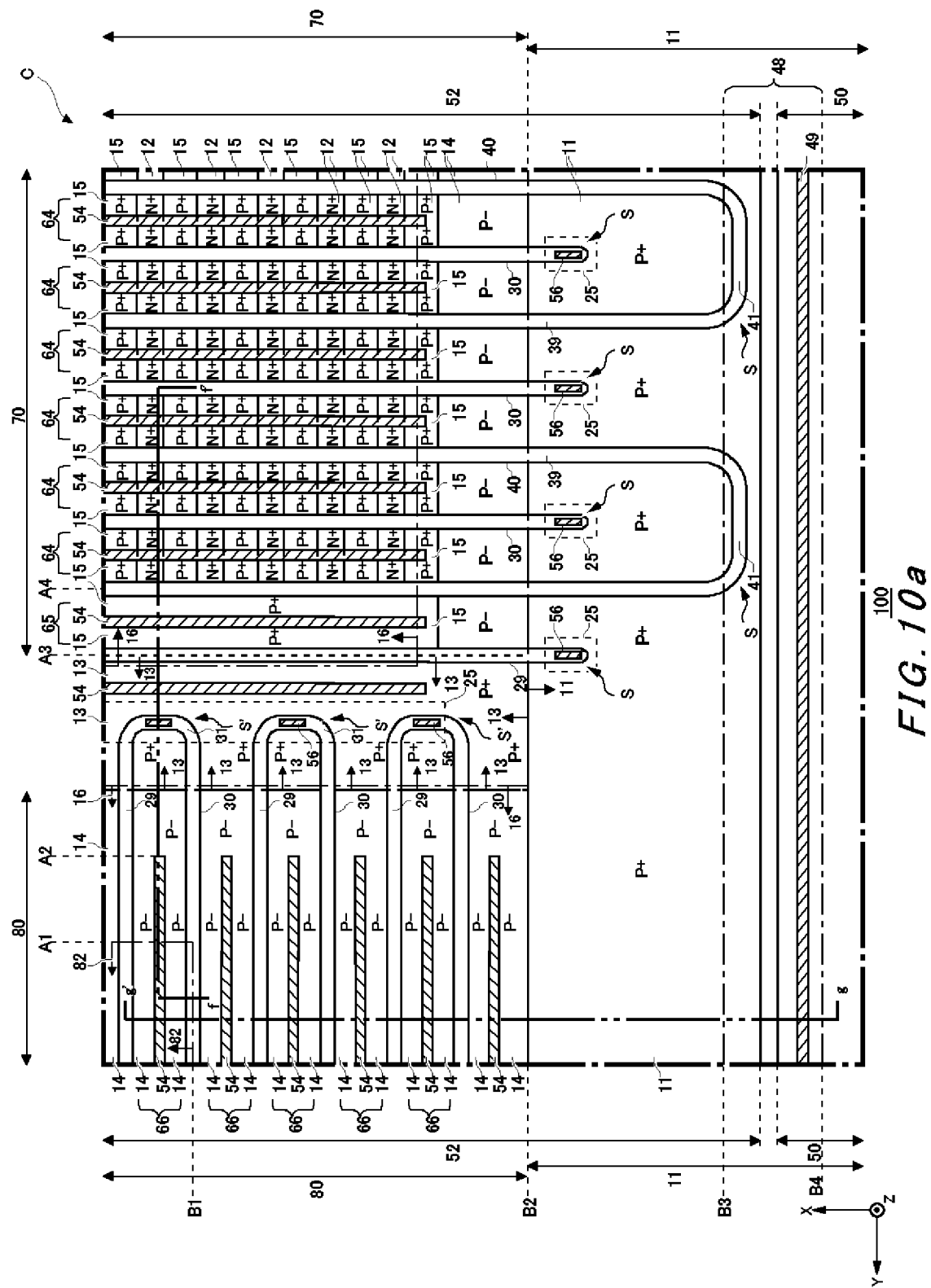
FIG. 10a is an enlarged view of a region C in FIG. 9.

FIG. 10a is an enlarged view of a region C in FIG. 9. FIG. 10a shows an enlarged view of: a region where a transistor portion 70 adjoins a diode portion 80; and a region where the transistor portion 70 adjoins the gate metal layer 50, and a region where the diode portion 80 adjoins the gate metal layer 50. As shown in FIG. 10a, the semiconductor device 100 in the present example is equivalent to the configuration obtained by inverting, in the Y-axis direction, the semiconductor device 100 shown in FIG. 2a.

In the semiconductor device 100 in the present example also, the first well region 11 may be continuous with the second well region 13 in the top view of the semiconductor substrate 10 as shown in FIG. 10a. The first well region 11 and second well region 13 may also be a single well region with a single conductivity-type and uniform doping concentration.

Figure 10B:
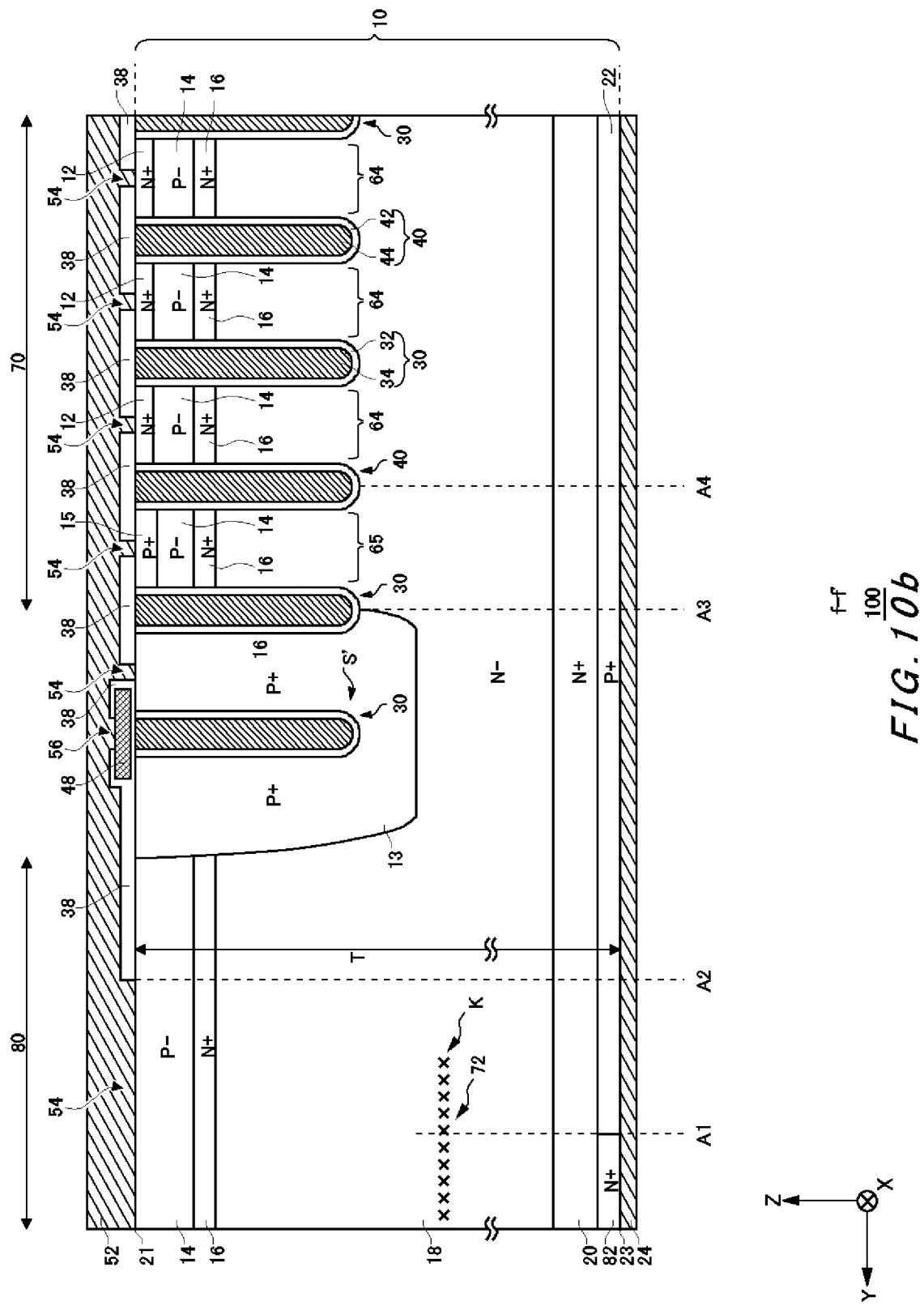
FIG. 10b is a figure showing an exemplary cross-section taken along f-f in FIG. 9.

FIG. 10b is a figure showing an exemplary cross-section taken along f-f in FIG. 10a. The configuration of the cross-section taken along f-f in the semiconductor device 100 in the present example is equivalent to the configuration obtained by inverting, in the Y-axis direction, the configuration of the cross-section taken along a-a' in the semiconductor device 100 shown in FIG. 2b.

In the semiconductor device 100 in the present example, the main direction of trench portions in the transistor portion 70 is orthogonal to the main direction of trench portions in the diode portion 80. Because of this, while the side walls of dummy trench portions 30 in the diode portion 80 lie on Y-Z planes, the side walls of gate trench portions 40 and dummy trench portions 30 in the transistor portion 70 lie on X-Z planes. That is, the dummy trench portions 30 in the diode portion 80 do not have X-Z planes corresponding to the side walls of the gate trench portions 40 and dummy trench portions 30 in the transistor portion 70. Because of this, carriers that are concentrated at lower portions of a dummy trench portion 30 and a gate trench portion 40 which are arranged in a region which is in the transistor portion 70 and adjacent to the diode portion 80 can easily pass through between dummy trench portions 30 in the diode portion 80 in the X-axis direction toward the Y-axis direction negative side. Because of this, electric field concentration in the gate trench portion 40 and dummy trench portion 30 in the transistor portion 70 can be relaxed.

In addition, since in the semiconductor device 100 in the present example, the main direction of trench portions in the transistor portion 70 is orthogonal to the main direction of trench portions in the diode portion 80 in the top view of the semiconductor substrate 10, the trench portions in the transistor portion 70 and the trench portions in the diode portion 80 are not arrayed to be parallel to and adjacent to each other. Furthermore, since a second well region 13 is provided in a region which is in the diode portion 80 and is adjacent to the transistor portion 70, the cathode region 82 can be arranged to be further apart from the transistor portion 70 as compared to the case where trench portions in the transistor portion 70 and trench portions in the diode portion 80 are arrayed to be parallel to and adjacent to each other. Because of this, as compared to the case where trench portions in the transistor portion 70 and trench portions in the diode portion 80 are arrayed to be parallel to and adjacent to each other, injection of holes from emitter regions 12 in the transistor portion 70 into the cathode region 82 in the diode portion 80 can be suppressed. Because of this, reverse recovery characteristics of the diode portion 80 can be improved.

In addition, since in the semiconductor device 100 in the present example, the end portion K of the lifetime control region 72 is provided between the position A1 and the position A2 in the Y-axis direction, the lifetime control region 72 can be arranged to be further apart from the transistor portion 70 as compared to the case where trench portions in the transistor portion 70 and trench portions in the diode portion 80 are arrayed to be parallel to and adjacent to each other. Because of this, leakage current of the transistor portion 70 can be suppressed. In addition, the trade-off between ON voltage and turn-off loss of the transistor portion 70 can be improved.

Figure 10C:
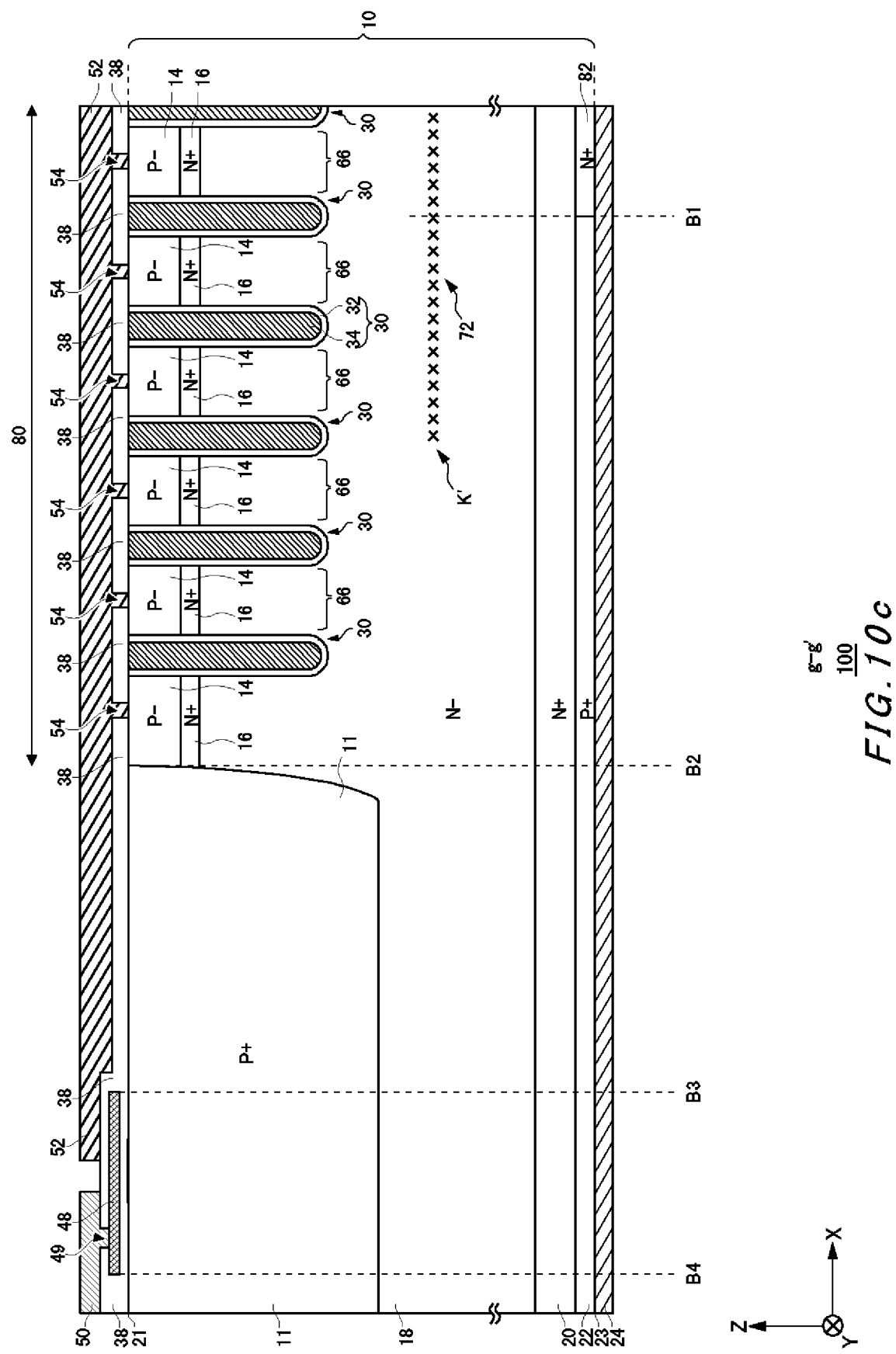

FIG. 10c is a figure showing an exemplary cross-section taken along g-g' in FIG. 10a. The cross-section taken along g-g' is an X-Z plane passing through the first well region 11 and base regions 14 in the diode portion 80. The cross-section taken along g-g' in the semiconductor device 100 in the present example is equivalent to the configuration of the cross-section taken along b-b' in the semiconductor device 100 shown in FIG. 2c.

The semiconductor device 100 in the present example may have the lifetime control region 72 in the cross-section taken along g-g'. The end portion K' of the lifetime control region 72 in the X-axis direction may be arranged between the position B1 and the position B2 in the X-axis direction as shown in FIG. 10c, that is, between the boundary between the cathode region 82 and the collector region 22 and the end of the first well region 11 on the X-axis direction positive side. An end portion of the lifetime control region 72 on the X-axis direction positive side may be provided between the end of the cathode region 82 on the X-axis direction positive side in FIG. 9 and the end, on the X-axis direction negative side, of the first well region 11 provided on the X-axis direction positive side relative to the cathode region 82. That is, the lifetime control region 72 may be provided to include, in the X-axis direction, the cathode region 82 in the top view of the semiconductor substrate 10.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

Figure 11:
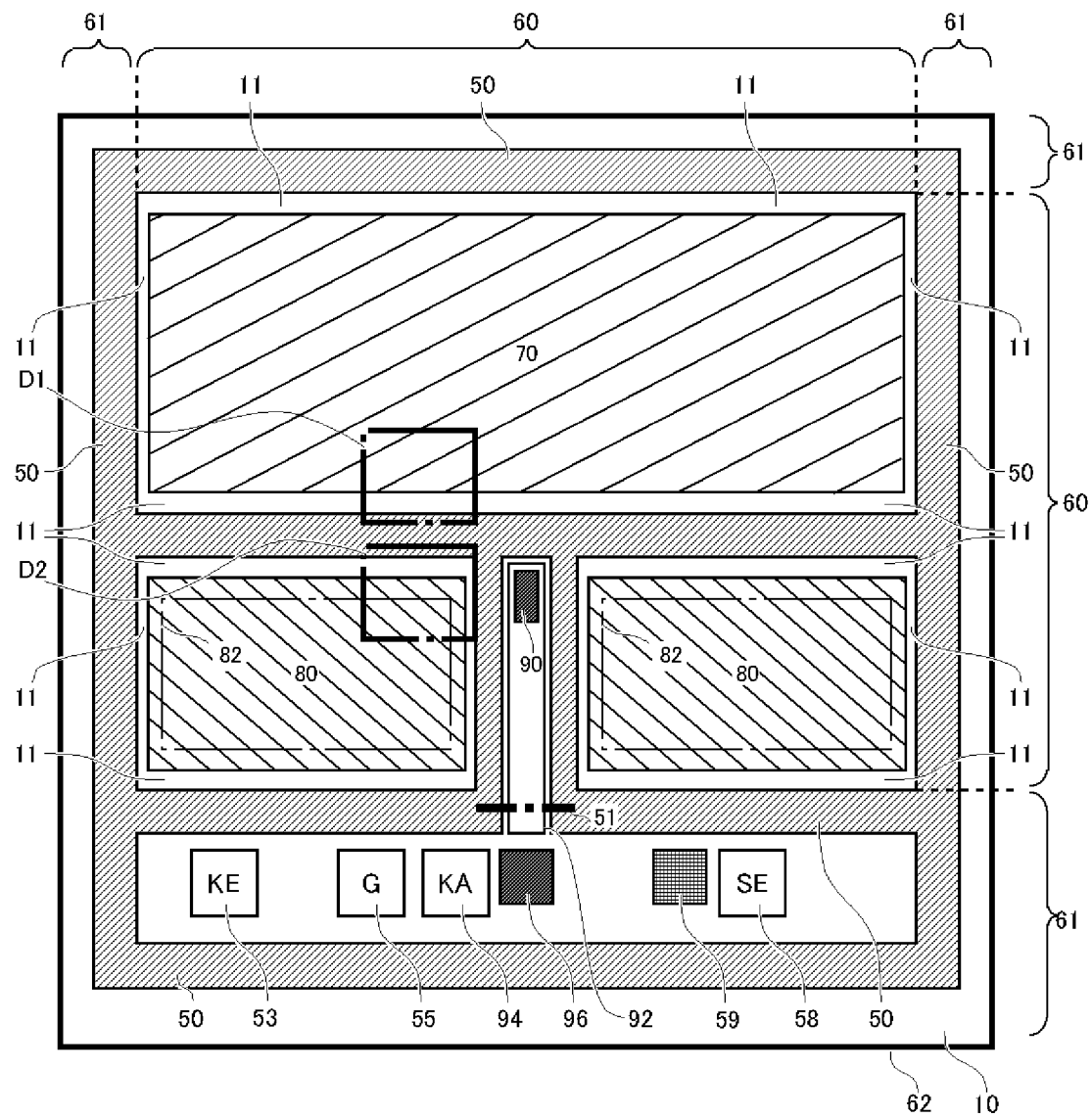
FIG. 11 is a figure showing another exemplary top surface of the semiconductor device 100 according to the present embodiment.

FIG. 11 is a figure showing another exemplary top surface of the semiconductor device 100 according to the present embodiment. The semiconductor device 100 in the present example is different from the semiconductor device 100 shown in FIG. 1 in that only one transistor portion 70 is provided on the X-axis direction positive side, and two diode portions 80 are provided on the X-axis direction negative side sandwiching the temperature sensing wire 92. As shown in FIG. 11, in the semiconductor device 100 in the present example, the diode portions 80 may be surrounded by the first well region 11 in the top view of the semiconductor substrate 10.

Figure 12A:
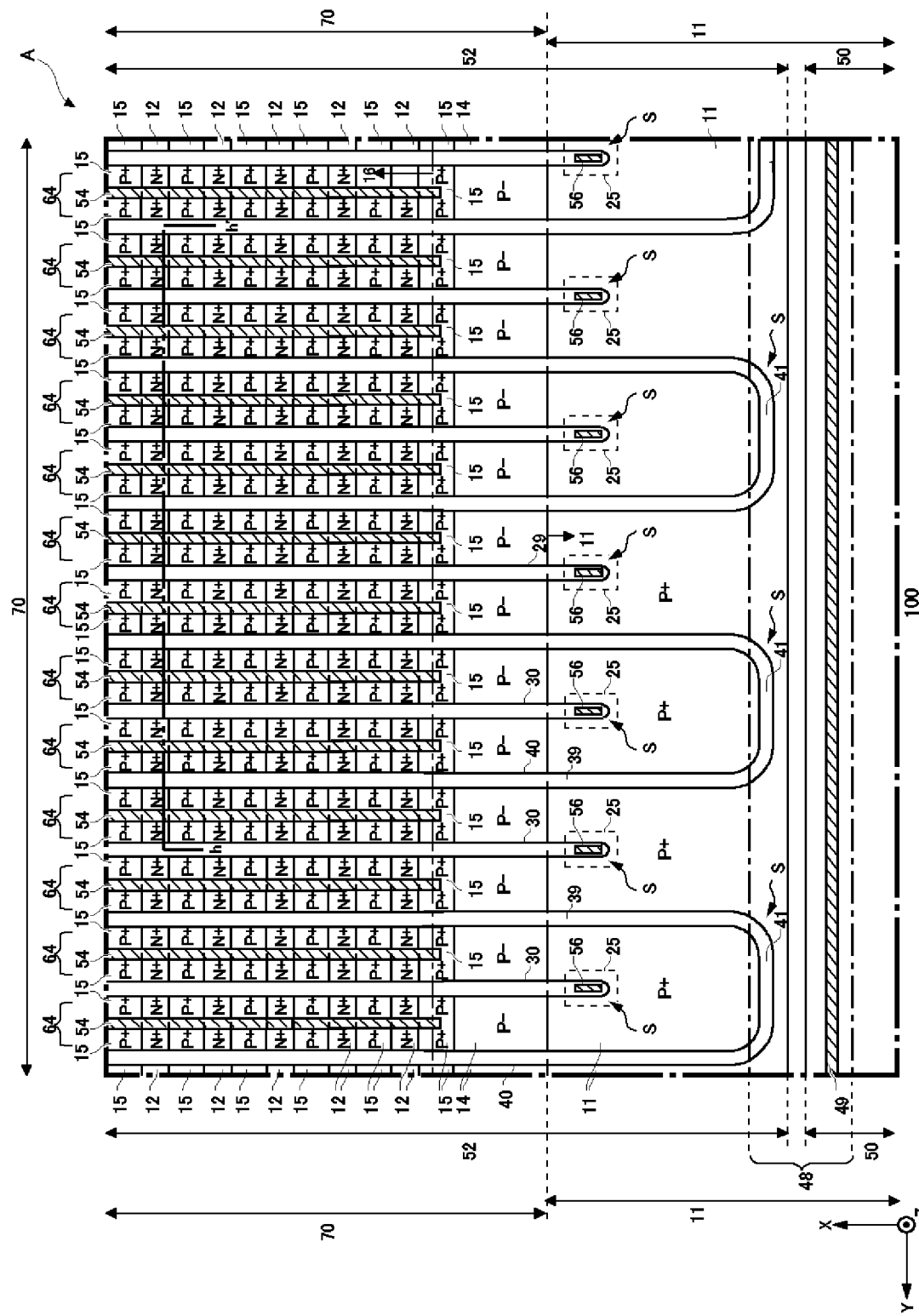
FIG. 12a is an enlarged view of a region D1 in FIG. 11.

FIG. 12a is an enlarged view of a region D1 in FIG. 11. FIG. 12a shows an enlarged view of a region where a transistor portion 70 adjoins the gate metal layer 50. As shown in FIG. 12a, in the semiconductor device 100 in the present example, the transistor portion 70 is provided with one or more gate trench portions 40 and one or more dummy trench portions 30. The gate trench portions 40 extend along the main direction (the X-axis direction in the present example) in the top view of the semiconductor substrate 10. A gate trench portions 40 may have two extending parts 39 extending in the main direction and a connecting part 41 connecting the two extending parts 39. The one or more gate trench portions 40 and the one or more dummy trench portions 30 are arrayed at predetermined intervals along a predetermined array direction (the Y-axis direction in the present example).

In the transistor portion 70, at least one dummy trench portion 30 is provided between individual extending parts 39 of a gate trench portion(s) 40. The dummy trench portions 30 may have straight line shapes extending in the main direction (the X-axis direction in the present example).

In FIG. 12a, the end portion S is the end of a gate trench portion 40 on the X-axis direction negative side in the transistor portion 70. In addition, it is the end of a dummy trench portion 30 on the X-axis direction negative side in the transistor portion 70. Gate trench portions 40 and dummy trench portions 30 in the transistor portion 70 may each have the end portion S also at their ends on the X-axis direction positive side, although such ends are outside the region A.

The semiconductor device 100 in the present example includes, in the transistor portion 70, emitter regions 12, base regions 14, and contact regions 15 exposed to the top surface 21. On the X-axis direction negative side of the transistor portion 70, the first well region 11 exposed to the top surface 21 is provided. The first well region 11 may be provided in the semiconductor substrate 10 to overlap the end portion S in the top view of the semiconductor substrate 10.

Figure 12B:
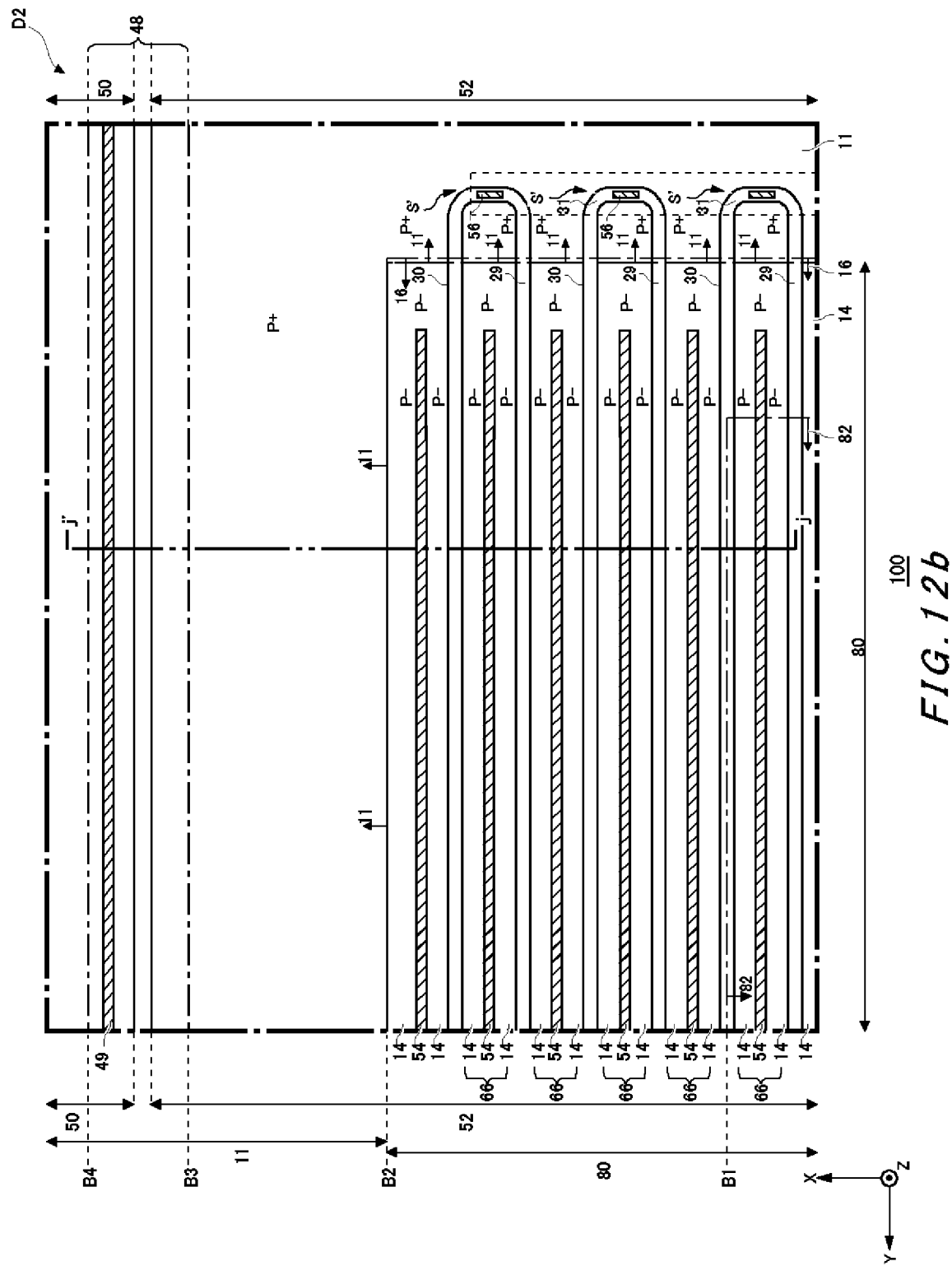
FIG. 12b is an enlarged view of a region D2 in FIG. 11.

FIG. 12b is an enlarged view of a region D2 in FIG. 11. FIG. 12b shows an enlarged view of a region where a diode portion 80 adjoins the gate metal layer 50. As shown in FIG. 12b, in the semiconductor device 100 in the present example, the diode portion 80 is provided with one or more dummy trench portions 30.

The dummy trench portions 30 extend along the main direction (the Y-axis direction in the present example) in the top view of the semiconductor substrate 10. The main direction in which trench portions extend in the diode portion 80 may be different from the main direction in which trench portions extend in the transistor portion 70 shown in FIG. 12a. The extending direction of the trench portions in the diode portion 80 may be orthogonal to the extending direction of the trench portions in the transistor portion 70 in the top view of the semiconductor substrate 10.

A dummy trench portion 30 may have two extending parts 29 extending in the main direction and a connecting part 31 connecting the two extending parts 29. The one or more dummy trench portions 30 are arrayed at predetermined intervals along a predetermined array direction (the X-axis direction in the present example).

In the diode portion 80, the semiconductor device 100 in the present example includes base regions 14 exposed to the top surface 21. On the X-axis direction positive side of the diode portion 80, the first well region 11 exposed to the top surface 21 is provided. In a region adjacent to the diode portion 80 on the Y-axis direction negative side also, the first well region 11 exposed to the top surface 21 is provided. Note that the first well region 11 provided on the X-axis direction positive side of the diode portion 80 may be continuous, in the X-axis direction and inside the semiconductor substrate 10, to the first well region 11 provided on the X-axis direction negative side of the transistor portion 70 shown in FIG. 12a.

Figure 12C:
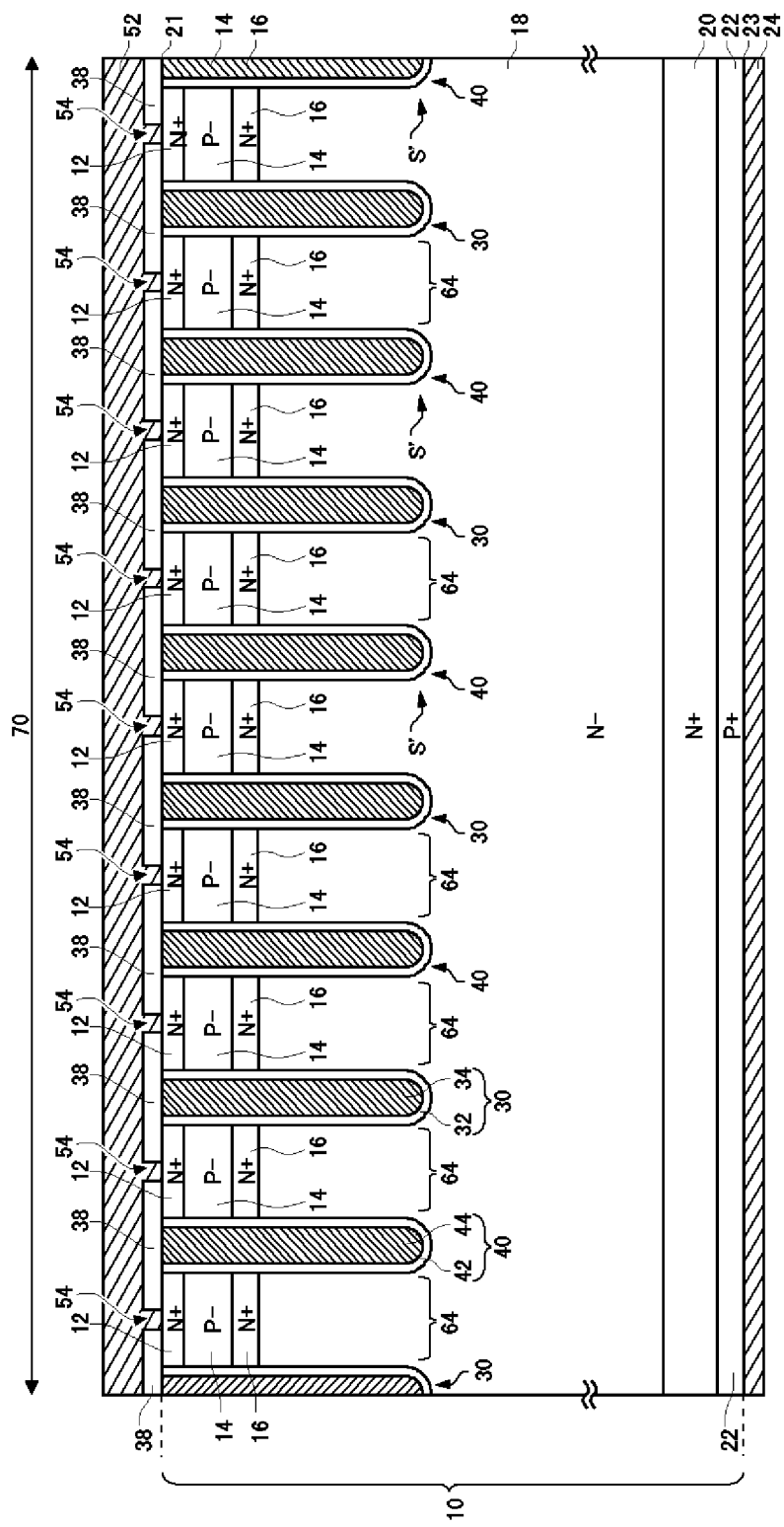

FIG. 12c is a figure showing an exemplary cross-section taken along h-h' in FIG. 12a. The cross-section taken along h-h' is a Y-Z plane passing through emitter region 12 in a transistor portion 70. In the cross-section taken along h-h', the semiconductor device 100 in the present example is provided with emitter regions 12, base regions 14 and accumulation regions 16 in order from the top surface 21 and in contact with gate trench portions 40 and dummy trench portions 30. The drift region 18 is provided below the accumulation regions.

Figure 12D:
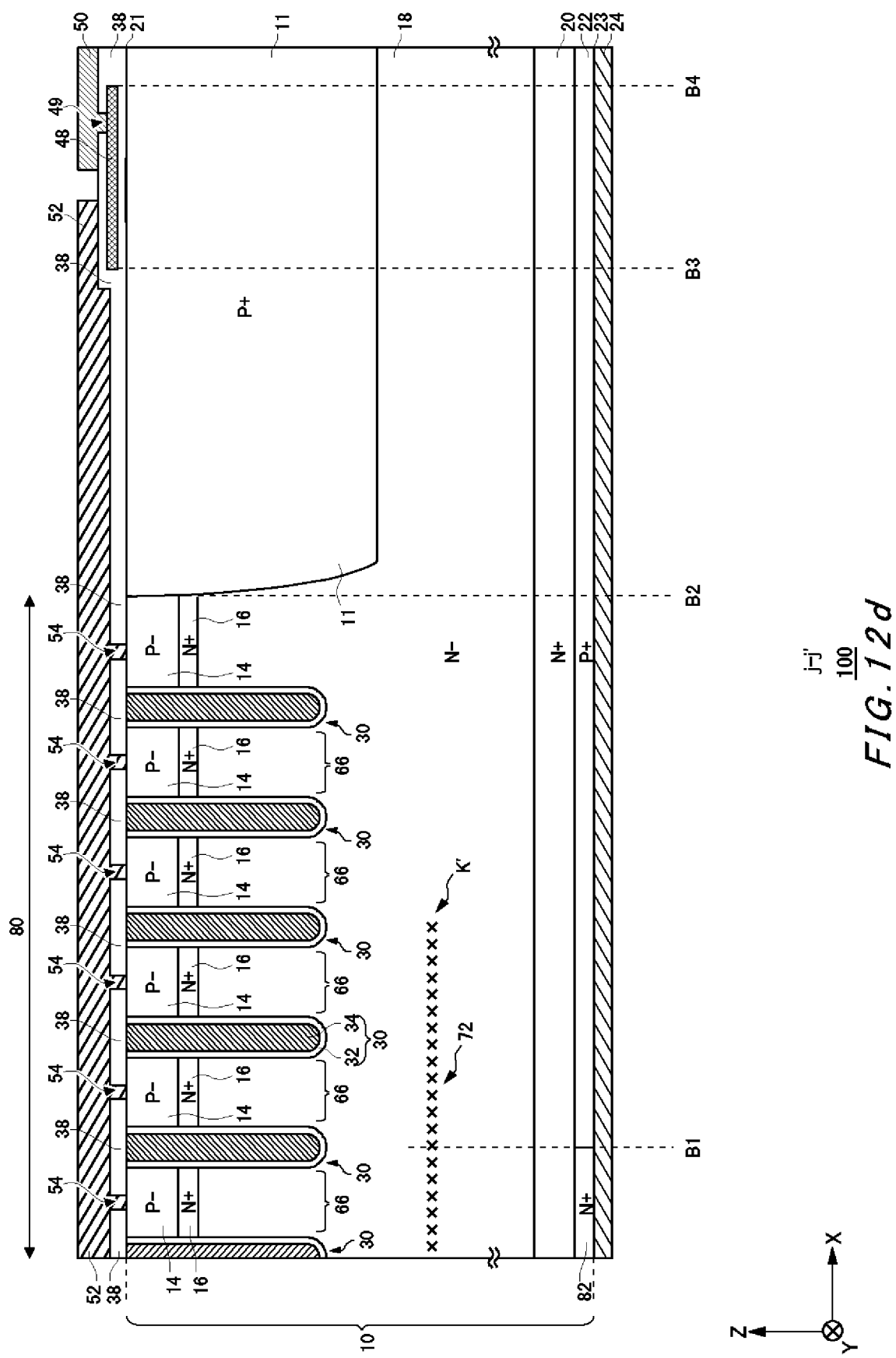
FIG. 12d is a figure showing an exemplary cross-section taken along j-j' in FIG. 12b.

FIG. 12d is a figure showing an exemplary cross-section taken along j-j' in FIG. 12b. The configuration of the cross-section taken along j-j' in the semiconductor device 100 in the present example is equivalent to the configuration obtained by inverting, in the X-axis direction, the configuration of the cross-section taken along b-b' in the semiconductor device 100 shown in FIG. 2c.

Since in the semiconductor device 100 in the present example, the main direction of trench portions in the transistor portion 70 is orthogonal to the main direction of trench portions in the diode portion 80 in the top view of the semiconductor substrate 10, the trench portions in the transistor portion 70 and the trench portions in the diode portion 80 are not arrayed to be parallel to and adjacent to each other. Because of this, as compared to the case where trench portions in the transistor portion 70 and trench portions in the diode portion 80 are arrayed to be parallel to and adjacent to each other, injection of holes from emitter regions 12 in the transistor portion 70 into the cathode region 82 in the diode portion 80 can be suppressed. Because of this, reverse recovery characteristics of the diode portion 80 can be improved.

Figure 13:
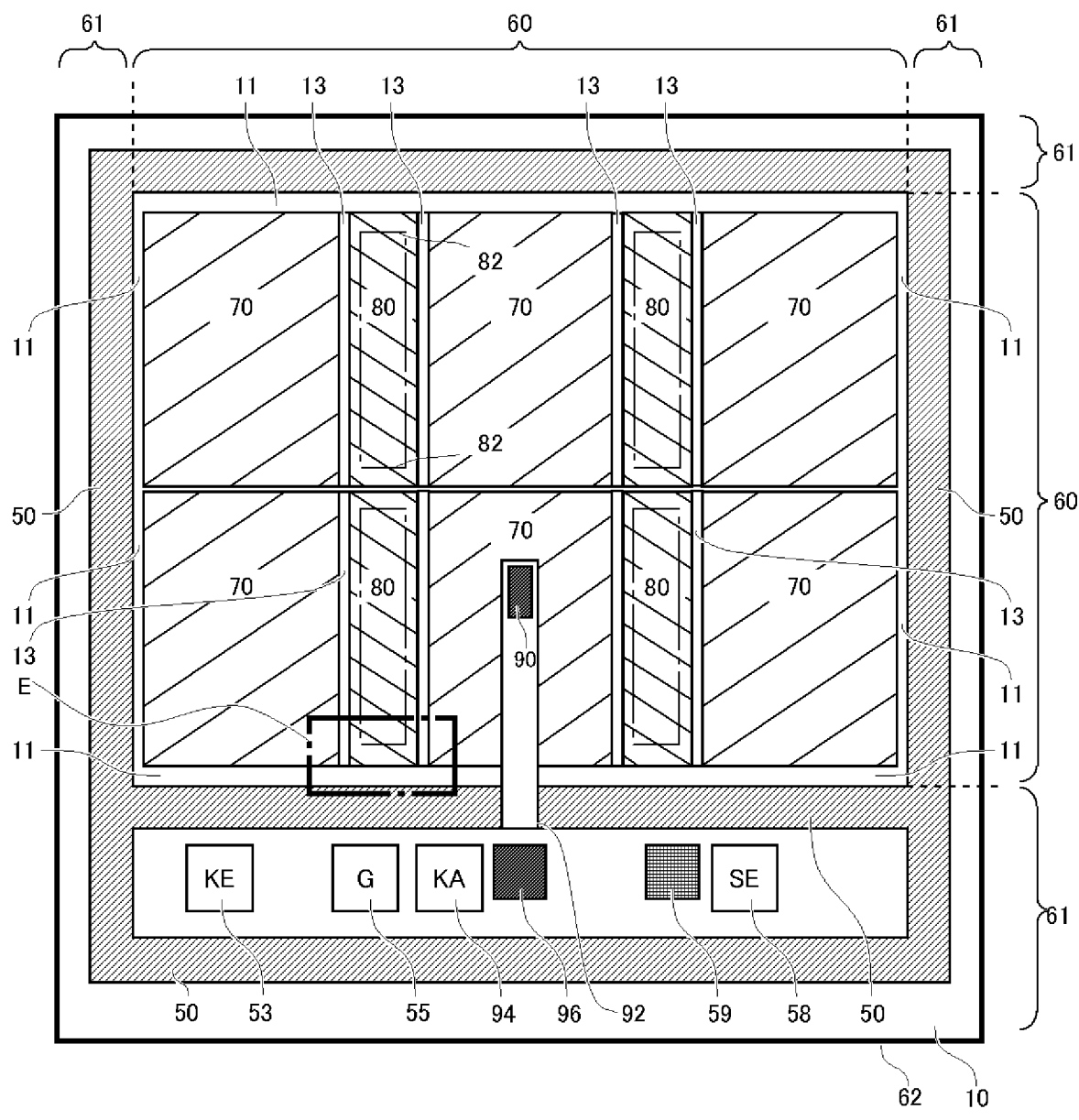
FIG. 13 is a figure showing another exemplary top surface of the semiconductor device 100 according to the present embodiment.

FIG. 13 is a figure showing another exemplary top surface of the semiconductor device 100 according to the present embodiment. The semiconductor device 100 in the present example is different from the semiconductor device 100 shown in FIG. 1 in that two transistor portions 70 and two diode portions 80 are provided in the X-axis direction, and three transistor portions 70 and two diode portions 80 are provided in the Y-axis direction, in the configuration of the semiconductor device 100 shown in FIG. 1. In addition, it is different from the semiconductor device 100 shown in FIG. 1 in that the gate metal layer 50 is not provided between a transistor portion 70 and a diode portion 80 in the X-axis direction.

Figure 14A:
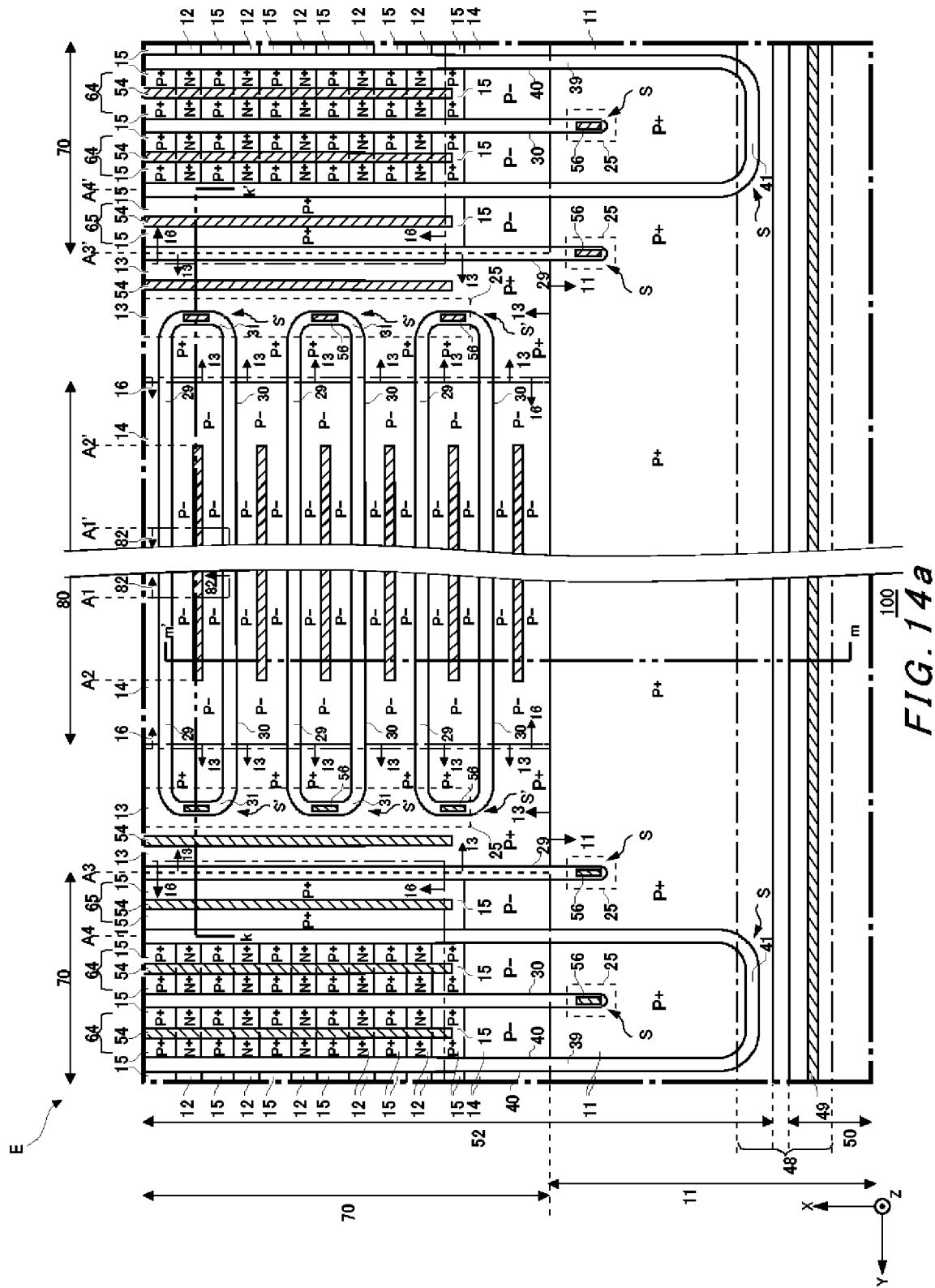
FIG. 14a is an enlarged view of a region E in FIG. 13.

FIG. 14a is an enlarged view of a region E in FIG. 13. FIG. 14a shows an enlarged view of a region where two transistor portions 70 and a diode portion 80 sandwiched by the two transistor portions 70 in the Y-axis direction adjoin the gate metal layer 50. As shown in FIG. 14a, in the semiconductor device 100 in the present example, the transistor portion 70 is provided with one or more gate trench portions 40 and one or more dummy trench portions 30. In addition, the diode portion 80 is provided with one or more dummy trench portions 30.

The gate trench portions 40 extend along the main direction (the X-axis direction in the present example) in the top view of the semiconductor substrate 10. A gate trench portion 40 may have two extending parts 39 extending in the main direction and a connecting part 41 connecting the two extending parts 39. The one or more gate trench portions 40 and the one or more dummy trench portions 30 are arrayed at predetermined intervals along a predetermined array direction (the Y-axis direction in the present example).

In the transistor portion 70, at least one dummy trench portion 30 is provided between individual extending parts 39 of a gate trench portion(s) 40. The dummy trench portions 30 may have straight line shapes extending in the main direction (the X-axis direction in the present example).

In the diode portion 80, the dummy trench portions 30 extend along the main direction (the Y-axis direction in the present example) in the top view of the semiconductor substrate 10. The main direction in which trench portions extend in the diode portion 80 may be different from the main direction in which trench portions extend in the transistor portion 70. The extending direction of the trench portions in the diode portion 80 may be orthogonal to the extending direction of the trench portions in the transistor portion 70 in the top view of the semiconductor substrate 10.

The semiconductor device 100 in the present example includes, in the transistor portion 70, emitter regions 12, base regions 14, and contact regions 15 exposed to the top surface 21. In addition, in the diode portion 80, it includes base regions 14 exposed to the top surface 21.

On the X-axis direction negative side of the transistor portion 70 and diode portion 80, the first well region 11 exposed to the top surface 21 is provided. The first well region 11 may be provided in the semiconductor substrate 10 to overlap the end portion S in the top view of the semiconductor substrate 10. In addition, second well regions 13 are provided between, in the Y-axis direction, the diode portion 80 and the transistor portions 70 that adjoin the diode portion 80 on the Y-axis direction positive side and Y-axis direction negative side, respectively.

Figure 14B:
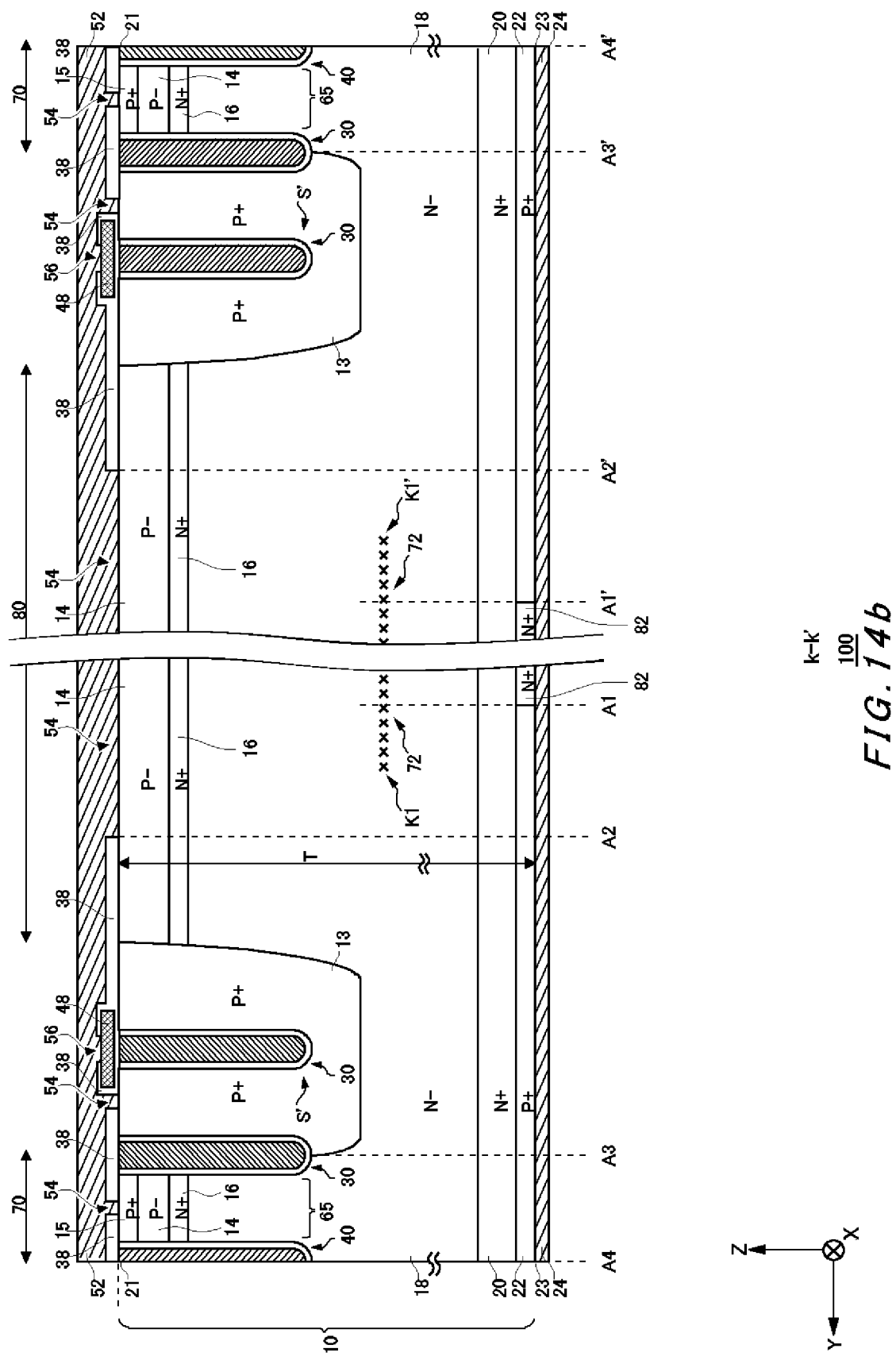

FIG. 14b is a figure showing an exemplary cross-section taken along k-k' in FIG. 14a. The cross-section taken along k-k' is a Y-Z plane passing through a second well region 13, and through contact regions 15 in the transistor portions 70 and base regions 14 in the diode portion 80.

The diode portion 80 is provided with the lifetime control region 72. The position at which the lifetime control region 72 is provided may be higher, in the depth direction of the semiconductor substrate 10, than the middle of the semiconductor substrate 10 having a thickness T. The lifetime control region 72 may be provided at a position deeper than the second well region 13.

The lifetime control region 72 may be provided in the diode portion 80. The end portion K1 of the lifetime control region 72 on the Y-axis direction positive side may be arranged between the position A1 and the position A2 in the Y-axis direction, as shown in FIG. 14b. The end portion K1 of the lifetime control region 72 on the Y-axis direction negative side may be arranged between the position A1' and the position A2' in the Y-axis direction. That is, the lifetime control region 72 may be provided to cover, in the Y-axis direction, the cathode region 82 in the top view of the semiconductor substrate 10.

The lifetime killer may be distributed with its peak concentration at the position of the lifetime control region 72 in the Z-axis direction shown in FIG. 14b and lower concentrations than the peak concentration on the top surface 21 side relative to the peak position. Note that the lifetime control region 72 may not be provided below gate trench portions 40 in the transistor portion 70.

In the semiconductor device 100 in the present example, with the lifetime killer being distributed on the top surface 21 side at lower concentrations than the peak concentration, accumulated carriers on the top surface 21 side of the diode portion 80 can be effectively reduced. Because of this, soft recovery of the diode portion 80 can be achieved.

In the semiconductor device 100 in the present example, the main direction of trench portions in the transistor portion 70 is different from the main direction of trench portions in the diode portion 80 in the top view of the semiconductor substrate 10. As shown in FIG. 14a and FIG. 14b, if the main direction of the trench portions in the transistor portion 70 is orthogonal to the main direction of the trench portions in the diode portion 80, while the side walls of dummy trench portions 30 in the diode portion 80 lie on Y-Z planes, the side walls of gate trench portions 40 and dummy trench portions 30 in the transistor portion 70 lie on X-Z planes. That is, the dummy trench portions 30 in the diode portion 80 do not have X-Z planes corresponding to the side walls of the gate trench portions 40 and dummy trench portions 30 in the transistor portion 70. Because of this, carriers that are concentrated at lower portions of a dummy trench portion 30 and a gate trench portion 40 which are arranged in a region which is in the transistor portion 70 and adjacent to the diode portion 80 can easily pass through between dummy trench portions 30 in the diode portion 80 in the X-axis direction toward the Y-axis direction negative side. Because of this, electric field concentration in the gate trench portion 40 and dummy trench portion 30 in the transistor portion 70 can be relaxed.

In addition, since in the semiconductor device 100 in the present example, the main direction of trench portions in the transistor portion 70 is different from the main direction of trench portions in the diode portion 80 in the top view of the semiconductor substrate 10, the trench portions in the transistor portion 70 and the trench portions in the diode portion 80 are not arrayed to be parallel to and adjacent to each other. Furthermore, since a second well region 13 is provided in a region which is in the diode portion 80 and is adjacent to the transistor portion 70, the cathode region 82 can be arranged to be further apart from the transistor portion 70 as compared to the case where trench portions in the transistor portion 70 and trench portions in the diode portion 80 are arrayed to be parallel to and adjacent to each other. Because of this, as compared to the case where trench portions in the transistor portion 70 and trench portions in the diode portion 80 are arrayed to be parallel to and adjacent to each other, injection of holes from emitter regions 12 in the transistor portion 70 into the cathode region 82 in the diode portion 80 can be suppressed. Because of this, reverse recovery characteristics of the diode portion 80 can be improved.

In addition, since in the semiconductor device 100 in the present example, the end portion K of the lifetime control region 72 is provided between the position A1 and the position A2 in the Y-axis direction, the lifetime control region 72 can be arranged to be further apart from the transistor portion 70 as compared to the case where trench portions in the transistor portion 70 and trench portions in the diode portion 80 are arrayed to be parallel to and adjacent to each other. Because of this, leakage current of the transistor portion 70 can be suppressed. In addition, the trade-off between ON voltage and turn-off loss of the transistor portion 70 can be improved.

Figure 14C:
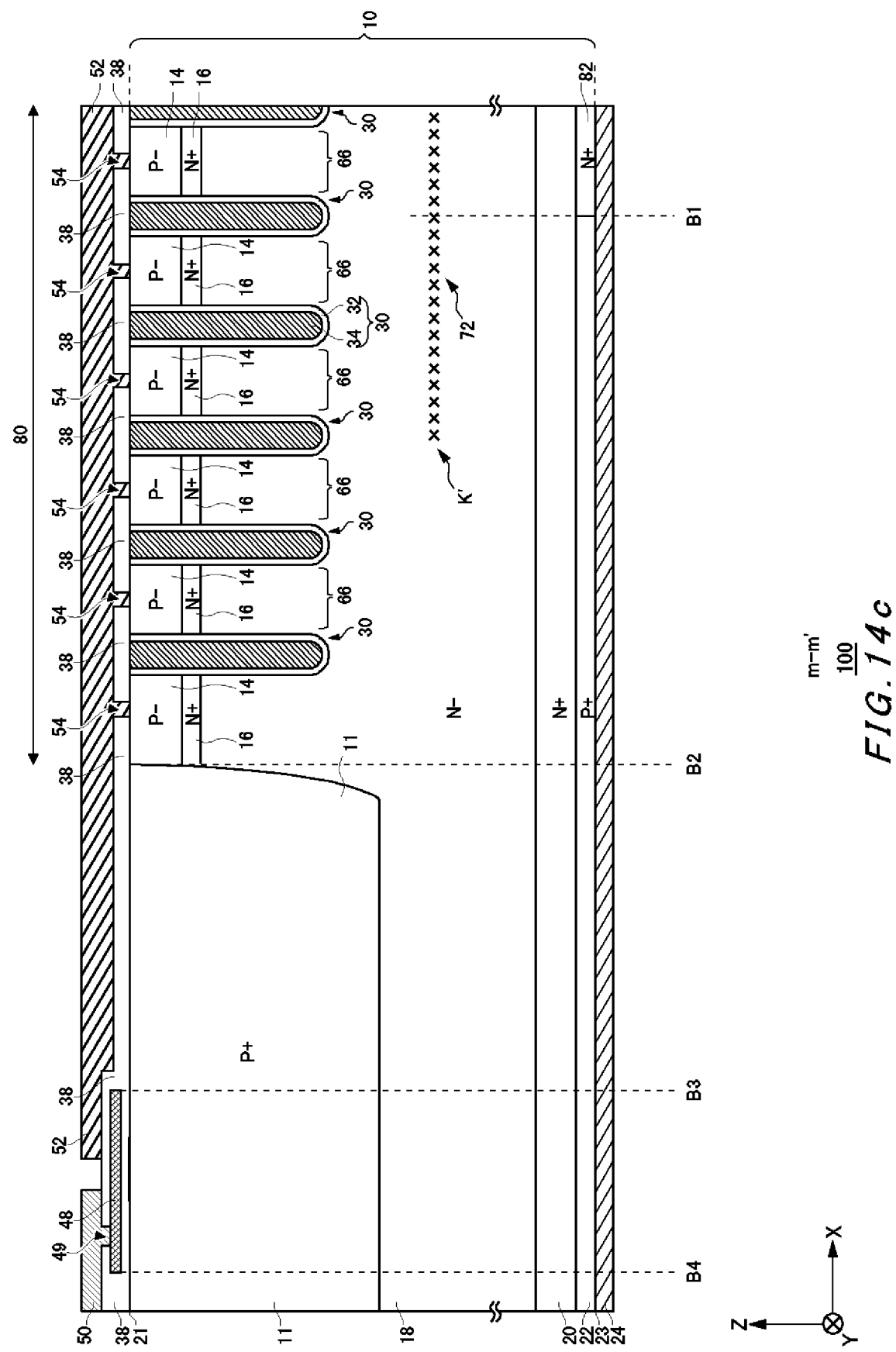

FIG. 14c is a figure showing an exemplary cross-section taken along m-m' in FIG. 14a. The cross-section taken along m-m' is an X-Z plane passing through base regions 14 and first well region 11 in the diode portion 80. The configuration of the cross-section taken along m-m' in the semiconductor device 100 in the present example is equivalent to the configuration of the cross-section taken along b-b' in the semiconductor device 100 shown in FIG. 2c.

Figure 15:
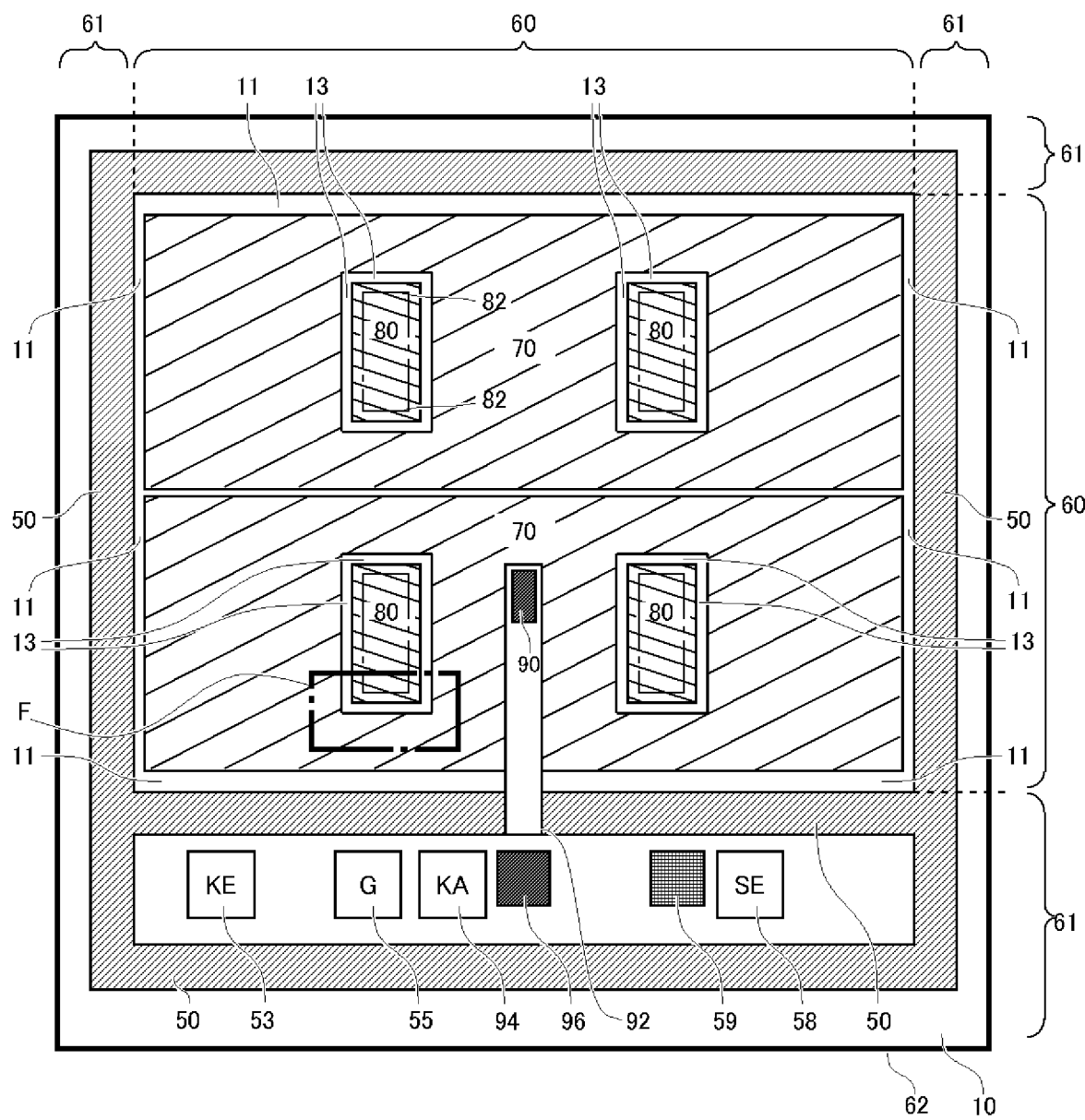
FIG. 15 is a figure showing another exemplary top surface of the semiconductor device 100 according to the present embodiment.

FIG. 15 is a figure showing another exemplary top surface of the semiconductor device 100 according to the present embodiment. The semiconductor device 100 in the present example is different from the semiconductor device 100 shown in FIG. 13 in that two transistor portions 70 are provided in the X-axis direction and one transistor portion is provided in the Y-axis direction, and two diode portions 80 are provided to be included in each transistor portion 70, in the configuration of the semiconductor device 100 shown in FIG. 13.

A second well region 13 is provided at the boundary between a diode portion 80 and a transistor portion 70. The diode portion 80 may be provided to be surrounded by a second well region 13.

Figure 16A:
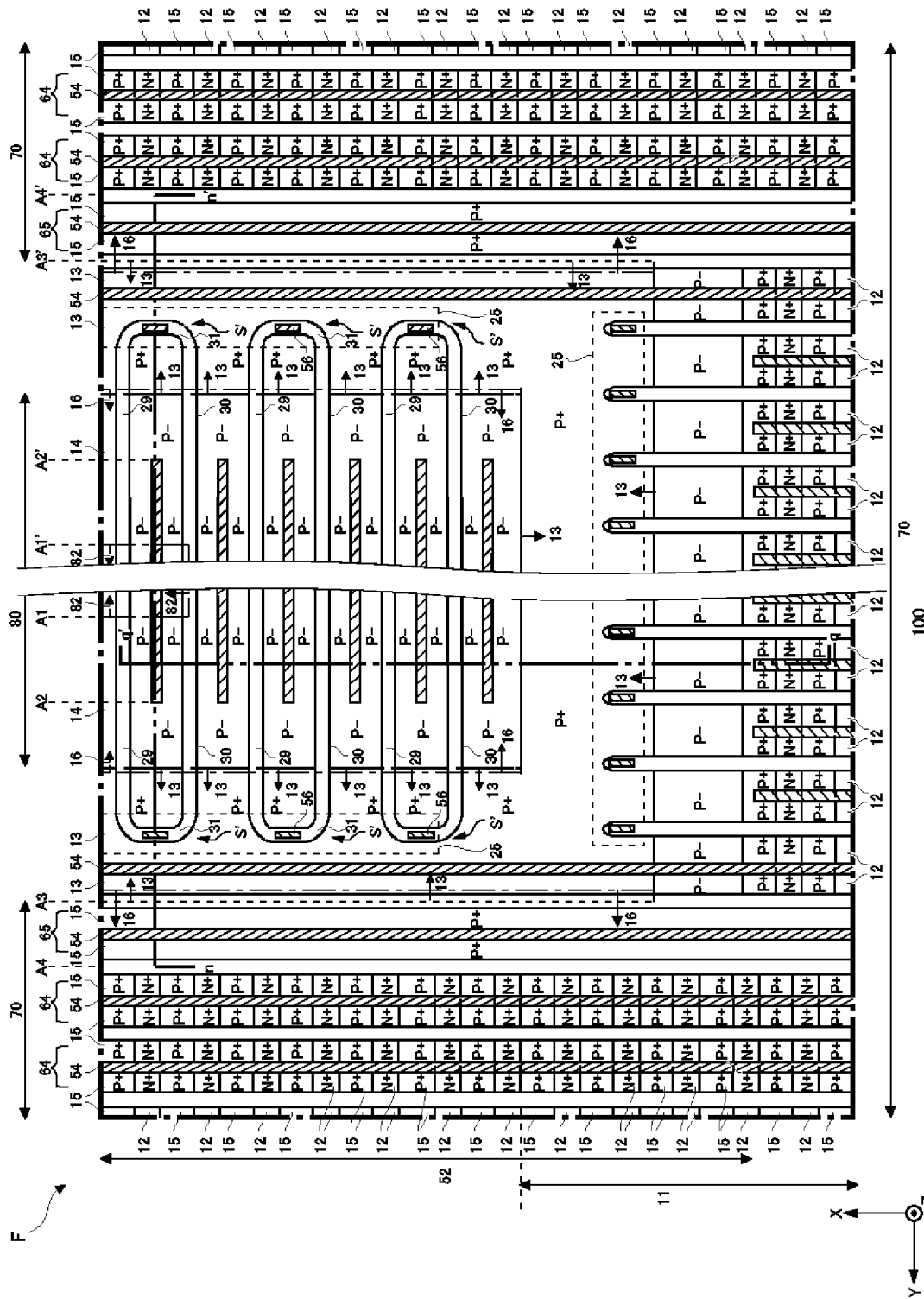
FIG. 16a is an enlarged view of a region F in FIG. 15.

FIG. 16a is an enlarged view of a region F in FIG. 15. FIG. 16a shows an enlarged view of the end of a diode portion 80 on the X-axis direction negative side and a transistor portion 70 provided around the diode portion 80. In the present example, the transistor portion 70 is provided in a region that adjoins the diode portion 80 in the X-axis direction.

As shown in FIG. 16a, in the semiconductor device 100 in the present example, the transistor portion 70 is provided with one or more gate trench portions 40 and one or more dummy trench portions 30. In addition, the diode portion 80 is provided with one or more dummy trench portions 30.

A second well region 13 is provided at the boundary between a diode portion 80 and a transistor portion 70. The second well region 13 is provided to surround the diode portion 80 in the top view of the semiconductor substrate 10.

Figure 16B:
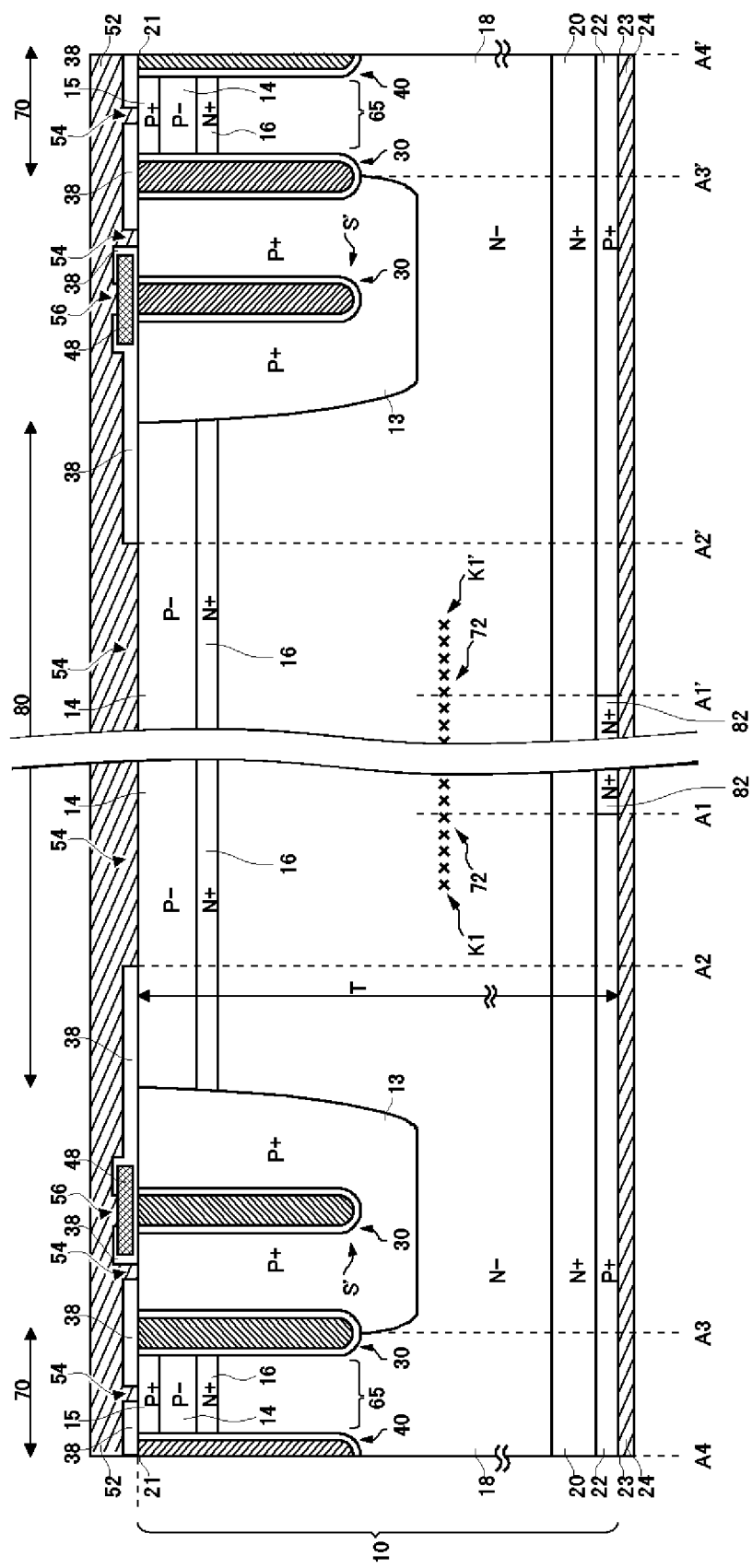

FIG. 16b is a figure showing an exemplary cross-section taken along n-n' in FIG. 16a. The cross-section taken along n-n' is a Y-Z plane passing through a second well region 13, and through contact regions 15 in the transistor portion 70 and base regions 14 in the diode portion 80. The configuration of the cross-section taken along n-n' in the semiconductor device 100 in the present example is equivalent to the configuration of the cross-section taken along k-k' in the semiconductor device 100 shown in FIG. 14b.

Figure 16C:
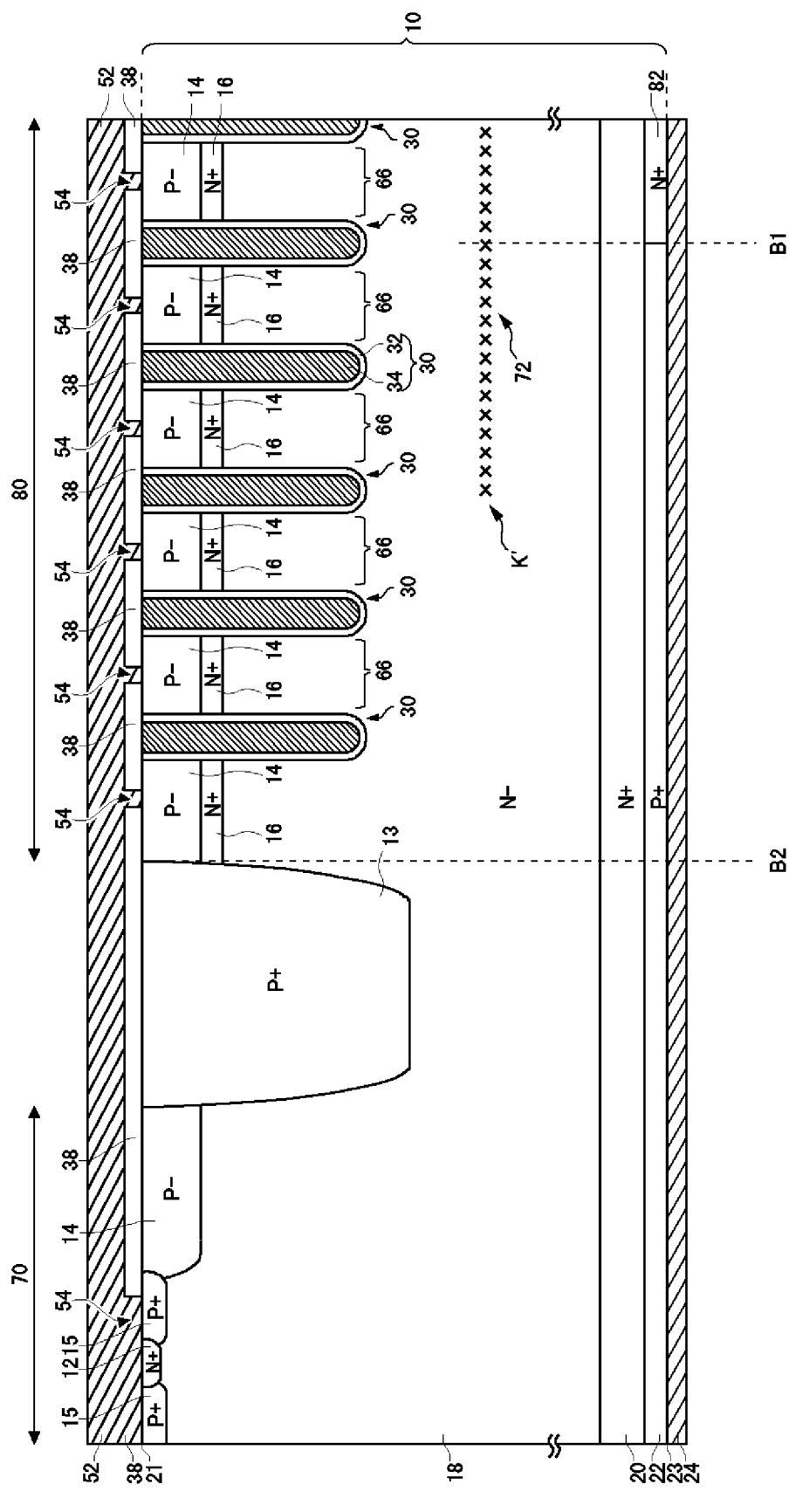

FIG. 16c is a figure showing an exemplary cross-section taken along q-q' in FIG. 16a. The cross-section taken along q-q' is an X-Z plane passing through emitter regions 12, contact regions 15 and base regions 14 in the transistor portion 70 and the diode portion 80.

The semiconductor device 100 in the present example may have the lifetime control region 72 in the cross-section taken along q-q'. The end portion K' of the lifetime control region 72 in the X-axis direction may be arranged between the position B1 and the position B2 in the X-axis direction as shown in FIG. 16c, that is, between the boundary between the cathode region 82 and the collector region 22 and the end of the second well region 13 on the X-axis direction positive side. An end portion of the lifetime control region 72 on the X-axis direction positive side may be provided between the end of the cathode region 82 on the X-axis direction positive side in FIG. 1 and the end, on the X-axis direction negative side, of the second well region 13 provided on the X-axis direction positive side relative to the cathode region 82. That is, the lifetime control region 72 may be provided to include, in the X-axis direction, the cathode region 82 in the top view of the semiconductor substrate 10.

Since in the semiconductor device 100 in the present example, the lifetime control region 72 is provided to include the cathode region 82 in the diode portion 80 in the top view of the semiconductor substrate 10, accumulated carriers on the top surface 21 side of the diode portion 80 can be effectively reduced. Because of this, soft recovery of the diode portion 80 can be achieved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a semiconductor substrate having a first-conductivity-type drift region;
    one or more transistor portions provided in the semiconductor substrate; and
    one or more diode portions provided in the semiconductor substrate, wherein
    both the transistor portions and the diode portions have trench portions that lie from a top surface of the semiconductor substrate to the drift region and include conductive portions, and
    in a top view of the semiconductor substrate, a main direction of the trench portions in the transistor portions is different from a main direction of the trench portions in the diode portions.

2. The semiconductor device according to claim 1, wherein in the top view of the semiconductor substrate, the main direction of the trench portions in the transistor portions is orthogonal to the main direction of the trench portion in the diode portions.

3. The semiconductor device according to claim 1, further comprising:
    a second-conductivity-type first well region that: is provided in the semiconductor substrate to overlap, in the top view of the semiconductor substrate, end portions of a plurality of the trench portions in the transistor portions; and has a longitudinal direction in a first direction which is different from the main direction of the trench portions in the transistor portions; and
    a second-conductivity-type second well region that: is provided in the semiconductor substrate to overlap, in the top view of the semiconductor substrate, end portions of a plurality of the trench portions in the diode portions; and has a longitudinal direction in a second direction different from the main direction of the trench portions in the diode portions.

4. The semiconductor device according to claim 3, wherein the first well region is continuous with the second well region.

5. The semiconductor device according to claim 4, wherein in the top view of the semiconductor substrate:
    the first well region extends to a position at which the first well region faces the diode portions; and
    the diode portions are surrounded by the first well region and the second well region.

6. The semiconductor device according to claim 3, further comprising a lifetime control region that is provided on a top surface side of the semiconductor substrate and contains a lifetime killer, wherein
    the transistor portions have gate trench portions that lie from the top surface of the semiconductor substrate to the drift region, and include conductive portions, and
    the lifetime control region is provided in the diode portions, and is not provided below the gate trench portions in the transistor portions.

7. The semiconductor device according to claim 6, further comprising:
    a contact hole that is provided: above the semiconductor substrate; and to overlap the transistor portions; and
    a contact hole that is provided: above the semiconductor substrate; and to overlap the diode portions, wherein
    in the top view of the semiconductor substrate, a main direction of the contact hole provided to overlap the transistor portions is orthogonal to a main direction of the contact hole provided to overlap the diode portions.

8. The semiconductor device according to claim 6, further comprising a contact hole provided above the first well region extending, in the top view of the semiconductor substrate, to a position at which the first well region faces the diode portions.

9. The semiconductor device according to claim 8, wherein in the top view of the semiconductor substrate, the lifetime control region overlaps the contact hole provided above the first well region.

* * * * *